(12) United States Patent
Saunders et al.

(10) Patent No.: US 7,944,028 B2
(45) Date of Patent: May 17, 2011

(54) TFCC (TM) AND SWCC (TM) THERMAL FLEX CONTACT CARRIERS

(76) Inventors: Don Saunders, Boise, ID (US); Gabe Cherian, Sun Valley, ID (US)

( * ) Notice: Subject to any disclaimer, the term of this patent is extended or adjusted under 35 U.S.C. 154(b) by 31 days.

(21) Appl. No.: 12/154,753

(22) Filed: May 27, 2008

(65) Prior Publication Data

US 2009/0032915 A1    Feb. 5, 2009

Related U.S. Application Data

(60) Continuation of application No. 11/689,558, filed on Mar. 22, 2007, which is a division of application No. 10/937,647, filed on Sep. 8, 2004, now Pat. No. 7,196,402, which is a division of application No. 10/075,060, filed on Feb. 11, 2002, now Pat. No. 6,884,707.

(51) Int. Cl.
*H01L 21/60* (2006.01)

(52) U.S. Cl. .. 257/666; 257/692; 257/696; 257/E21.507

(58) Field of Classification Search .................. 257/666, 257/692, 696, E23.031, E21.507; 438/123
See application file for complete search history.

(56) References Cited

U.S. PATENT DOCUMENTS

| | | | | |
|---|---|---|---|---|
| 3,930,115 A | * | 12/1975 | Uden et al. | 174/559 |
| 4,647,126 A | * | 3/1987 | Sobota, Jr. | 439/74 |
| 4,736,520 A | * | 4/1988 | Morris | 29/827 |
| 4,827,611 A | * | 5/1989 | Pai et al. | 29/843 |
| 5,367,124 A | * | 11/1994 | Hoffman et al. | 174/552 |

* cited by examiner

Primary Examiner — Roy K Potter

(57) ABSTRACT

Two groups of interconnection devices and methods are described. Both provide columns between electronic packages and boards or between chips and substrates or the like. In the first group, called Thermal Flex Contact Carrier (TFCC), the column elements are carved out of a flat laminated structure and then formed to suit. In the second group, the carrier, which carries the connecting elements, is made out of a soluble or removable material, which acts at the same time, as a solder mask, to prevent the solder from wicking along the stem of the elements.

35 Claims, 64 Drawing Sheets

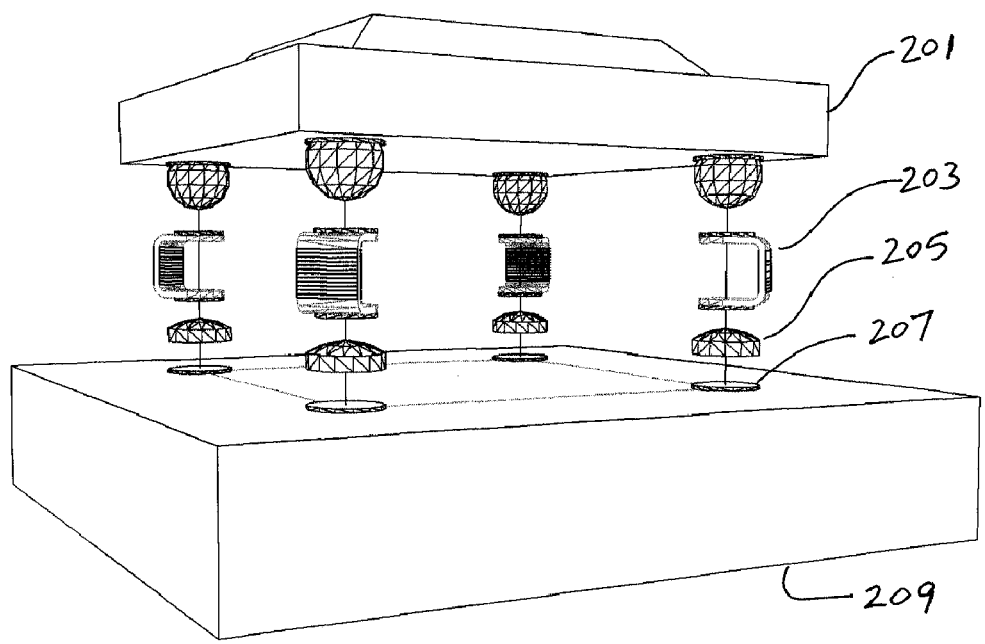
FIG. 2-A

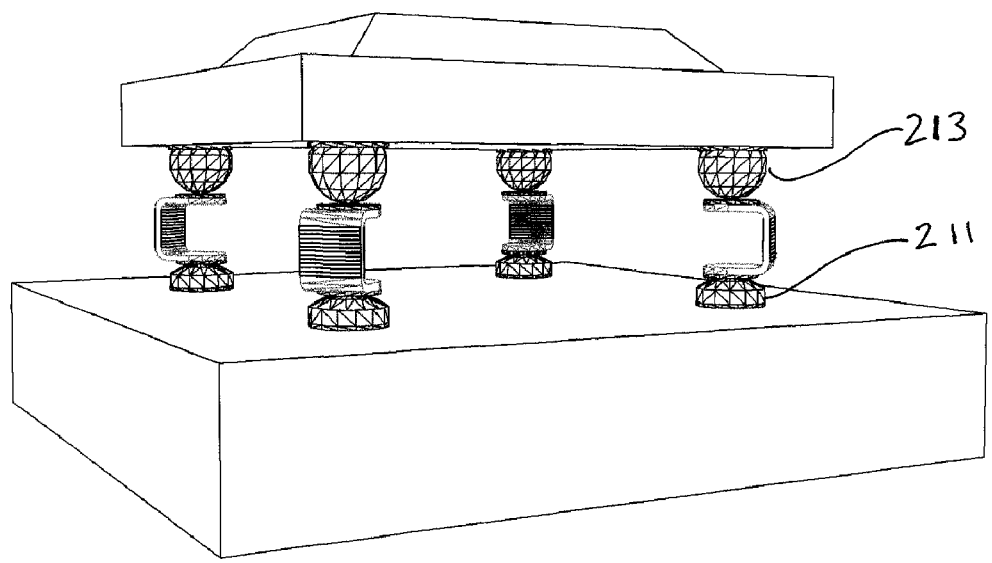
FIG. 2-B

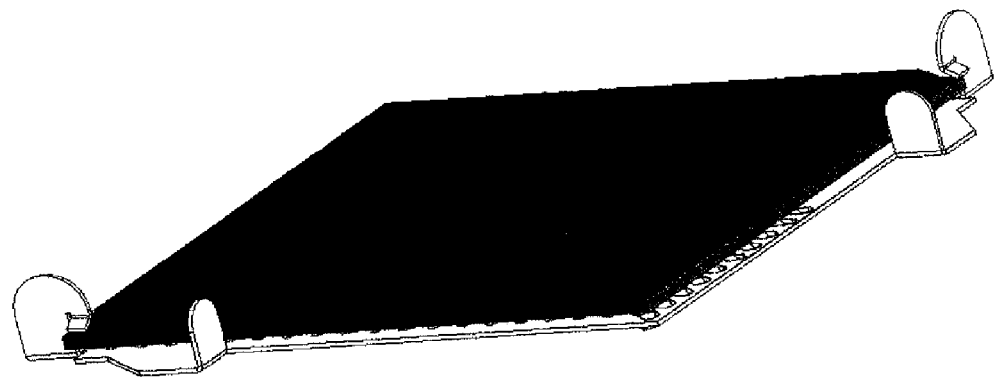
FIG. 4-A

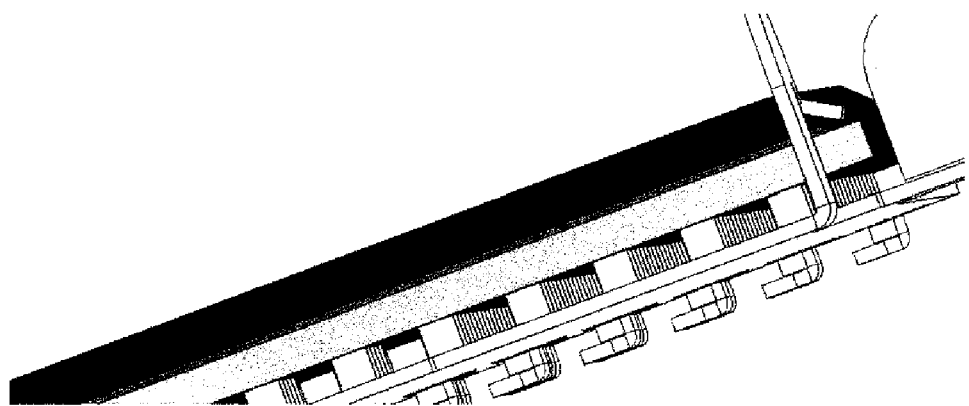
FIG. 4-B

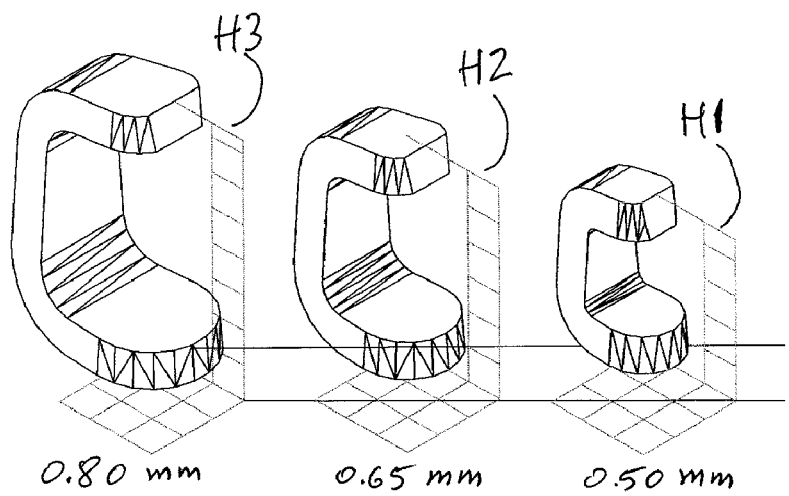
FIG. 6-A
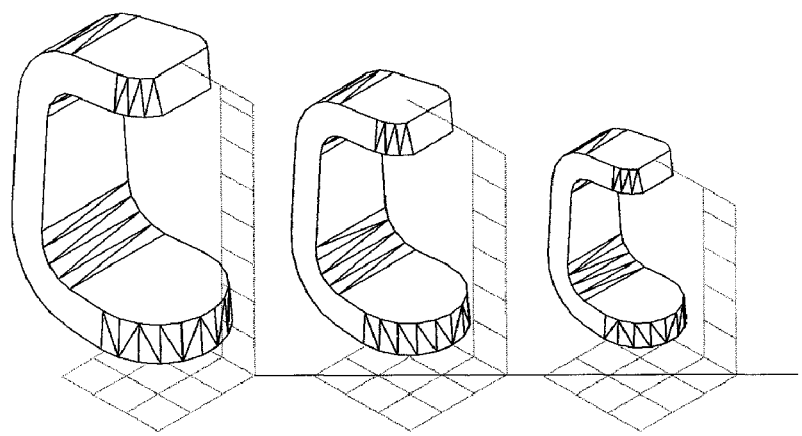
FIG. 6-B

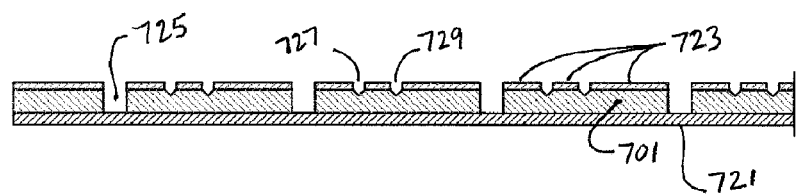
FIG. 7-Bottom-A
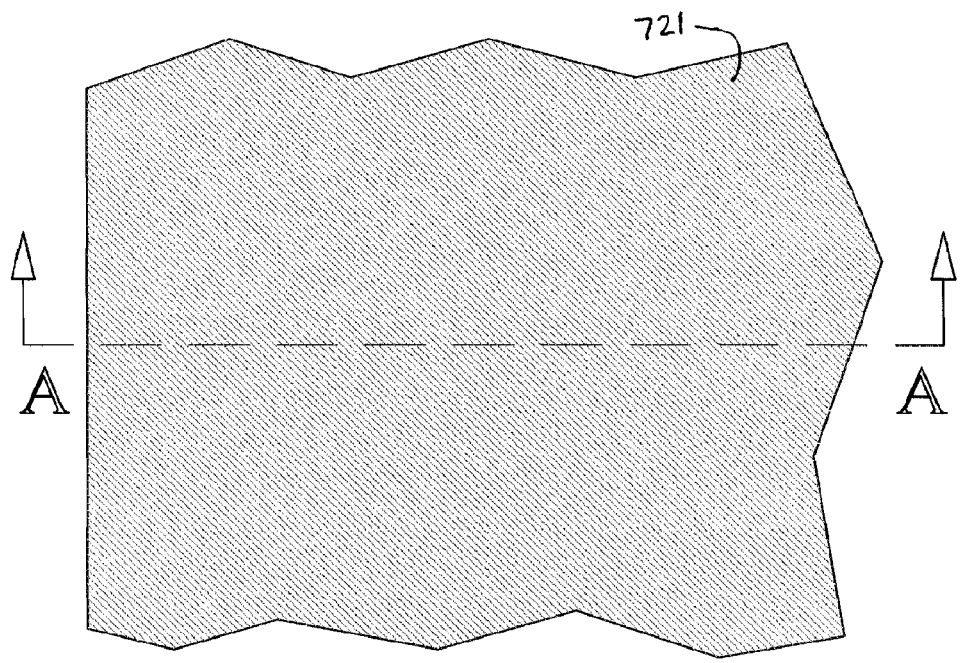
FIG. 7-Bottom-B

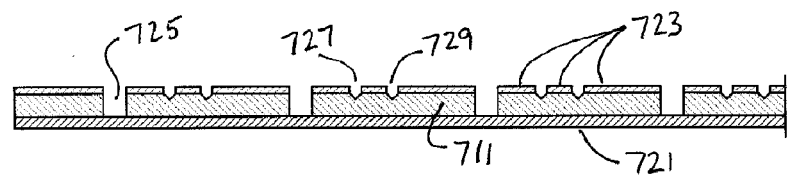
FIG. 7-Top-A
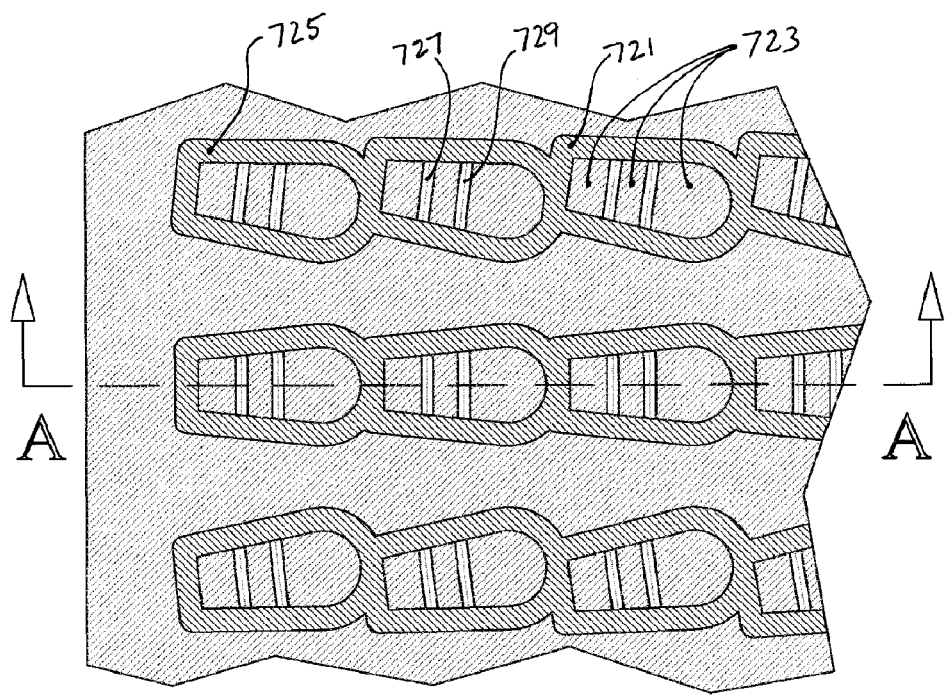
FIG. 7-Top-B

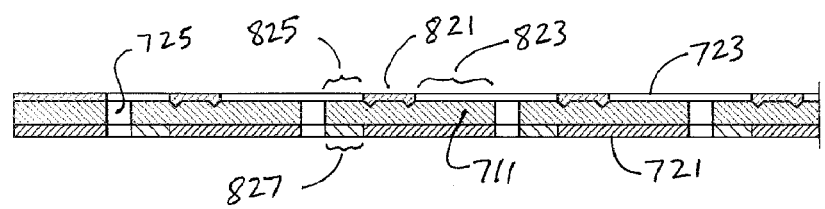
FIG. 8-Bottom-A
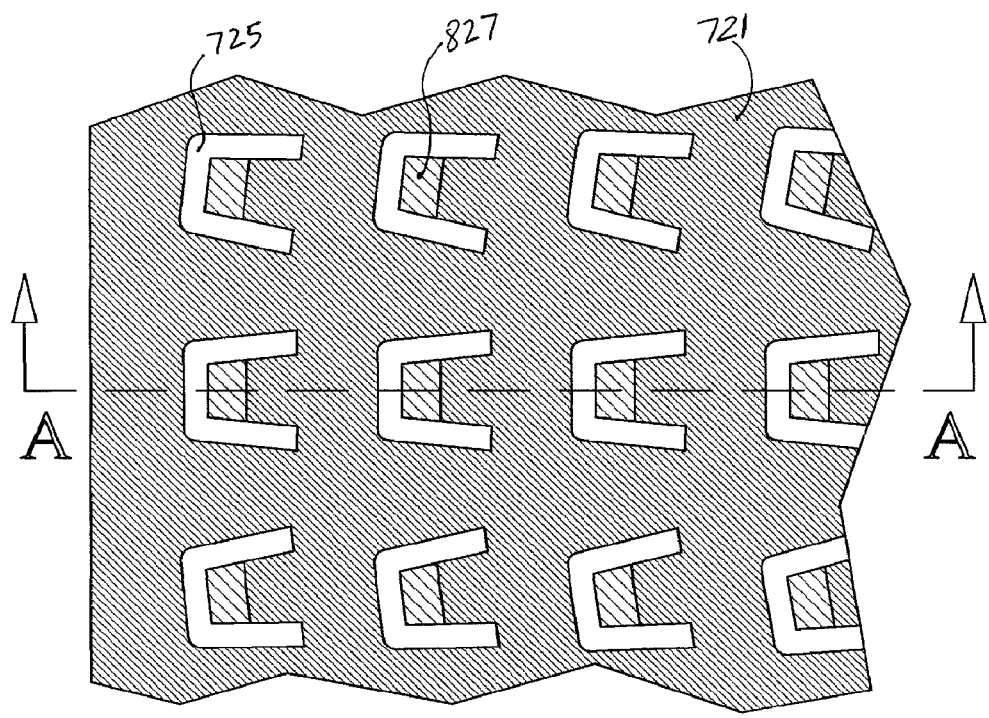
FIG. 8-Bottom-B

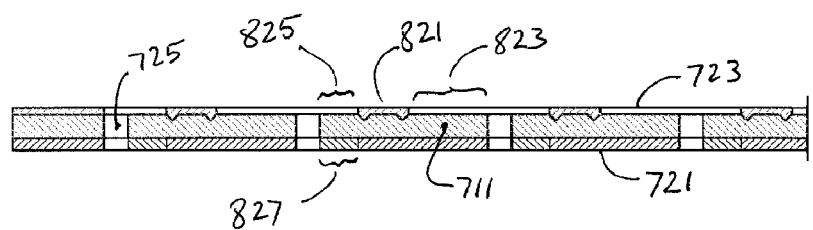
FIG. 8-Top-A
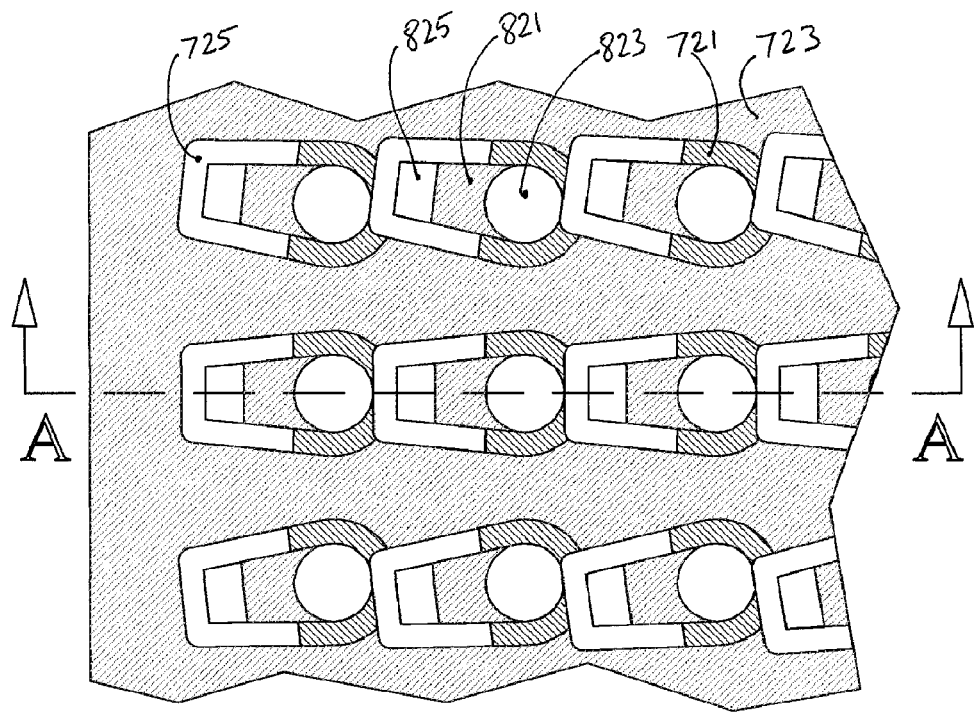
FIG. 8-Top-B

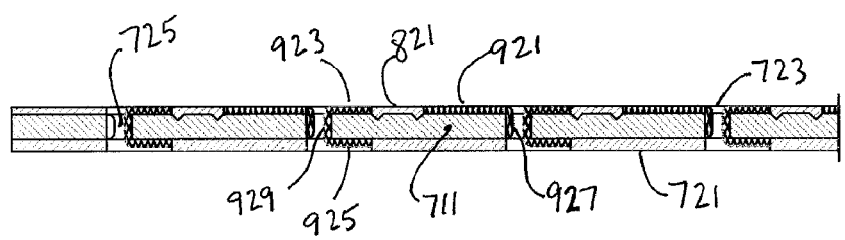
FIG. 9-Bottom-A
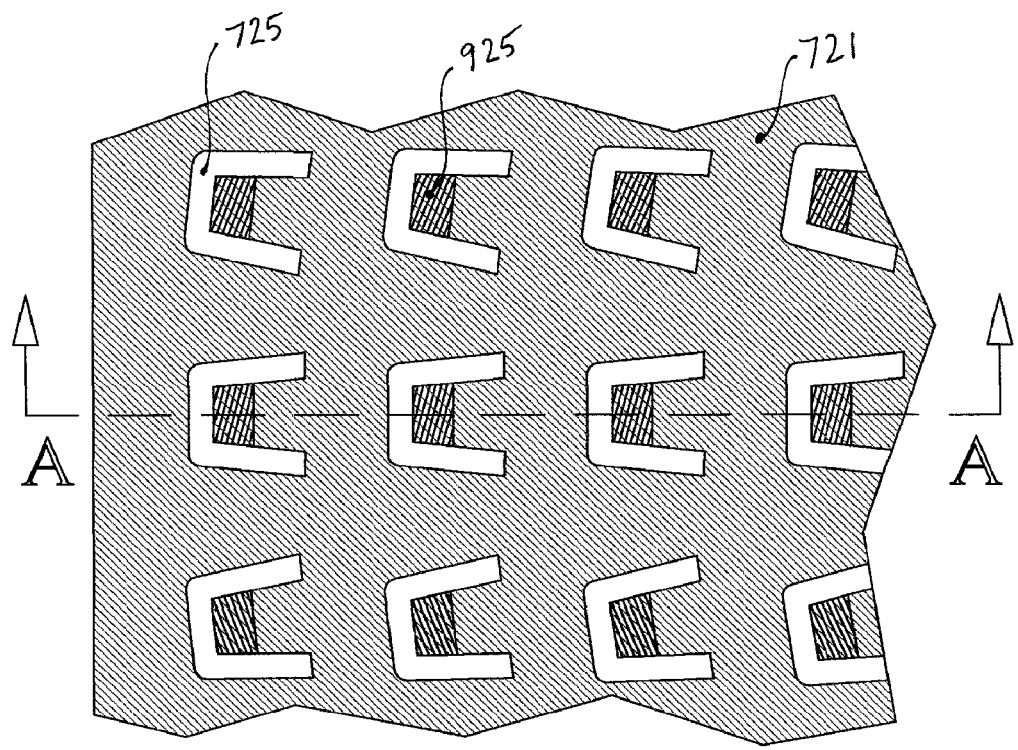
FIG. 9-Bottom-B

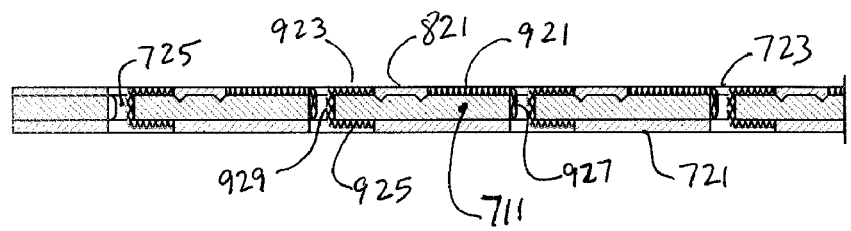
FIG. 9-Top-A
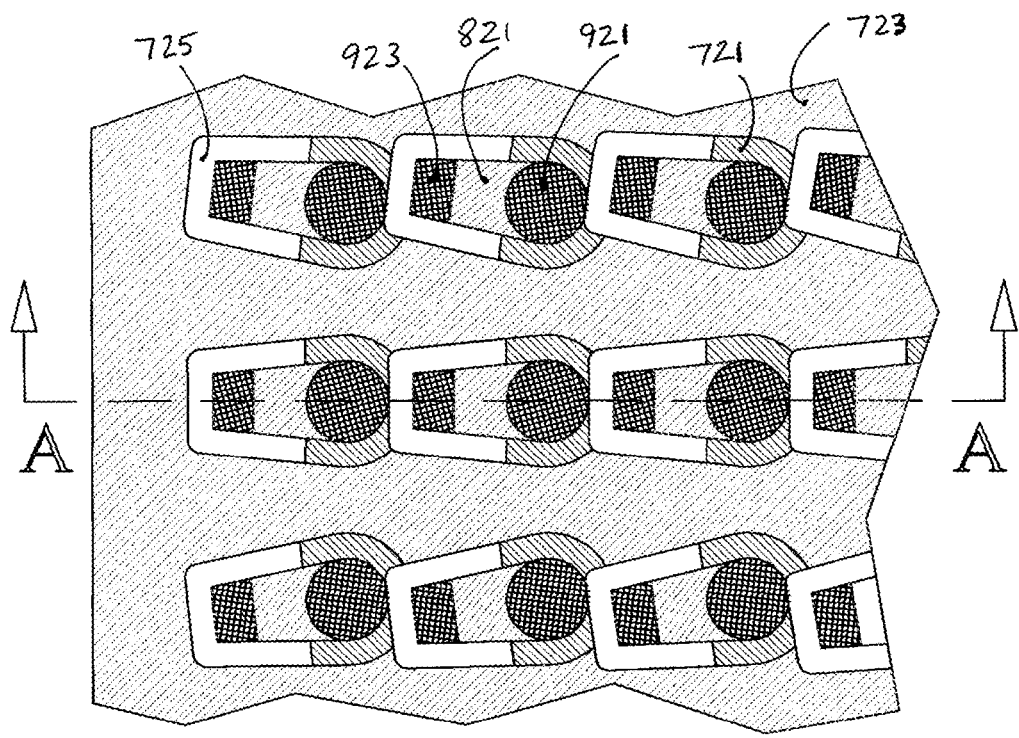
FIG. 9-Top-B

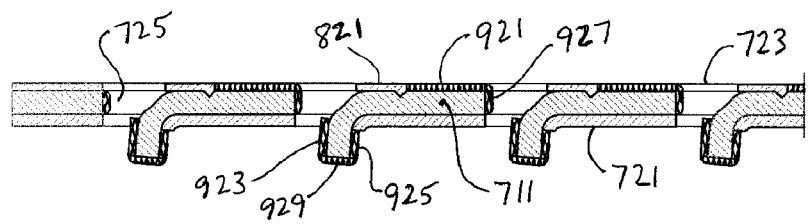
FIG. 10-Bottom-A
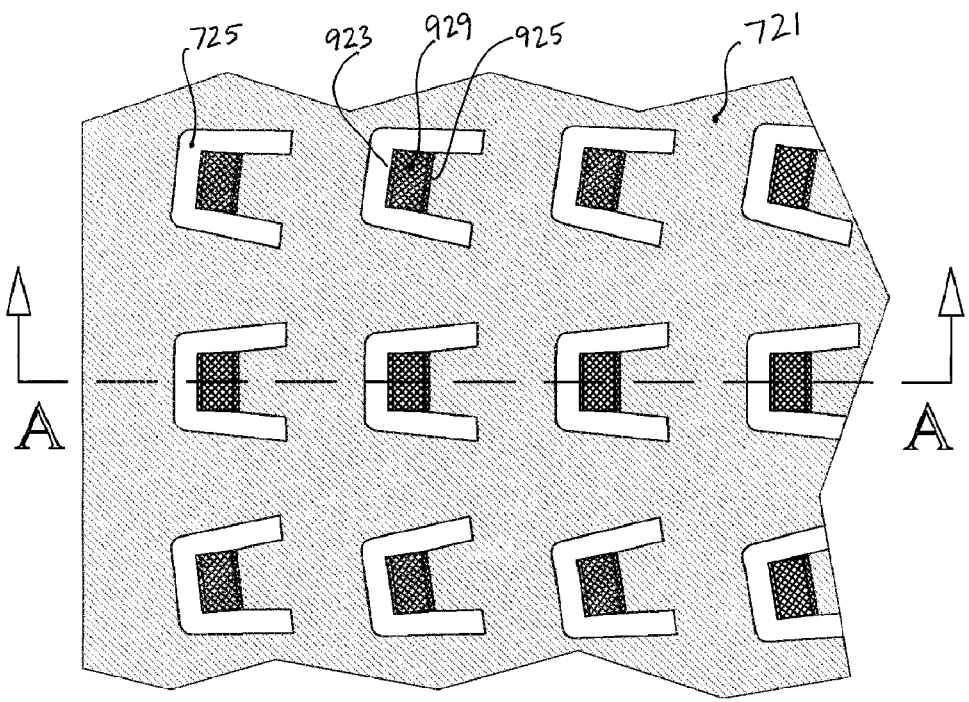
FIG. 10-Bottom-A

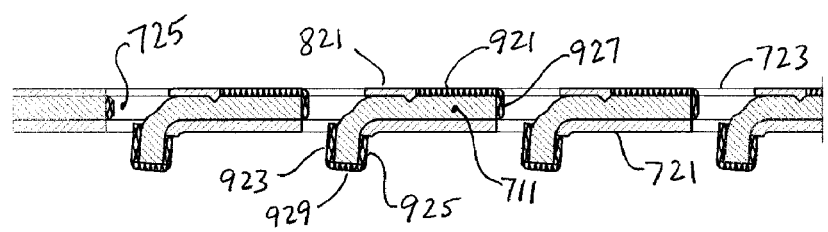
FIG. 10-Top-A
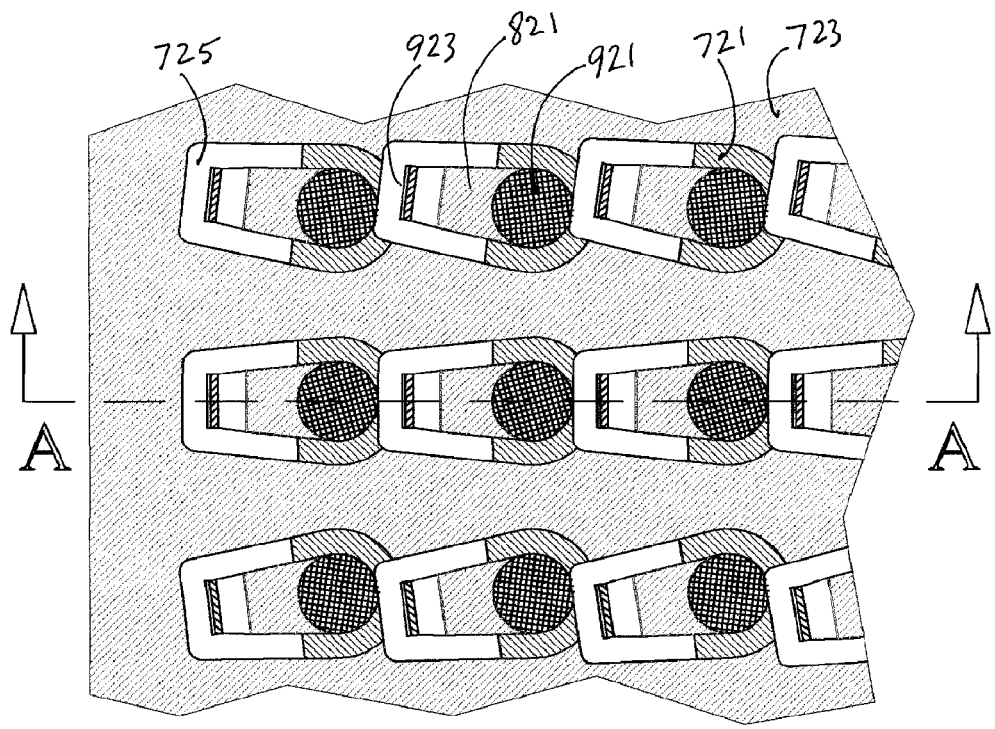
FIG. 10-Top-B

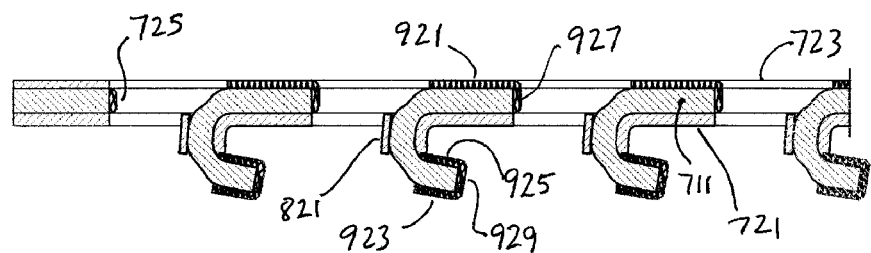
FIG. 11-Bottom -A
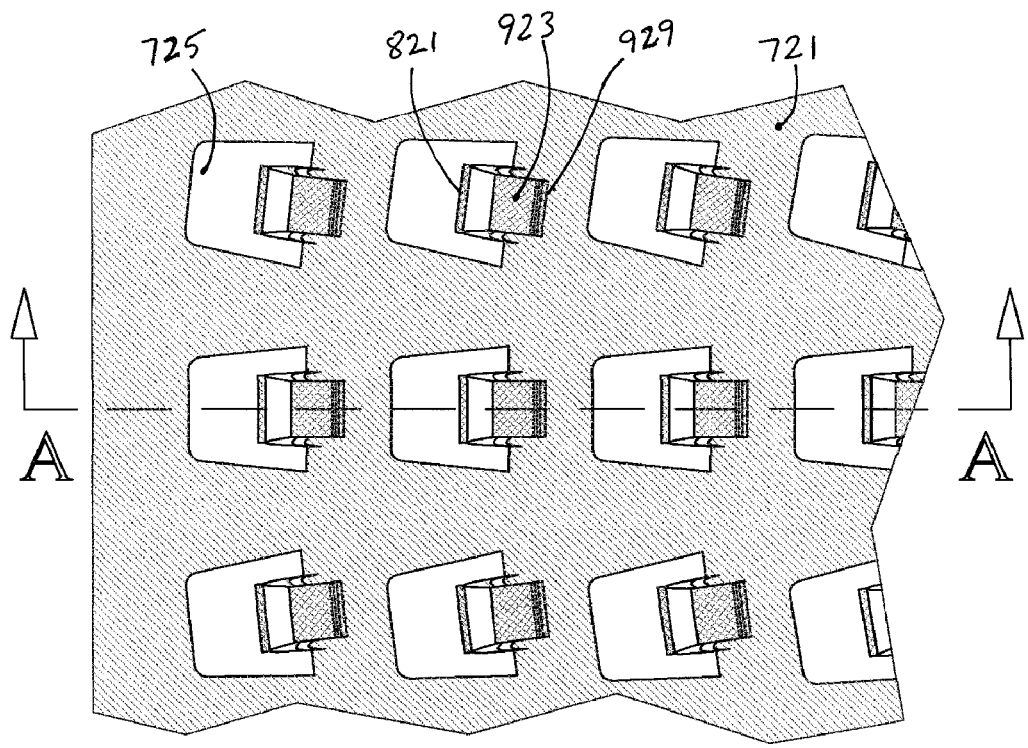
FIG. 11-Bottom-B

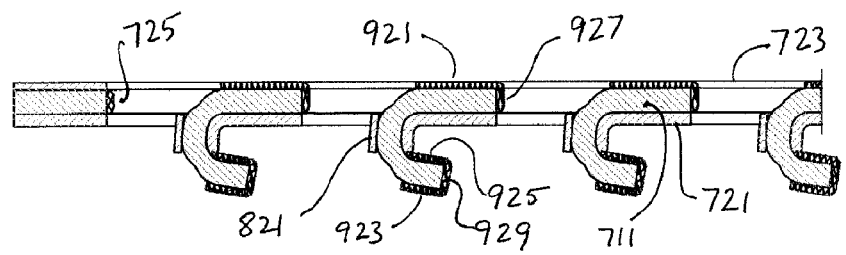
FIG. 11-Top-A
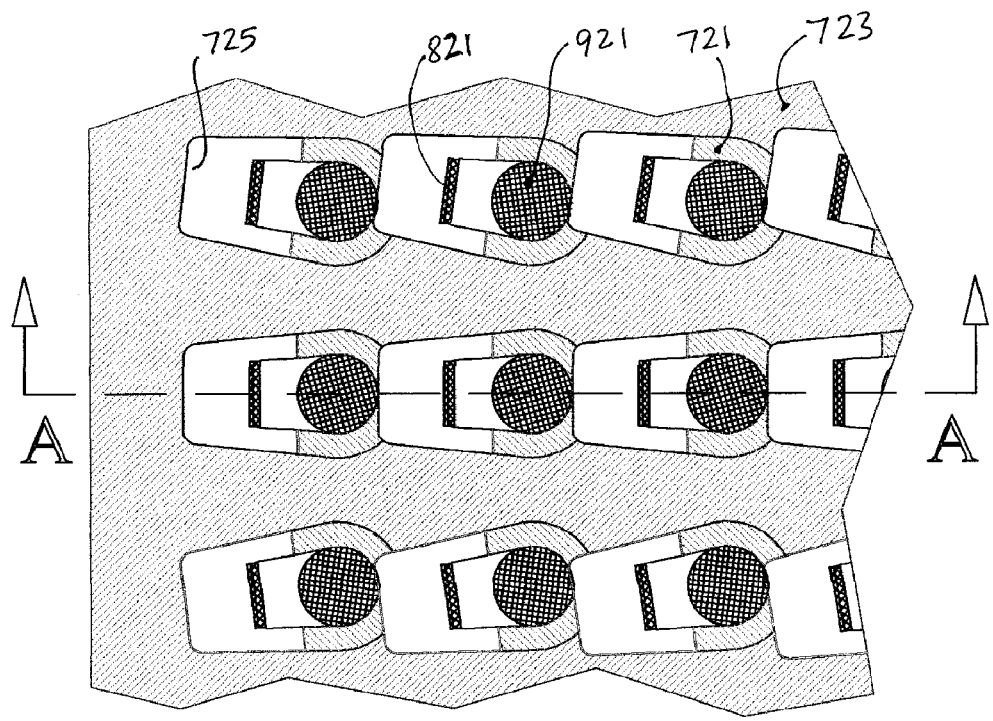
FIG. 11-Top-B

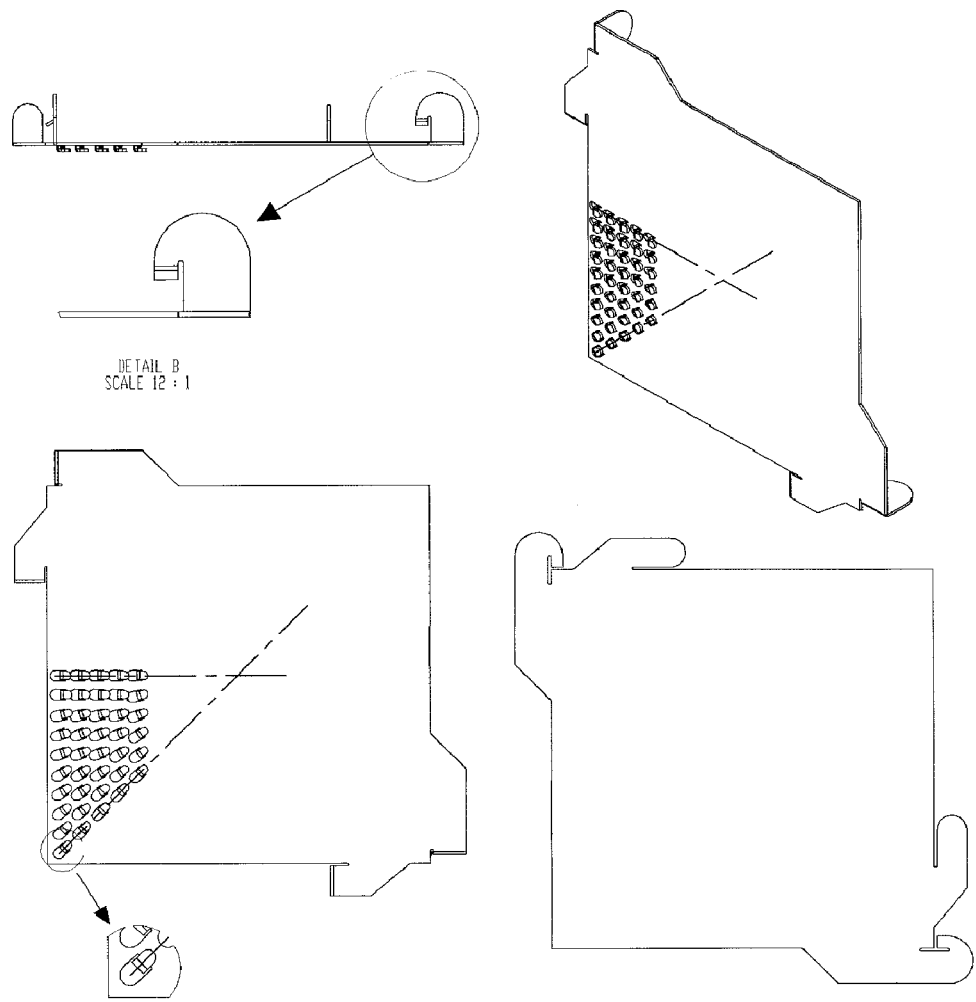
FIG. 20-A

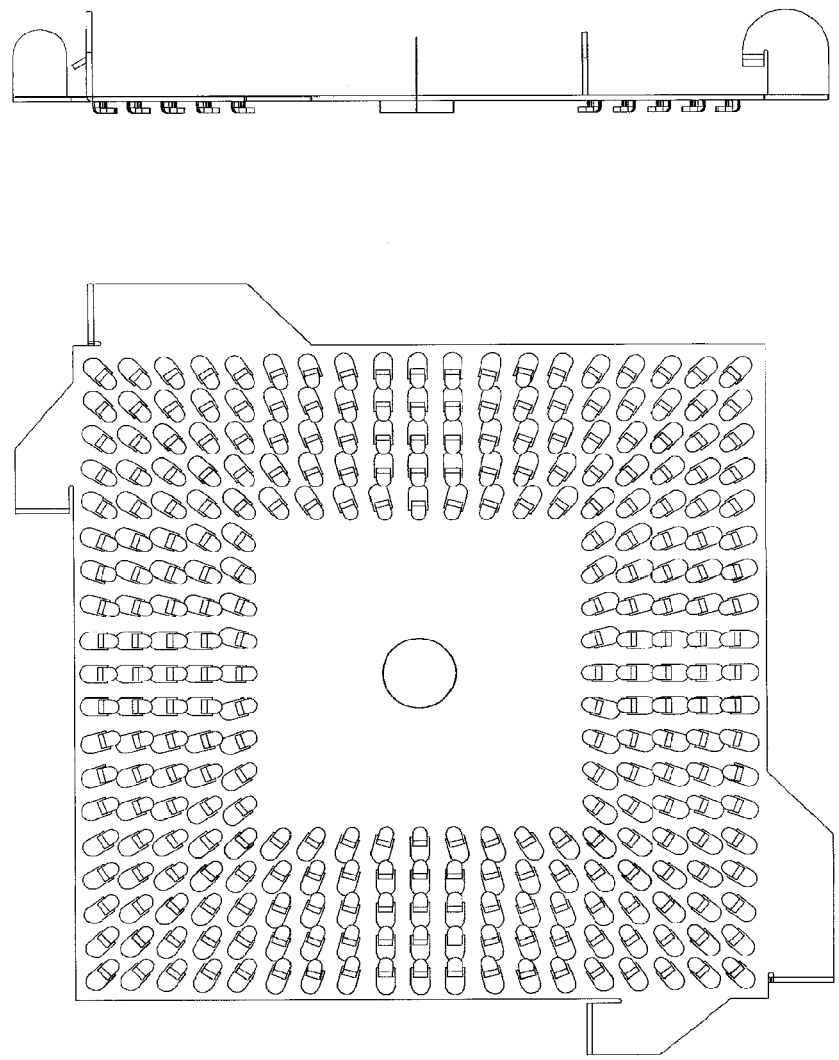
FIG. 20-B

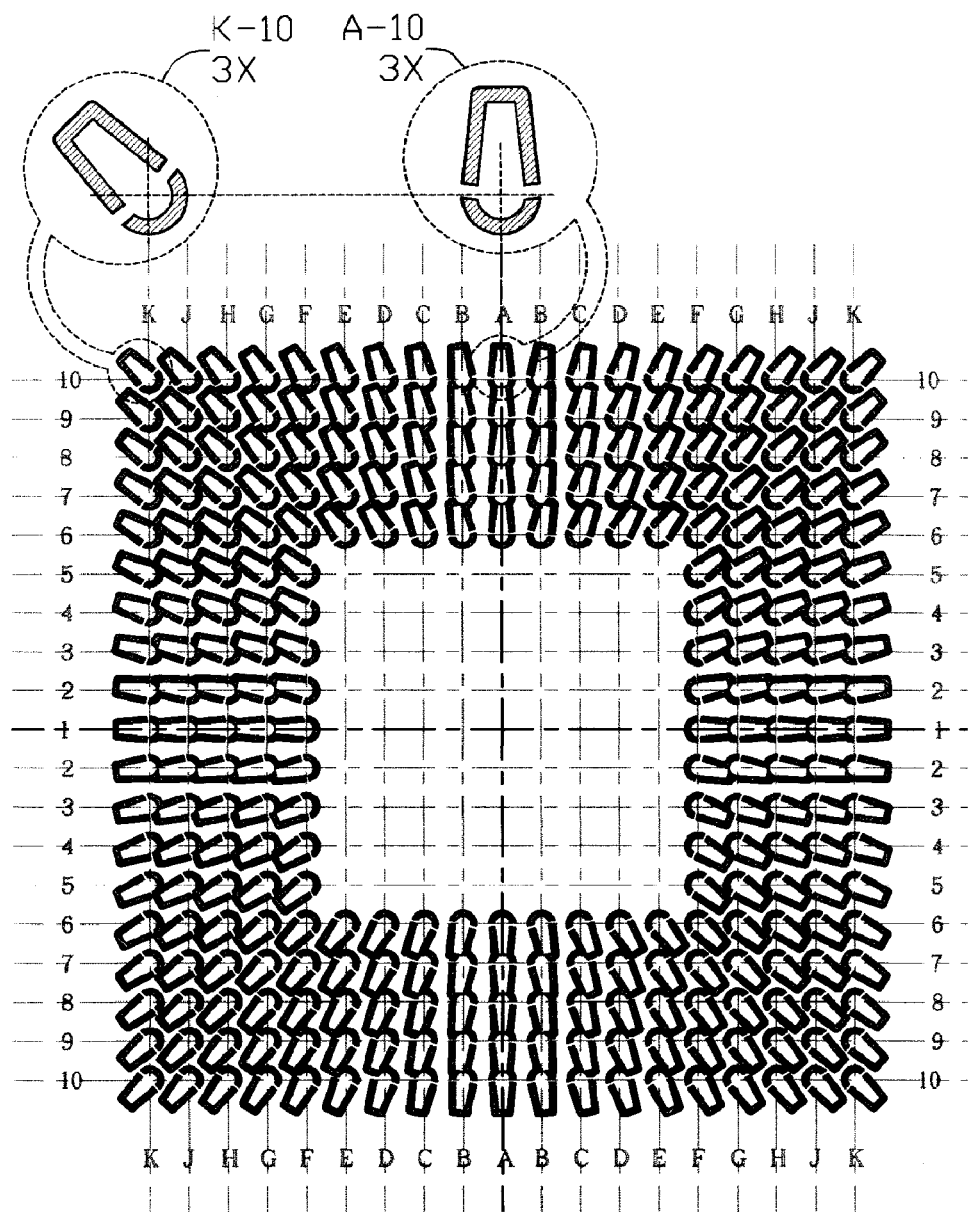
FIG. 33-36-C1

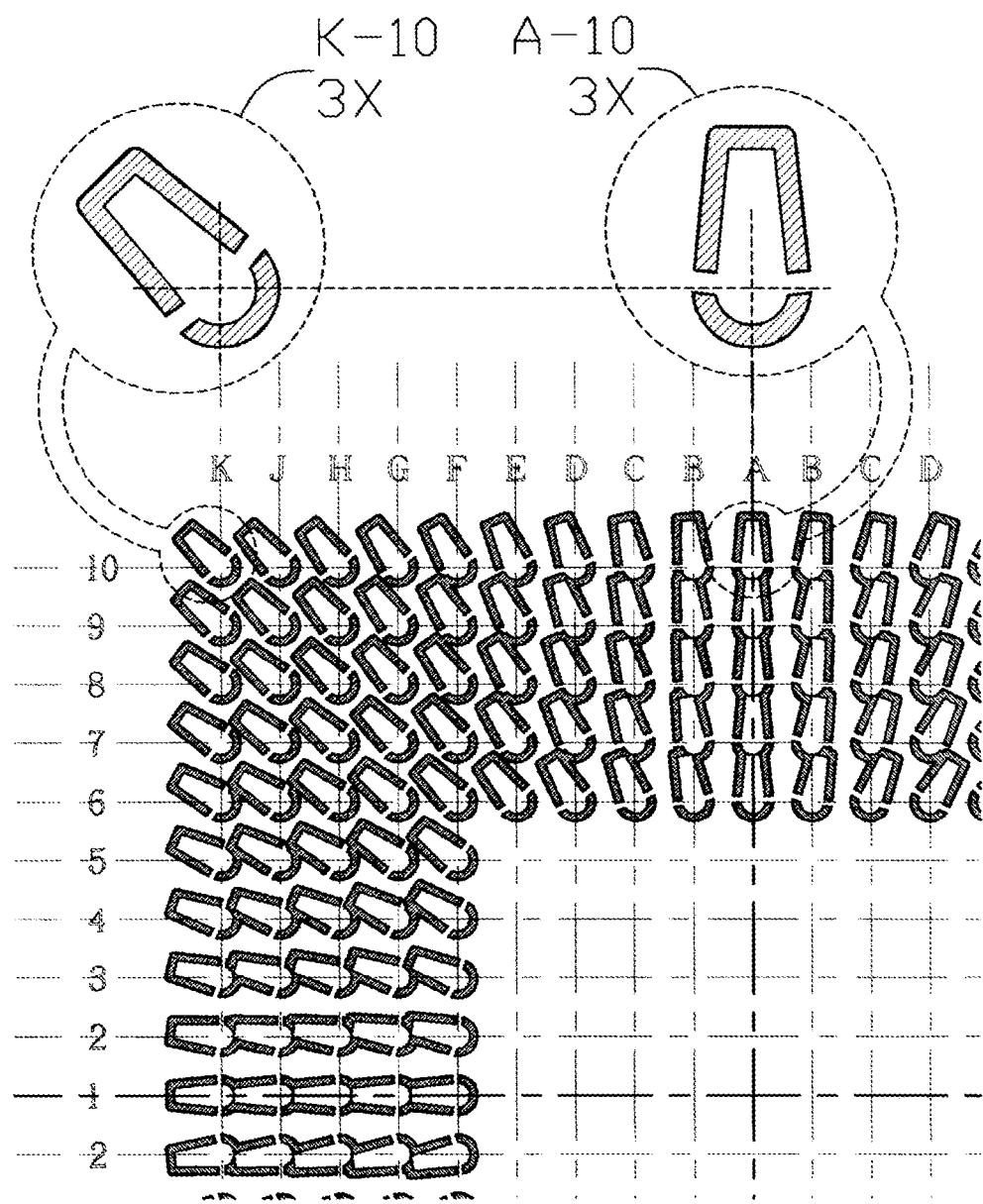
FIG. 33-36-C2

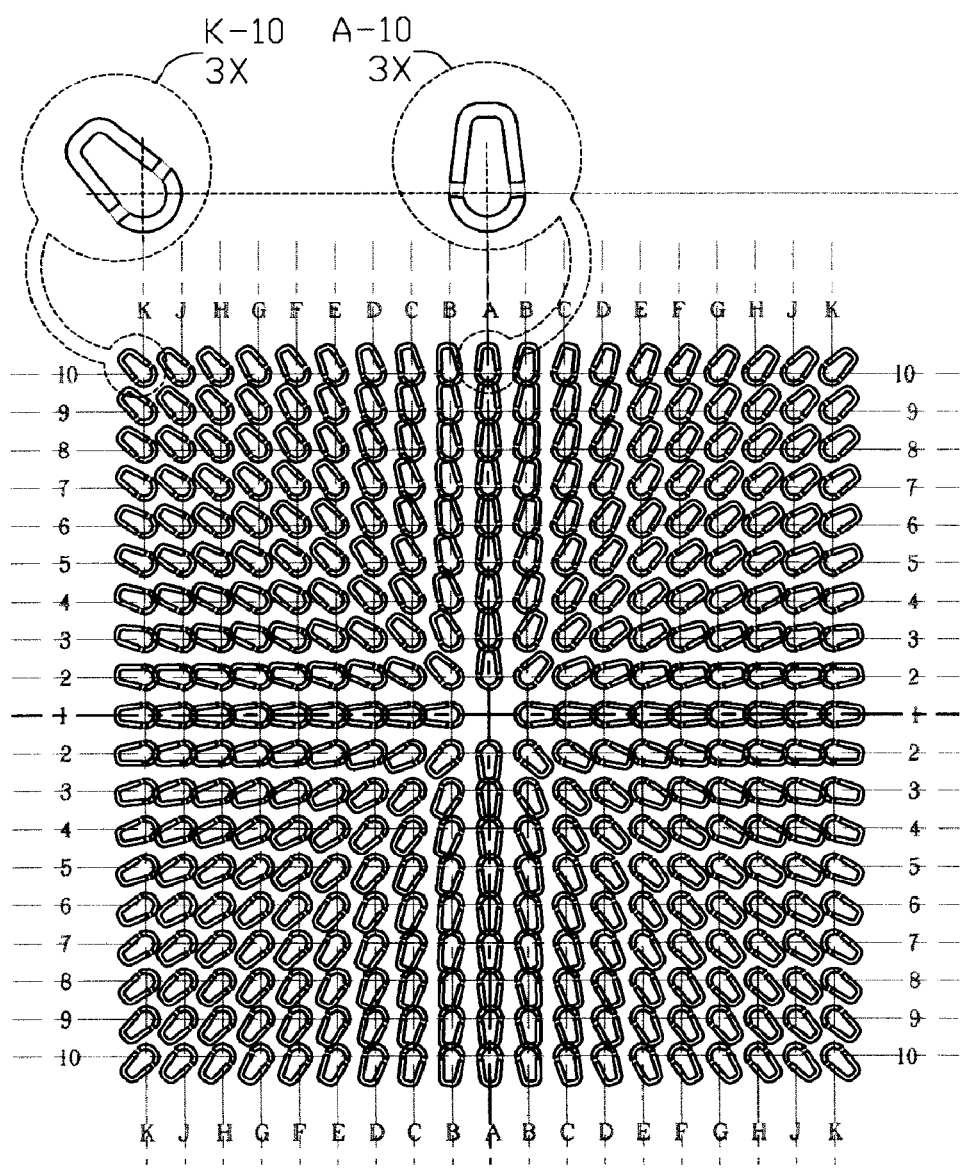
FIG. 37-A

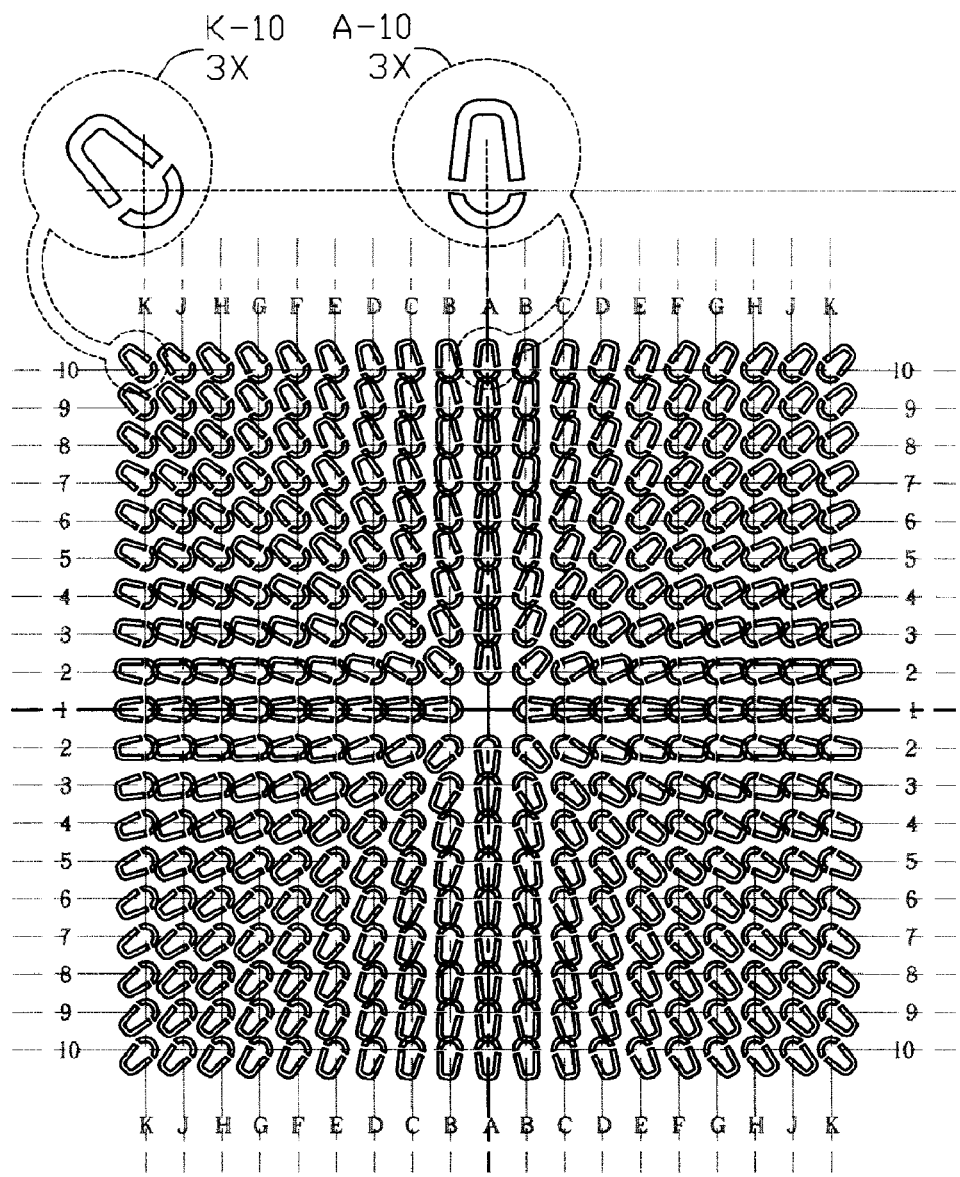
FIG. 37-B

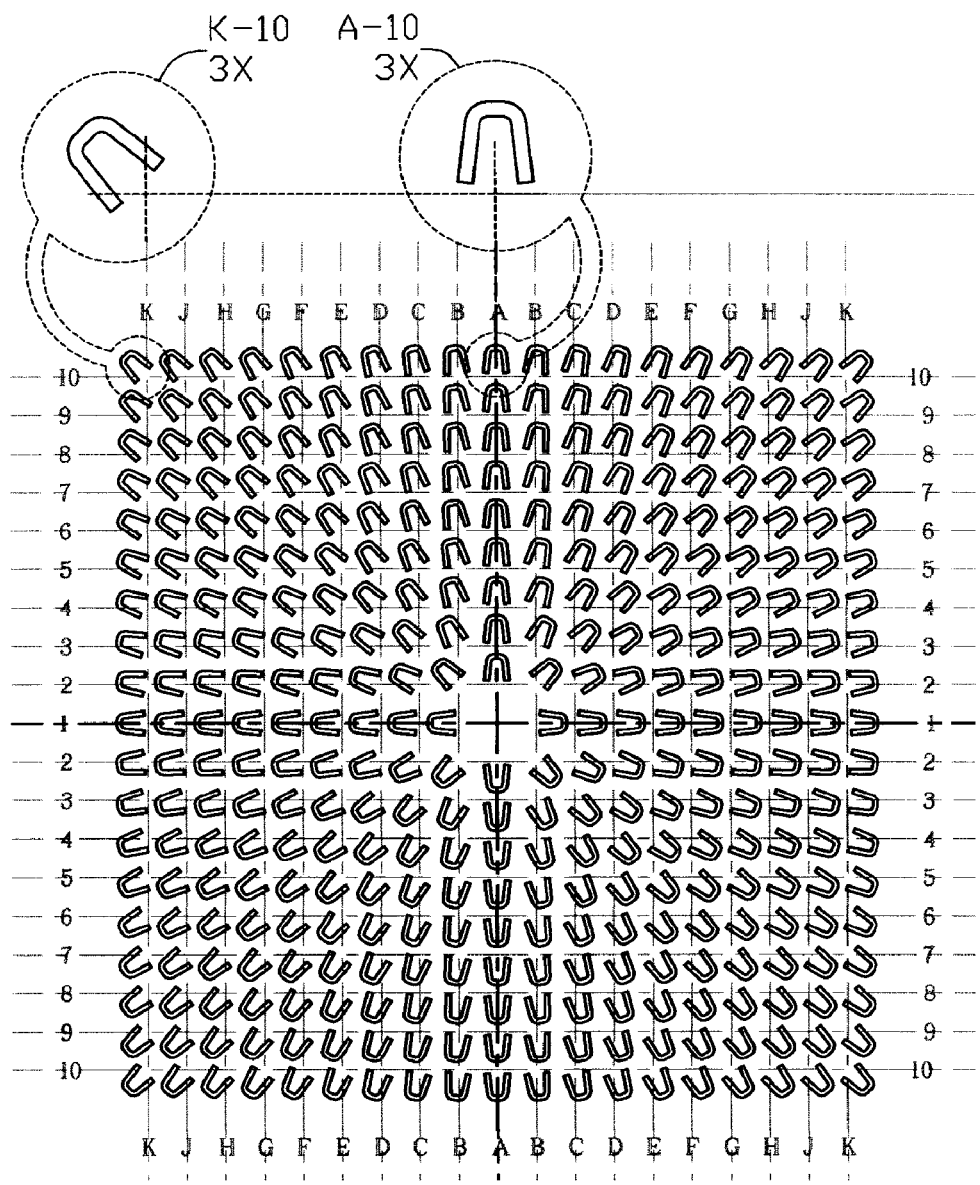
FIG. 37-C

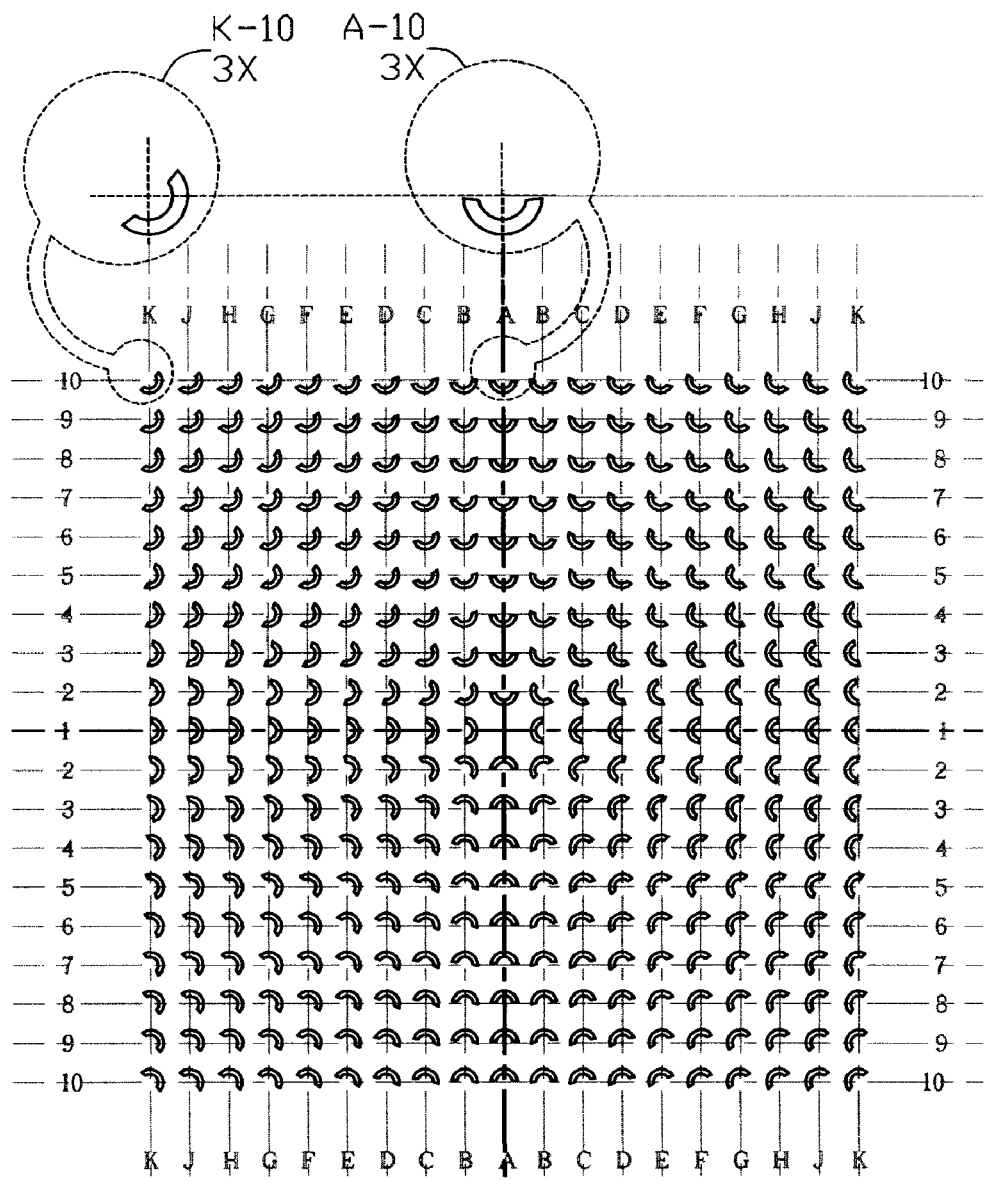
FIG. 37-D

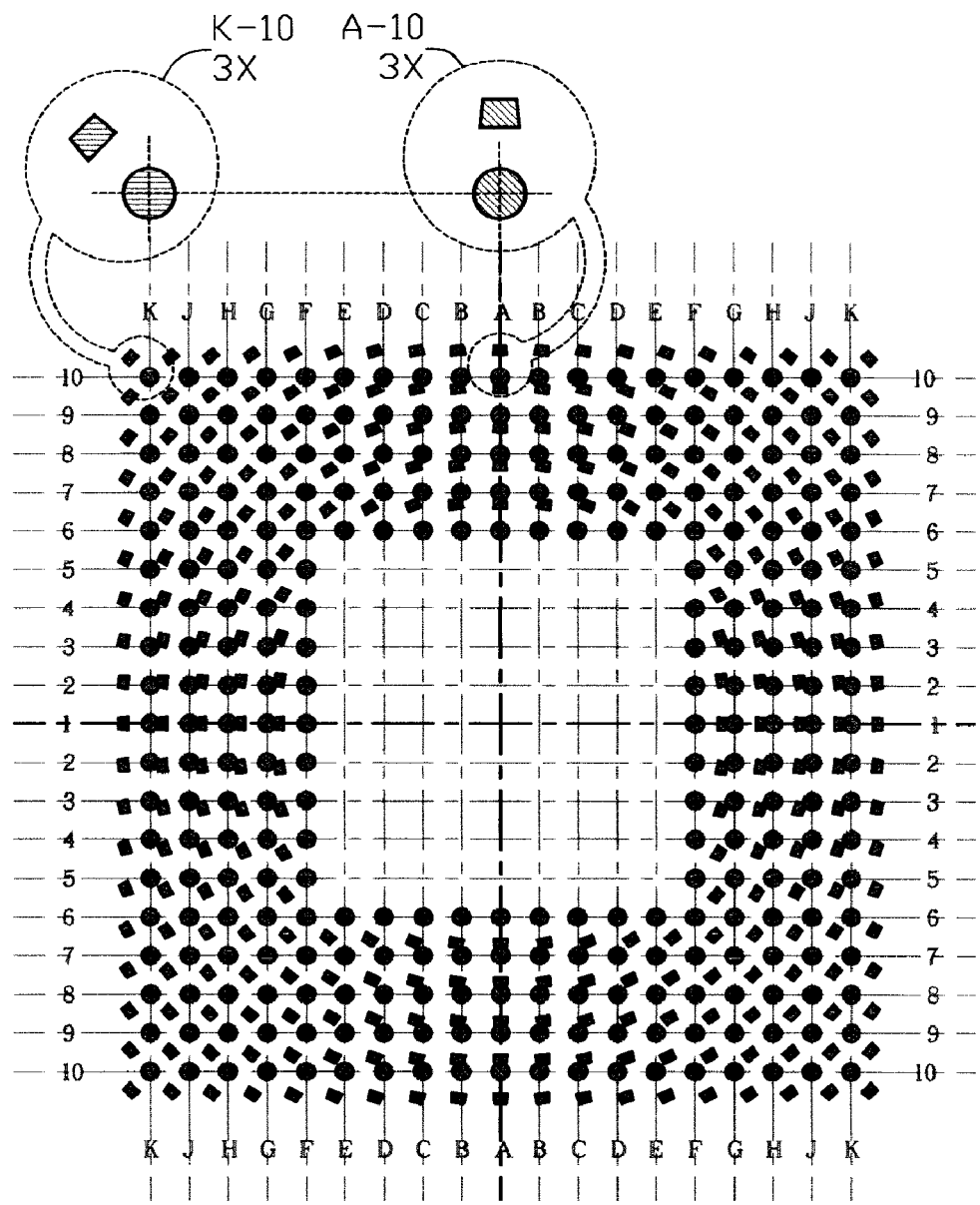
FIG. 38-41-C1

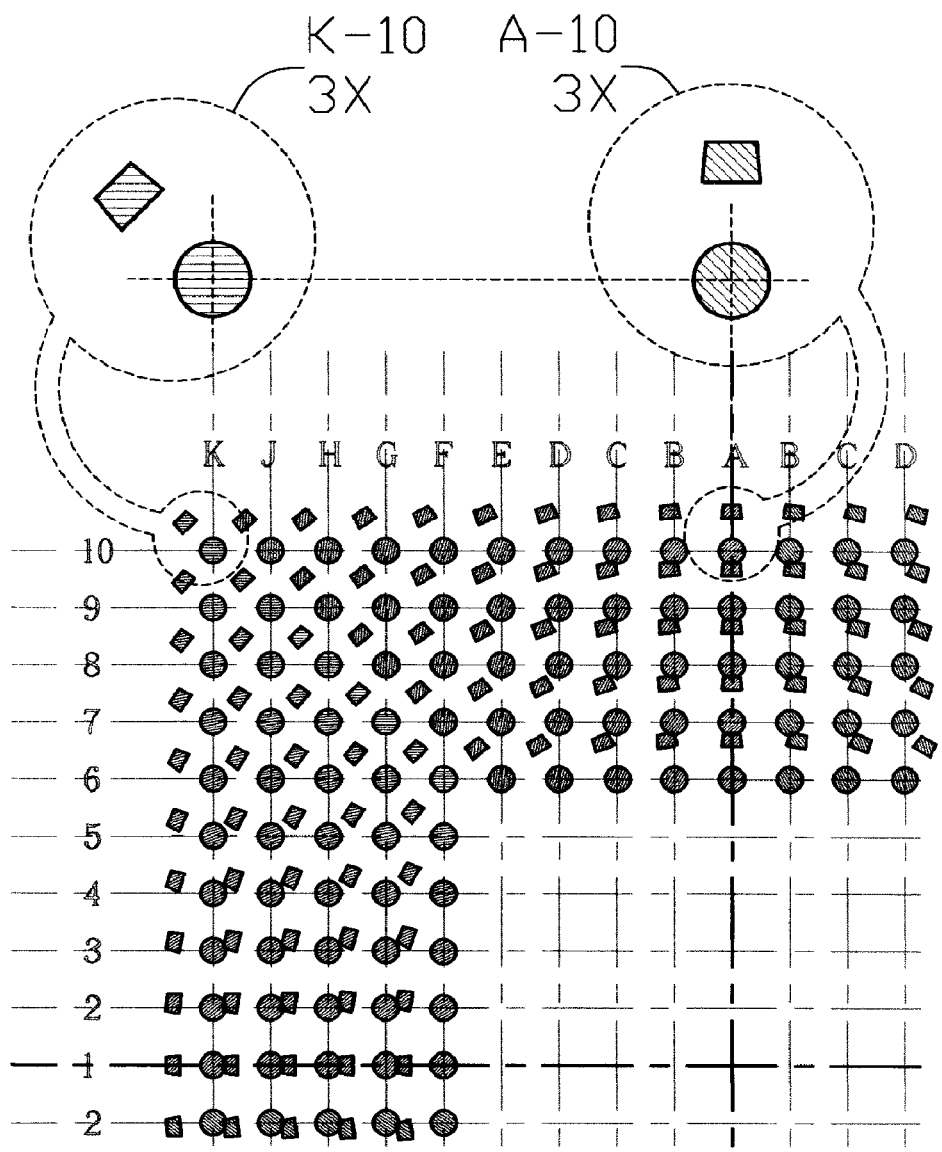
FIG. 38-41-C2

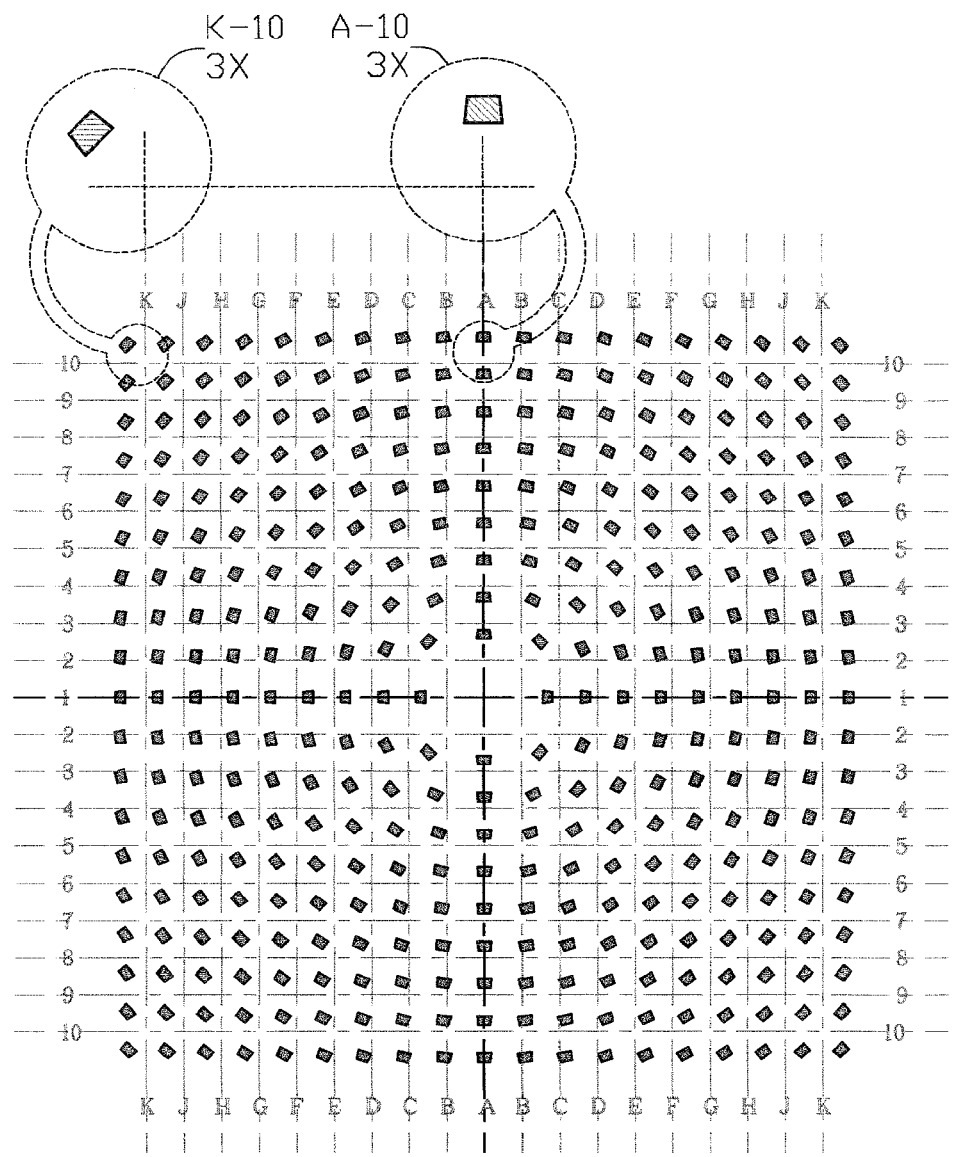
FIG. 42-ABCD-C1

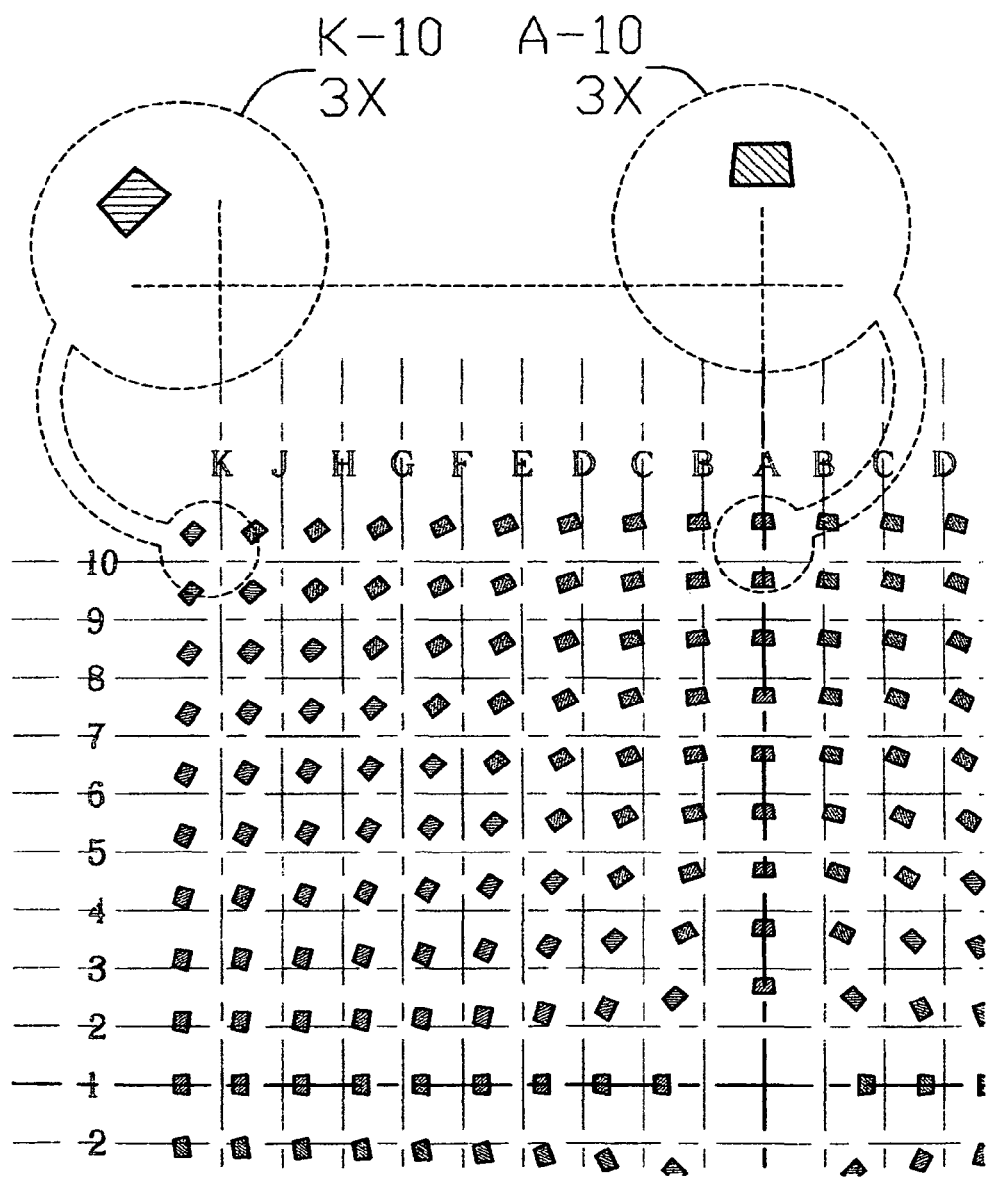
FIG. 42-ABCD-C2

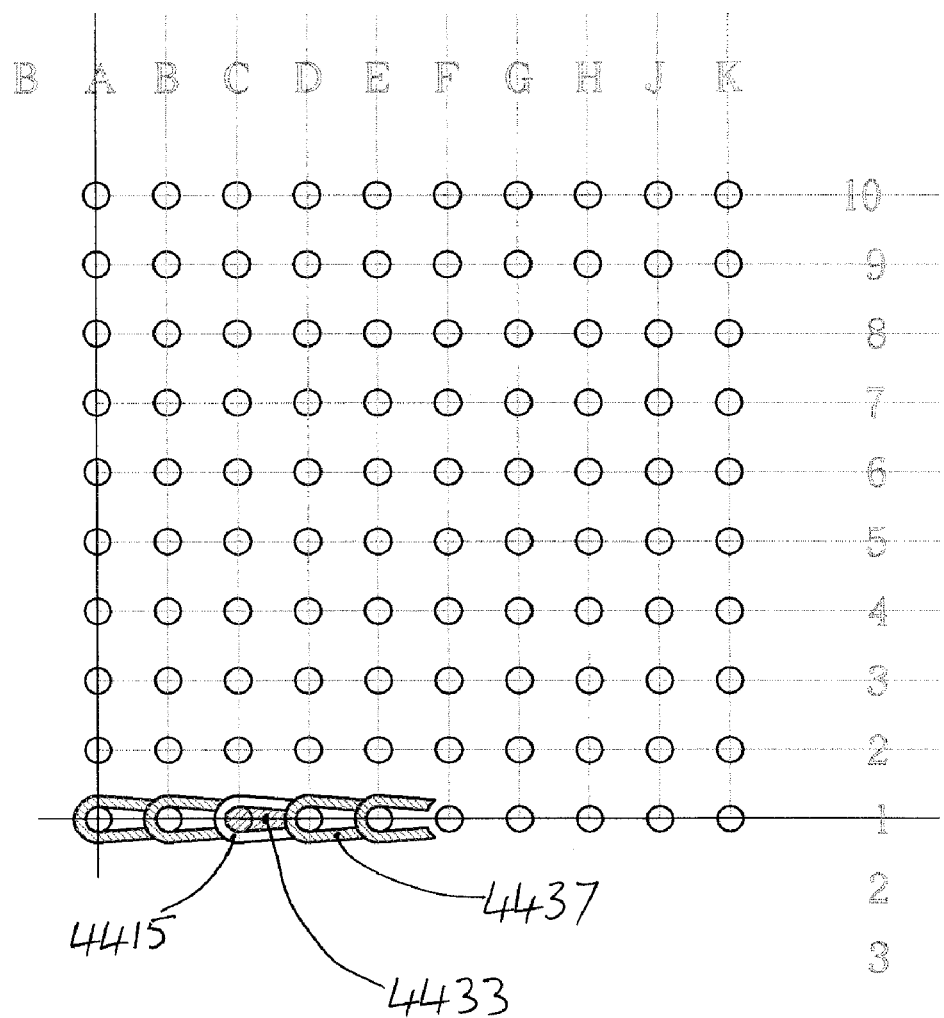
FIG. 44-A

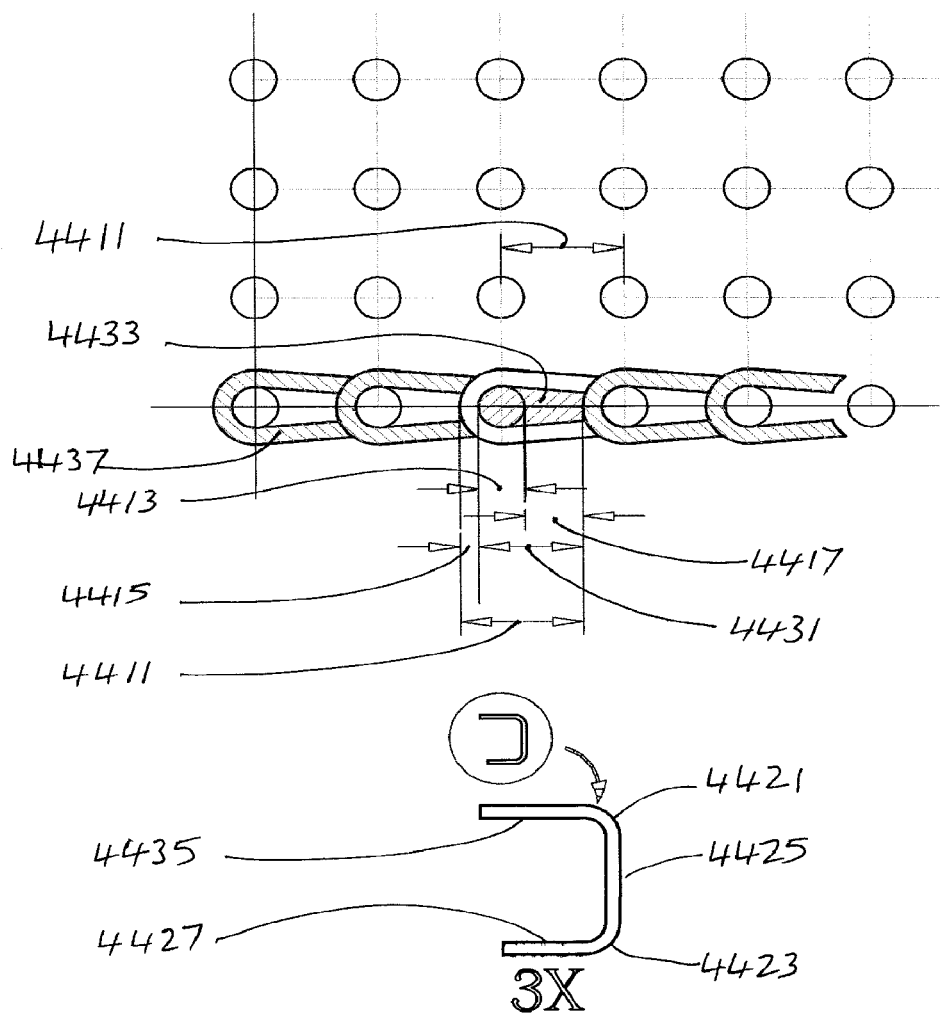
FIG. 44-B

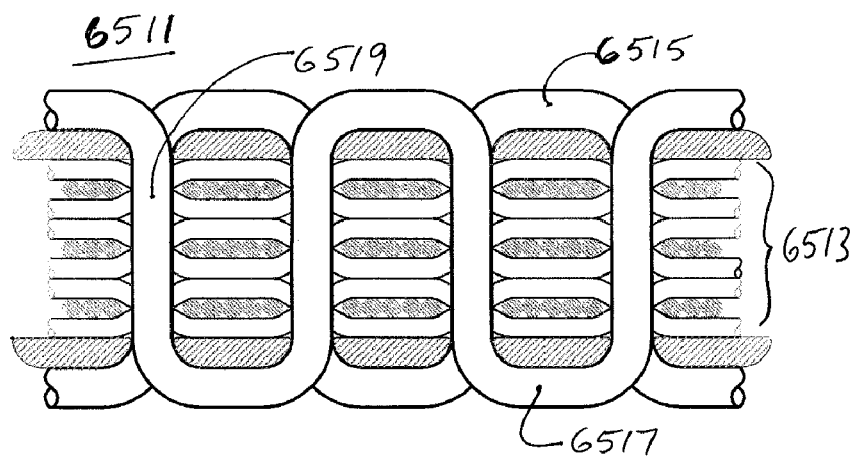
(PRIOR ART)
FIG. 65-A
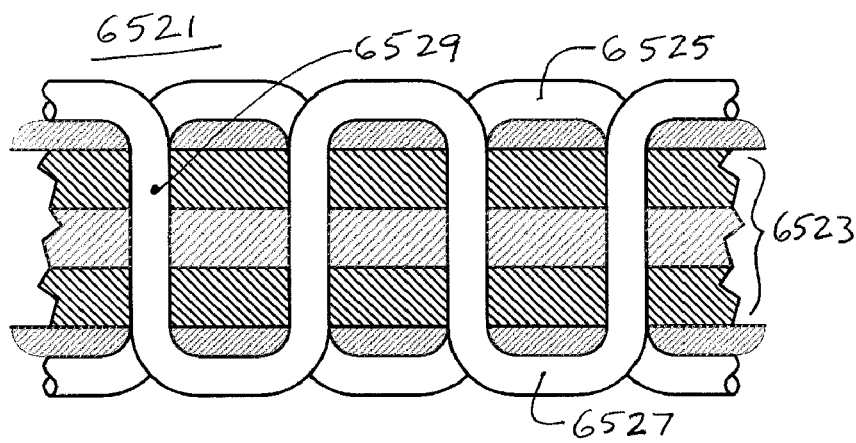
(PRIOR ART)
FIG. 65-B

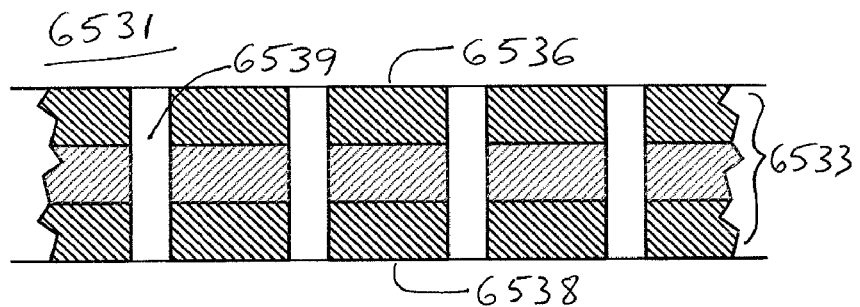
(PRIOR ART)
FIG. 65-C
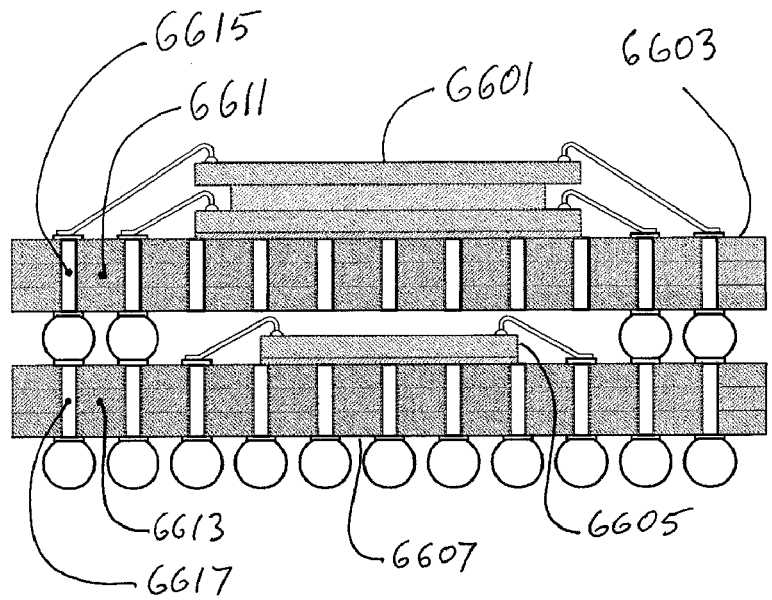
(PRIOR ART)
FIG. 66

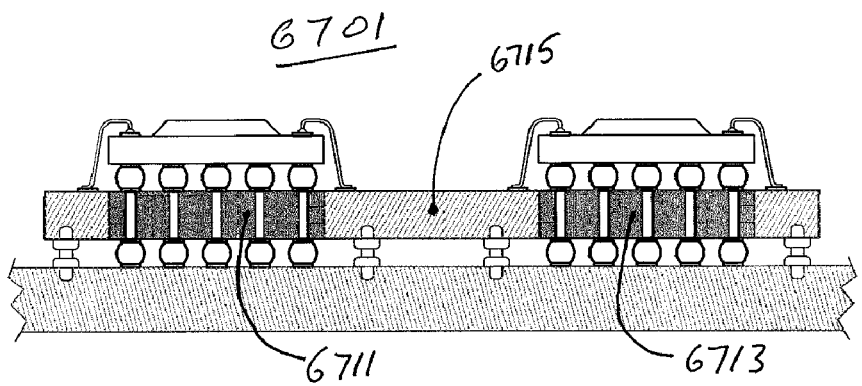
FIG. 67-A-1
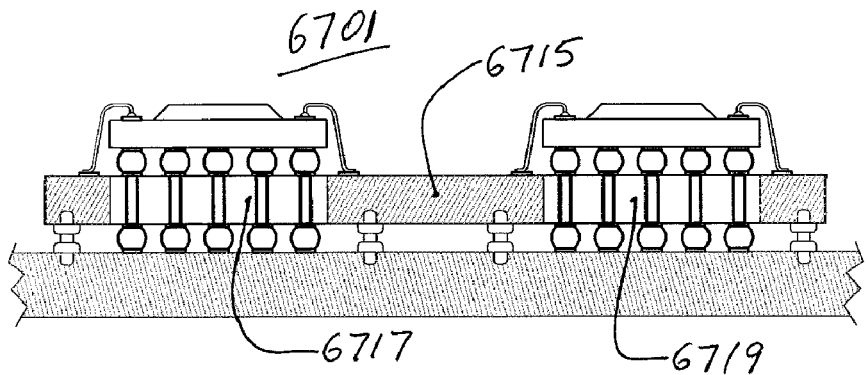
FIG. FIG. 67-A-2

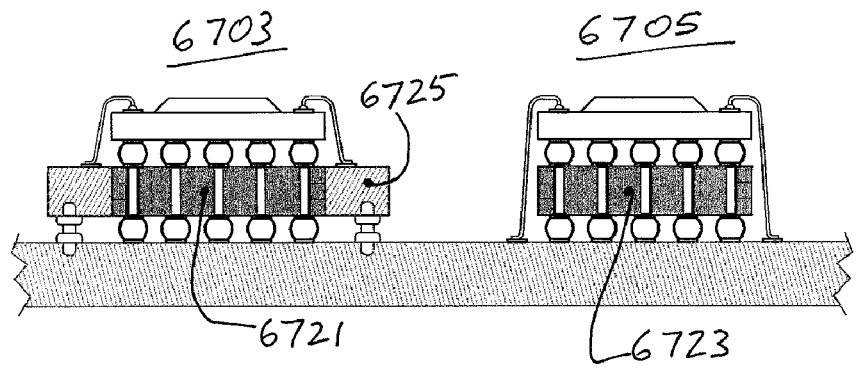
FIG. 67-B-1
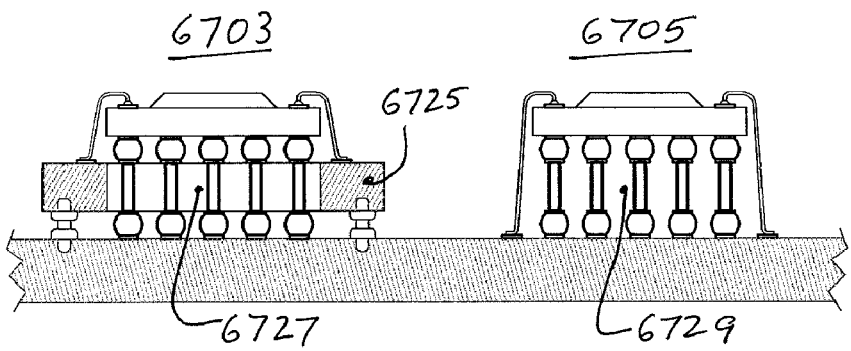
FIG. 67-B-2

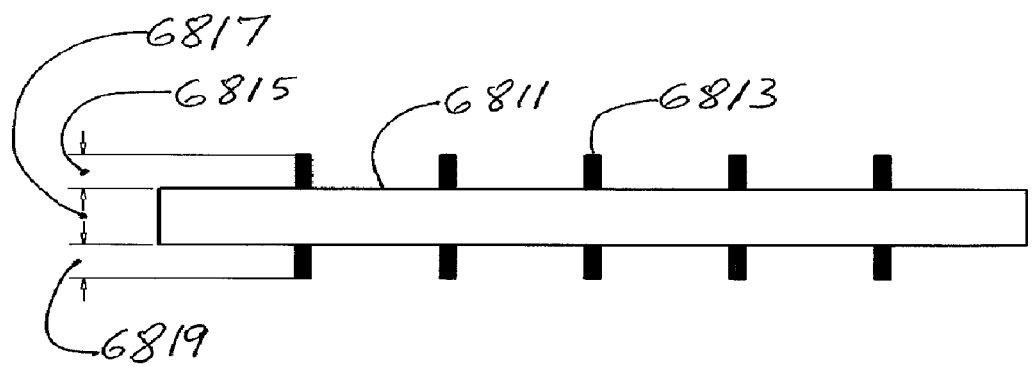
FIG. 68-A
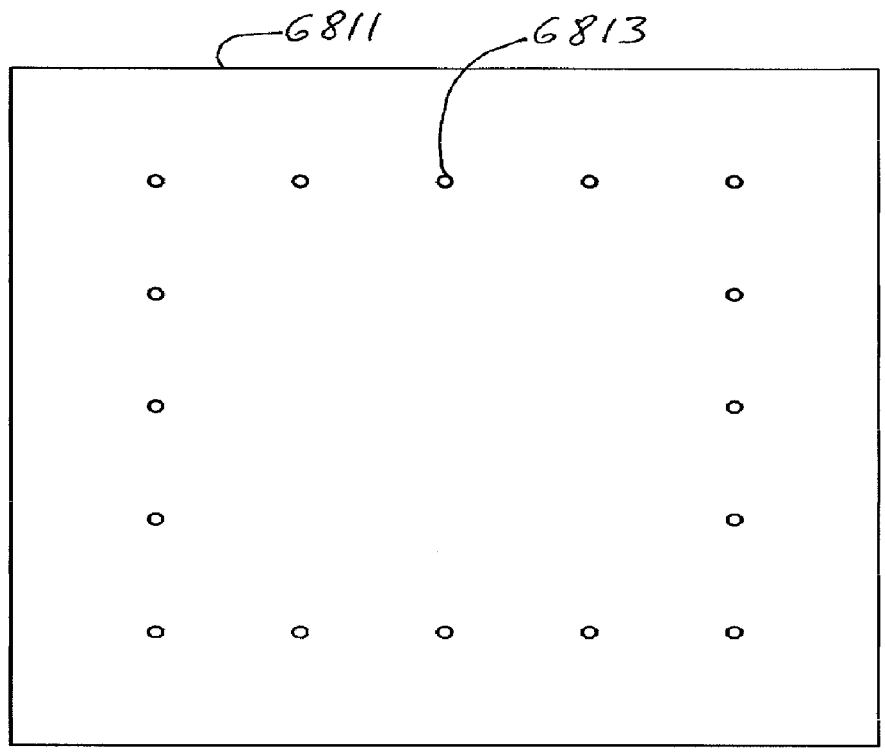
FIG. 68-B

TFCC (TM) AND SWCC (TM) THERMAL FLEX CONTACT CARRIERS

CROSS-REFERENCE TO RELATED APPLICATIONS

This application is a NON-PROVISIONAL UTILITY PATENT APPLICATION, and should be considered as a CONTINUATION PATENT APPLICATION, based on patent application Ser. No. 11/689,558, filed Mar. 22, 2007, title "NO-WICK(TM) 2 INTERCONNECTIONS", which is a Divisional Patent Application based on patent application No. 10/937,647, filed Sep. 8, 2004, title "INTERCONNECTIONS", now U.S. Pat. No. 7,196,402 issued Mar. 27, 2007, which in turn is a DIVISIONAL Patent Application, based on patent application No. 10/075,060, filed Feb. 11, 2002, title "INTERCONNECTIONS", now U.S. Pat. No. 6,884,707, issued Apr. 26, 2005.

This application is claiming the priority and benefits of the following prior applications, which include the same references, which were claimed by the two mother applications. These prior applications are the following seven patent applications, where three are provisional patent applications and four non-provisional utility patent applications, all of which are incorporated herein in their entirety by reference:

1) Provisional Patent Application Ser. No. 60/231,387, filed Sep. 8, 2000, entitled "Probers", which will be referred to as Ref1, and 2) Provisional Patent Application Ser. No. 60/257,673, filed Dec. 22, 2000, entitled "Probes and Sockets", which will be referred to as Ref2, and 3) Provisional Patent Application Ser. No. 60/268,467, filed Feb. 12, 2001, entitled "Probes, Sockets, Packages & Columns", which will be referred to as Ref3, and 4) Non-Provisional Utility Patent Application Ser. No. 09/947,240, filed Sep. 5, 2001, entitled "Interconnection Devices", which will be referred to as Ref4.

5) Non-Provisional Utility Patent Application Ser. No. 10/075,060, filed Feb. 11, 2002, entitled "Interconnections", which will be referred to as Ref5. This application has been granted the U.S. Pat. No. 6,884,707 B1, issued Apr. 26, 2005.

6) Non-Provisional Utility Patent Application Ser. No. #10/937,647, filed Sep. 8, 2004, entitled "Interconnections", now U.S. Pat. No. 7,196,402 issued Mar. 27, 2007, which will be referred to as Ref6.

7) Non-Provisional Utility Patent Application Ser. 11/689,558, filed on Mar. 22, 2007, entitled "NO-WICK(TM) 2 INTERCONNECTIONS".

This Provisional Patent Application will be converted later into a Continuation Patent Application based on Ref7.

STATEMENT REGARDING FEDERALLY SPONSORED RESEARCH OR DEVELOPMENT

Not Applicable

REFERENCE TO A MICROFICHE APPENDIX

Not Applicable

DEFINITIONS

For the purpose of the following invention description, I will use certain words or terms that may be peculiar to this application. They will be explained in the following definitions, or as I go along during the application.

| | |
|---|---|
| TFCC | Thermal Flex Contact Carrier |
| SWCC | SOLUBLE WOVEN CONTACT CARRIER |
| SWOCC | SOLUBLE WOVEN ORIENTED CONTACT CARRIER |
| SSMW | SOLUBLE SOLDER MASK WAFER |
| WCW | WOVEN CARRYING WAFER |
| SWCC IN PCB | as it sounds |

Standard Integrated Circuit Packages:
LCCC: Leadless Ceramic Chip Carrier
BGA: Ball Grid Array Package
PCB: Printed Circuit Board
PGAP: Pin Grid Array Package
SIP: Single In-Line Package Please refer to the description and specification in Ref5 and Ref6.

Bending or Flexing Leads Across Flats, Across Face, Across Edge:

FIG. 1 in Ref xx shows two leads at a corner of a leaded package. Usually the leads of leaded electronic devices are made out of flat sheet metal, with a relatively small thickness compared to the width of the lead. The lead 101 on the right hand side of the figure is being bent "across the flats" or "across the face". This is my definition. It implies that the flat wide section of the lead is facing the bending direction 103 and 105. The lead 107 on the left-hand side of the figure is being bent "across the edge". This definition implies that the bending direction 109 and 111 is against the edge of the lead.

Lead Nomenclature, include the following, see FIG. 7 in Ref xx, which gives the nomenclature of all these terms used in this specification: Lead Base 183, Foot 185, Heel 187, Twist 189, Stem 191, Taper 193, Pin 195 and End 197, FIG. 7 in Ref xx.

Lead or Leg 181, FIG. 7 in Ref xx: A connecting element that is provided on an electronic device, to mount the device or to attach it to another electronic device or a printed circuit board or substrate.

Fold vs. Twist:

I have tried to explain the difference between fold and twist, using words only, and I could not. So, I reverted to using drawings, as in FIGS. 41 and 42 in Ref xx.

The sketch in FIG. 41-A in Ref xx shows an elongated flat piece of material, strip 501. The "generatrix" lines 503 that show the form of the strip, along the whole length of the strip, are "parallel" to each other. For example, generatrix 507 anywhere at the right end of the strip is parallel to generatrix 509 at anywhere else along the length of the strip as well as at the left end of the strip.

The sketch in FIG. 41-B in Ref xx shows a "twist". We start at the right end 511 of the strip, in a similar position as in the sketch in FIG. 41-A in Ref xx. We will say that the strip at this end is in plane 513. Then we deform the strip for a certain length, and end up at the left end 515 of the strip, where the material now lays in a new plane 517. We will call this new plane, plane 517. We can see two things. First, plane 517 makes an angle "Theta" 519 with plane 513. Second, we see that the generatrix 523 is not parallel to generatrix 521 anymore. Generatrix 523 lays in plane 517 and generatrix 521 lays in plane 513. Thus the angle between generatrix 523 and generatrix 521 is the same "Theta" angle 519, that is the angle between the two planes. The transition between the right end 511 of the strip and the left end 515 is what I call "twist" 525.

The sketch in FIG. 41-C in Ref xx shows a "fold" 531. Here the generatrices are always parallel to each other, regardless of how much we fold the strip.

The sketch in FIG. 42-A in Ref xx shows a strip 541 that starts flat 543, and then it is twisted 545 and then folded 547.

The sketch in FIG. 42-B in Ref xx shows a strip 551 that starts flat 553, and then it is folded 555 and then twisted 557.

DESCRIPTION

BACKGROUND OF THE INVENTION

Field of the Invention

The invention generally relates to high-density interconnections between electronic devices and components.

The invention relates more specifically to what is referred to as "permanent" interconnections, which include solderable interconnections, and/or mounting of electronic components on boards or on substrates, or on other electronic components and the like.

It provides interconnection elements, called leads or legs or contacts, to such components and it covers the shapes and orientation of these leads, to enhance the performance of such components, especially when these components are part of electronic systems that are exposed to harsh environment, such as temperature cycling and fluctuation.

The present invention covers in particular interconnections between "lead-less" electronic components and boards and/or substrates, or between similar lead-less components.

The specification utilizes many of the definitions and items described in the referenced patent applications.

General Background and Prior Art:

In the case of leadless electronic components, like the BGAs and the LCCCs, it has been known that soldering such components directly to substrates or to PCBs is not the right thing to do. It can lead to premature failure of the interconnecting joints. This is especially true, when the component is relatively large, i.e. approx. ¼ inch or larger on the side, and when the material of the component is different than that of the substrate, e.g. when the component is silicon or ceramic, while the substrate is FR4, and when the temperature can vary considerably during the operating life of the assembly.

The problem results mostly from exposing electronic assemblies to varying temperatures, such as thermal cycling or power cycling, or simply from being exposed to harsh environment, including hot and cold temperature environment. This is especially true, when the component is relatively large, when the material of the component is different than that of the substrate, and with different TCEs, i.e. with TCE Mismatch, and when the temperature fluctuates considerably and frequently during the life of the assembly.

For this reason, several designs have been proposed in the past to counteract the unfavorable effect of such conditions. For example, the inventor, Gabe Cherian, together with other co-inventors, had invented, back around 1982, what was called "CCMD", Chip Carrier Mounting Device, which was later called "Solder Quick" or "Solder Columns" or "Cherian Columns". This is covered by U.S. Pat. Nos. 4,664,309, 4,705,205 and 4,712,721. Other attempts have been made by other inventors, which were more or less successful. And finally, the inventor came up with the No-Wick™ concept mentioned in the Refs.

The additional problem nowadays is the fact that many of the components are being miniaturized. The center distances between contact pads are getting smaller and smaller, and the old inventions can no longer keep up with such miniaturization. For example, BGAs have center distances down to 0.020" (approx. 0.5 mm) and when we consider Chip Scale Packaging, the center distances can be even smaller. The Cherian Solder Columns were originally designed and built to work with 0.050" (approx. 1.25 mm) center distances. Cherian Solder Columns cannot readily be simply scaled down to size. For this reason, I created two new inventions. The first is the No-Wick™ concept mentioned in the Refs. The second is the TFCC and the SWCC inventions described in the present patent application as will be described here below.

Prior Art

There is a lot of prior art in this field. Several designs have been proposed in the past to counteract the unfavorable effect of the above mentioned conditions.

In my "mother" patent applications, which are referenced above, I have listed a few important prior art documents. Please refer to them.

OBJECT & PURPOSE OF THE INVENTION

The purpose of this invention is to solve the problems resulting from exposing electronic assemblies to varying temperatures, such as thermal cycling or power cycling, or simply from being exposed to harsh environment, including hot and cold temperature environment or to excessive stresses due to shock and vibration, and especially if there is a TCE mismatch between the joined components.

The general object of the invention is to introduce certain changes and/or improvements in the way Integrated Circuit (IC) Packages known as BGAs, Ball Grid Array Packages and other similar leadless devices and chips, and assemblies that incorporate such packages and/or chips, so that they become more reliable and can better withstand the above undesirable effects of thermal cycling and power cycling. The same proposed changes would also make such assemblies, more reliable and would enable them to better withstand stresses induced by shock and vibrations.

Another object of the present invention is to provide means to reliably mount leadless electronic packages or components, such as a BGA on Printed Circuit Boards (PCBs), or chips on substrates, especially to withstand any undesirable effect of TCE Mismatch, or the effects of Thermal Cycling and/or Power Cycling.

A further object of the invention is to provide improved interconnections and mounting means for Integrated Circuit Chips and Packages, to make such assemblies more reliable and to better withstand stresses induced by thermal effects and by shock and vibrations.

The means include providing "columns or legs or contacts" between the chip or the package and their carrying base, i.e. a PCB or the like, to provide a "buffer" zone, where the columns would act as flexible joints, to absorb these undesirable effect of TCE Mismatch, or effects of Thermal Cycling and/or Power Cycling.

A special object of the invention is to accomplish all the above, especially for High-Density devices, i.e. devices with small center distances between their contact points.

A corollary result is that we can convert any "leadless" package or device to become a "leaded" one. So for example, a leadless BGA could become similar to a Pin Grid Array Package.

In addition to all that, is the fact that we do all this in a way, such as to control the flow of solder along the stem of the columns, so as to maintain the flexibility of the columns.

Yet another object is to reinforce the assembly against severe shock and vibrations, by providing an "anchor" between the components of the assembly.

One last, but not least, object is to design and prepare the TFCC in a way, so as to facilitate the manufacturing of the device and the handling of the flexible contacts, thus to render the whole assembly process more practical and more economical.

To summarize, the main goal and the advantage of the proposed changes and improvements are to provide leads, that are flexible, and to make the leads more yielding, thus requiring less force to hold them in place at their anchor points in the body of the package. This translate itself into a situation, where the solder joints between the devices and the PCB, would be less stressed, thus less apt to crack or to reduce the occurrence of those undesirable solder joint failures, thus prolonging the life of the electronic systems which contain these chips, packages and the like. In short, this translates into improving the reliability of the electronic assemblies and systems. A corollary resulting advantage is that the interconnections between the package and the substrates would last longer and the whole system would be more reliable.

ONE ADDITIONAL BENEFIT WITH SHOCK AND VIBRATIONS.

If we look at a standard DIP package, we notice that the leads are in two rows of leads, where the leads are all oriented orthogonally in the same direction. If the package is subjected to shock or vibrations that are concentrated in a certain direction, then the package will withstand the resulting stresses, depending on the relation between the direction of the shock and vibration and the direction of the leads. This is because the stiffness of the leads is high if we stress the device across the edges of the lead, and the stiffness is low across the face of the leads. We have explained that way early at the beginning of the application. So, if the direction of the shock and vibration is in a generally favorable direction with respect to the direction of the leads, then the package will withstand the stresses well. On the other hand, if the stresses are in an unfavorable direction, then the package may fail.

However, if the leads were oriented as per the present invention, where different leads would have different angles with the axes of the package or device, then the stiffness of the leads would be more evenly distributed, and the package may fare better regardless of which direction the shock and vibrations are coming from.

This is roughly what I am trying to show by the sketch in Ref3, page PP-D-106.

SUMMARY OF THE INVENTION CONCEPT and OBJECTIVES

The invention intends to:

Provide "Flexible Leads" to interconnect electronic packages to printed circuit boards or substrates.

Make the leads with a rectangular cross-section, such that the small thickness (T) will be flexible with less stiffness than the width of the cross-section (W).

Place the leads with elongated or rectangular cross-sections, in an orientation, such that the more flexible section of the leads column would be in the direction of the largest thermal expansion or contraction. This translates into orienting the faces of the columns towards the thermal center of the package or the assembly.

At least the following two main changes are being introduced:

First, we are introducing a device, which we call TFCC, Thermal Flex Contact Carrier, which would provide flex contacts, or legs or leads if you will, to leadless IC devices, so that these leads would be attached to Printed Circuit Boards (PCBs) or the like. These would in essence convert leadless devices into leaded ones.

Second, we are proposing to change the "ORIENTATION" of these leads, so that they would have their most flexible face, orientated towards what I call the "THERMAL CENTER" of the package. (I explain this later in the Specifications).

We also propose similar changes for Ceramic & Cerdip packages, as well as any other packages or even chips.

SUMMARY OF THE INVENTION

Two groups of products are covered in the present application. They both have similar common purposes and objectives, but they accomplish that in slightly different ways.
1. The TFCC, and
2. The SWCC.

GROUP 1—THE TFCC

Summary of the Concept:

A very important feature in this invention is the way the TFCC is manufactured. It is made in a way whereby a large number of the contacts/legs are produced out of one "blank" sheet and the individual contacts stay attached to that sheet until they are attached to the devices that they are intended to work with ultimately. This makes it easier and more economical to handle the contacts and to go through the manufacturing and the final assembly processes.

An additional feature is that we can "orient" the columns in a way to reduce their resistance to bending, thus improving even further their effectiveness in reducing the stresses on the solder joints and prolonging the operating life of the assemblies and the electronic systems.

The original basic concept of the No-Wick™ is to control the flow of solder, so that the solder stays at and/or near the joints between the column ends and the electronic components. The solder should not flow away from the column ends, and should not migrate and stick to the stem of the column. If it does, then the column will be thicker and less flexible. If this happens, then we would reduce the benefits of having slender and flexible columns as the connecting element, and we could go back and have premature failures of such assemblies. So, this No-Wick™ concept can be incorporated in the above and has been included in the present inventions as well.

An additional feature is to have the columns curvilinear.

Usually the columns are straight and generally perpendicular to the devices. We will refer to their general direction as the Y-direction or the Y-axis. We will refer to the general direction of the devices as the X-direction or the X-axis. This would include the whole plane of the devices. The columns Y-direction is perpendicular to the device's X-direction. The straight columns will provide relief in one direction, namely the X-direction; but not the vertical direction, i.e. not the Y-direction. As a result, relatively large assemblies may have the tendency to warp under severe thermal conditions. This condition could be compared to that of a bi-metal strip that would bend under varying temperature conditions.

But if the columns are curvilinear, ever so slightly, they may provide some flexibility along their general Y-axis as well, which would be generally perpendicular to the components. This would reduce this tendency of the devices to warp.

However, since the center distances are small, and space is tight, we cannot have the columns curved haphazardly. They would either take too much space, or if we try to place them closer to each other, they may touch and short. So, the suggested solution is to have the columns "parallel nested", and to have their curves and shapes such that they would allow such parallel nesting. (See Ref4 for more details on the subject of parallel nesting).

To repeat: The third key concept of the invention is to "CONTROL" the solder flow along the column, so as to ensure that there will still be some amount of flexibility in the column, after all the soldering/joining operations have been completed.

Finally, the concept of the "anchor", which reinforces the assembly and protects it against severe shock and vibrations.

The present invention offers several solutions. They could all be grouped under the rubric of "Micro-Columns" and "Controlled Soldering" or "Controlled Wettability" or "Oriented Columns" and "Reinforcing Anchor".

"Micro", because they are small, especially in their diametrical size or girth, so that they can be installed on small center distances. And "Columns" in particular, because columns would improve the reliability as compared to direct soldering or to the use of solder balls. By the way, I will frequently refer to these "Micro-Columns" simply as "Columns" for short.

The columns need not be too tall. They could be relatively short, but they also need to have a small diameter or girth or cross-section. The important thing is their L/D ratio. See Ref3, page MC-D-7. It is desirable to have the largest L/D possible. The reason is the following. If L/D is small, i.e. the solder joint is short and fat, then the prevalent stressing action in the joint is "shear". If L/D is large, i.e. the joint is tall and slender, and then the prevalent stressing action changes and becomes a "bending" action. If the thermal conditions create a certain amount of linear motion at and across the joint, and we try to accommodate that motion, by stressing the joint under "bending", i.e. by flexing the column say, then the bending stresses will be relatively small. But if we have a short joint, the motion will be essentially trying to shear the joint, because in essence we would be asking that the package would slide with respect to the board. This would create what is called shear stress. The shear stress for the same amount of linear motion would be tremendously much higher than the bending stress for a comparable amount of linear deflection. Such high shear stresses are the major cause of the premature failure of such joints. All this was explained in the three papers, by the inventor et al, Reference A-4 through A-6, listed under "Additional Literature References" at the beginning of this application. The problem was originally solved and taken care of by the inventions described in the three U.S. Patents, by the same inventor et al, listed earlier in the section on Prior Art.

Please note again that with solder balls, the resulting solder joints have very small L/D. This is very undesirable from the point of view of the stresses and it is the main cause of premature failure of such assemblies.

Now, if we try to minimize L/D by keeping L as short as possible, and because of the well-known "surface tension" of solder, it is important and desirable to control how far the solder will wick up the length/height of the column. Hence, "Controlled Soldering" or "Controlled Solderability", because there will be some means to control the migration of the solder from the joints and to prevent the solder from flowing to the center (stem) of the columns.

"Controlled Wettability" because the proposed solutions are not limited to "solder" only, but they can be applied to other joining materials.

And finally, "Oriented Columns" because if we use columns with elongated or rectangular cross-sections, then we can orient the columns in such a way that their flat wide faces will be facing in the general direction towards the center of deflection of the assembly, which can be assumed most of the time to be the geometric center of the device. I have explained that in details in my patent application No. 10/075,060, filed Feb. 11, 2002, entitled "INTERCONNECTIONS", now U.S. Pat. No. 6,884,707 issued Apr. 6, 2005 and in my patent application Ser. No. 10/937,647, filed Sep. 8, 2004, entitled "INTERCONNECTIONS", now U.S. Pat. No. 7,196,402 issued Mar. 27, 2007.

There are many ways to accomplish these above objectives and features. Some of them are described here in this invention specification and drawings.

To recap, the concept attempts to do the following:

Provide a "Column" (tall and slender) to interconnect the chip to the substrate, or the package to the board or similar assemblies.

Carry a large group of these columns on/in one wafer, so as to minimize handling.

Make the columns out of the carrier, which in turn is made of a composite structure, so as to minimize manufacturing processes and costs.

Make the column slim and slender (small cross section or girth) and ideally with a rectangular cross-section, such that the small thickness (T) will be more flexible and with less stiffness, than the width of the cross-section (W).

Orient the columns in a way to reduce their resistance to bending, when the system is exposed to thermal fluctuations.

Make the column such that the solder can wick only to a limited distance along the length of the column, leaving enough length of column to act as a flex joint.

The columns could be arcuate and could be "parallel nested".

There could be an anchor provided to reduce the stresses on the columns, in case they get exposed to excessive shock and vibration.

There will be a few other details offered. They will all be described down below.

DESCRIPTION OF THE PREFERRED EMBODIMENTS

While the invention is susceptible of various modifications and alternative constructions, certain illustrative embodiments thereof have been shown in the drawings and will be described below in detail. It should be understood, however, that there is no intention to limit the invention to the specific form disclosed, but, on the contrary, the invention is to cover all modifications, alternative constructions and equivalents, falling within the spirit and scope of the invention as defined in the claims.

While I am describing the drawing in more details, I will at the same time explain the technology basis of the invention. I will also include a number of examples in this section, which should be considered as part of the embodiments for the purpose of this application as well.

This description covers more than one invention. The inventions are based partly on the same technology platform, but then each of the inventions has some additional features of its own. Not being an expert in handling patents, I would like to leave it to the patent examiner to decide on the number of the inventions contained and how to split one invention from the other.

BRIEF DESCRIPTION OF DRAWINGS

FIGS. 1 through 6 explain the basics of the whole concept.

FIGS. 7 through 11 show the proposed five major steps needed to manufacture the combined BGA pad and TSOP-Gull-wing contacts, called TFCC, in a single package carrier.

FIG. 12 has been cancelled.

FIG. 16 is a duplicate of FIG. 14 and it is being cancelled.

FIGS. 20-A and 20-B and 21 show a number of views of the TFCC, by itself and with a BGA.

FIGS. 32-A and 32-B have been cancelled.

FIGS. 33-36-C1 and 33-36-C2 show more details of the moats and the etching around the "pads".

FIGS. 37-A through 37-D show the different manufacturing steps, described for FIGS. 7-11.

FIGS. 38-41-C1 and 38-41-C2 and FIGS. 42-ABCD-C1 and 42-ABCD-C2 show more details of the etching that need to be done on the flex sheet of the TFCC itself.

FIG. 44-A and 44-B show a study of the relation between the pitch, the pad diameter, the width of the moat, and the left-over length of the leg.

FIGS. 55 through 57 have been cancelled.

FIGS. 59 through 64 have been cancelled.

FIGS. 65-A, 65-B and 65-C show three individual drawings, which are reproductions of drawings in the website of "Triaxial Structures, Inc." Company. The top drawing shows a woven cloth with copper wire going up and down, through the cloth and then at the surface of the cloth. The bottom drawing shows the same cloth, after it has been worked on, to accomplish a special purpose.

FIG. 66 shows a clever use of the Triaxial woven cloth product.

FIGS. 67-A-1, 67-A-2, 67-B-1 and 67-B-2 show an example of the "SWCC IN PCB".

FIG. 68 shows a drawing of a prototype of a contact carrier made of soluble solder mask material.

DETAILED DESCRIPTION OF DRAWINGS AND PREFERRED EMBODIMENTS

FIGS. 1 through 6 explain the basics of the whole concept.

We would like to refer to the attachment device, as the "TFCC (TM)", or simply the "TFCC" for short, and when the No-Wick (TM) feature is incorporated, then as the "No-Wick (TM) TFCC", or the "NWK (TM) TFCC". TFCC stands for "Thermal Flex Contact Carrier". And "No-Wick (TM)", or "NWK (TM)", or simply "NWK", because it does provide a similar performance as the "No-Wick (TM)" Columns, covered by the referenced patent applications listed above.

The TFCC consists of a multi-layer film or sheet, which will be prepared so as to have individual contact elements shaped and located so that one end of each contact element will be attached to its respective contact pad on one of the devices to be attached, say the BGA, and the other end of the contact element would be attached to the corresponding pad of the other device, say the PCB.

Concept Model of "Thermal Flex Contact" (TFC) and "TFC Carrier" (TFCC)

Figure 1:
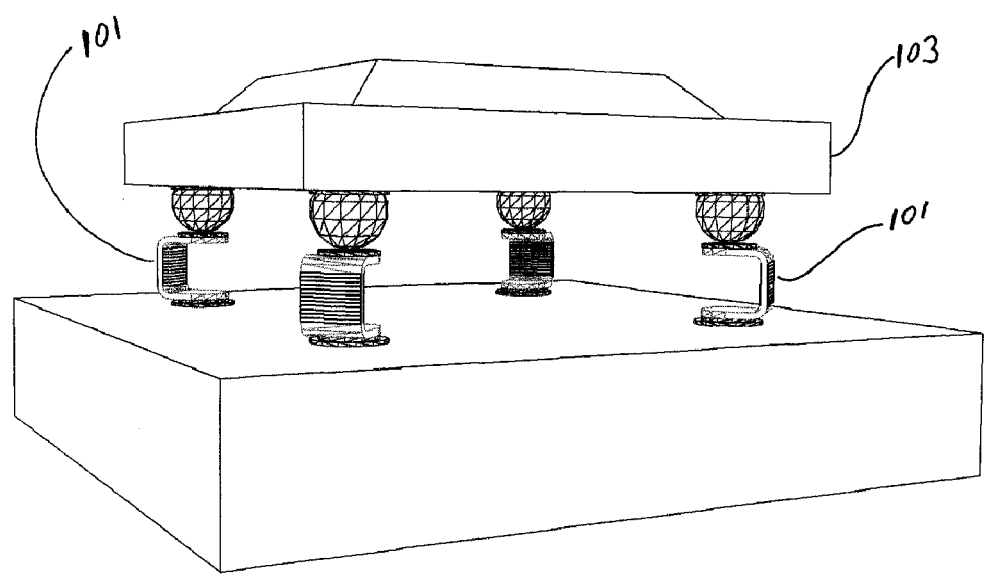

The model in FIG. 1 shows the location and the function of "Thermal Flex Contacts" (TFC) s, ref # 101, that may be assembled discretely or packaged in "TFC Carrier" (TFCC), clip that will enable standard and generic BGA type packages, ref # 103, to be used in assemblies that are expected to be exposed to harsh environment or extreme temperature cycling conditions.

The model shows a parallel and 1 to 1 pad/ball foot print. However, smaller toe angled type foot prints particularly on the PCB pads may prove more robust and manufacturable and thus are covered by this present patent application.

FIG. 2-A shows an exploded view of: a BGA (Item-1, ref # 201,) over four TFCs (item-2, ref # 203,) over four printed solder paste bricks, ref # 205, or attachments pads (Item-3, ref # 207,) over a portion of a PCB (Item-4 ref # 209,).

FIG. 2-B shows the same components in FIG. 2-A assembled prior to reflow. Note solder paste, ref # 211, and ball, ref # 213, have not settled.

Figure 3:
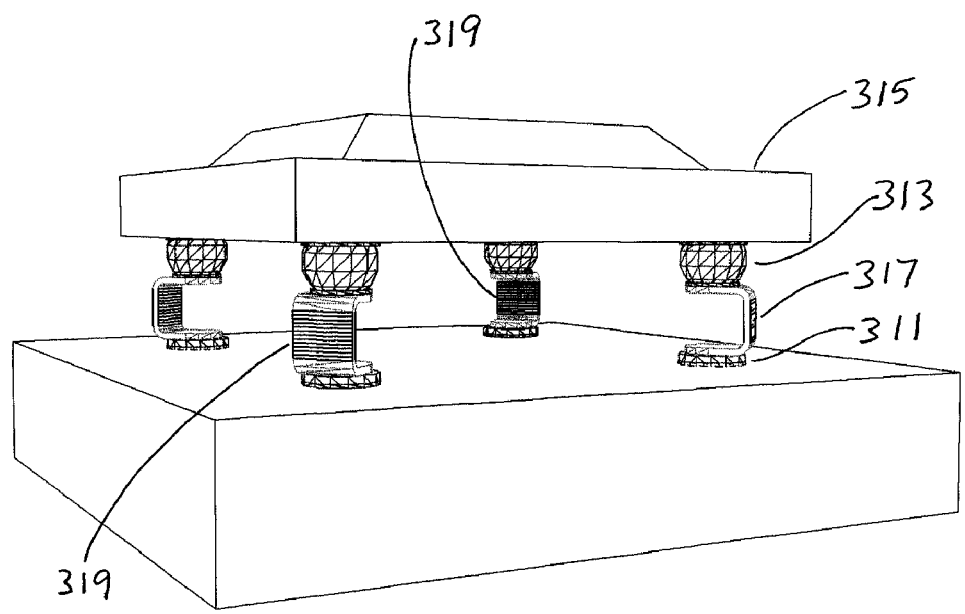

FIG. 3 shows the same components in FIG. 2-A and 2-B assembled and reflowed. Note solder collapse, ref # 311 and ref # 313, and partial settling of the BGA, ref # 315, onto the TFCs, ref # 317. The dark images, ref # 319, along the vertical portions of the TFCs and other portions of the components represent solder mask, which are coating the BGA substrate, the TFC vertical section and the PCB.

Thermal Flex Contact Carrier Clip:

FIGS. 4-A and 4-B show the concept models representing a clip-on BGA carrier, ref # 411, that locates each individual TFC in X, Y, and Theta, as well as presents it under the BGA, ref # 413, for Z settling during the reflow process. With the collapse of the BGA ball, ref # 415, during soldering, the coplanarity variations inherent in the TFC design and manufacturing as well as that of ball size variations and other board/package variables are compensated and therefore not an issue.

Figure 5:
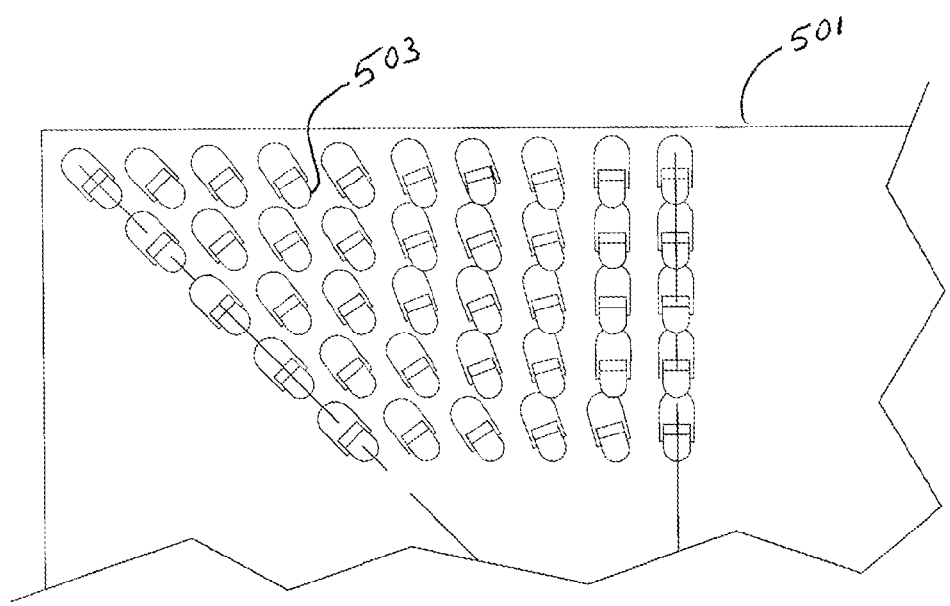

FIG. 5 shows a portion of a clip-on BGA carrier, ref # 501. Individual TFC ref # 503, orientation and location is Cad defined and maintained by the processing or construction of the carrier. Possible construction may consist of photo developed mask/plating surfaces, laser cutting of shapes and locations, contact forming, and subsequent cutting and masking processes. Note the foot print of the contacts, ref # 503, represents a near 1 to 1 of the pad of the PCB, which is limited at ball density of 0.8 m or 0.031". Therefore a TFC with a smaller pad feature and an angled toe configuration will not only enable smaller density packages, but may lend itself to simpler and more robust designs by enabling better individual contact compliancy.

TFC concept additions to enable finer pitch and to improve SMT process yield The adaptation of a combined BGA pad and TSOP-Gull-Wing connection concept which is unique in package design is to many the collapse features of a BGA with the compliancy of a gull-wing feature to achieve the benefits of both: 1) not sensitive to joint coplanarity variations, and 2) individual joint compliancy to increase joint life by reducing stress on the solder joint. The realization of these features will be dependent on the solder masking material that will locate the individual "TFC"'s in X, Y, and Theta, but during reflow temperatures will allow Z height "flow" or movement caused by the collapse of the solder ball that will push the TFC down to the PCB pad ensuring a high process yield design.

Additional TFC design modifications may be allowed if required during the TC forming operation that would concave shape the BGA pad surface to enable a better detent alignment of the TFC carrier to ball centers. Actual samples will determine if this additional forming is necessary, improves alignment or affects solder joint quality.

The three figures in FIGS. 6-A and 6-B show three TFC configurations all using the same material/foil thickness of 0.005". Each TFC is for a different BGA pitch package (–0.5 mm, 0-65 mm, and –0.8 mm). The heights H1, H2, and H3, of the TFCs are shown. The pictures show the effects of same thickness for different pitch configurations, that may require modification once modeling and prototyping results can optimize the best design for various material and processes.

Figure 17:
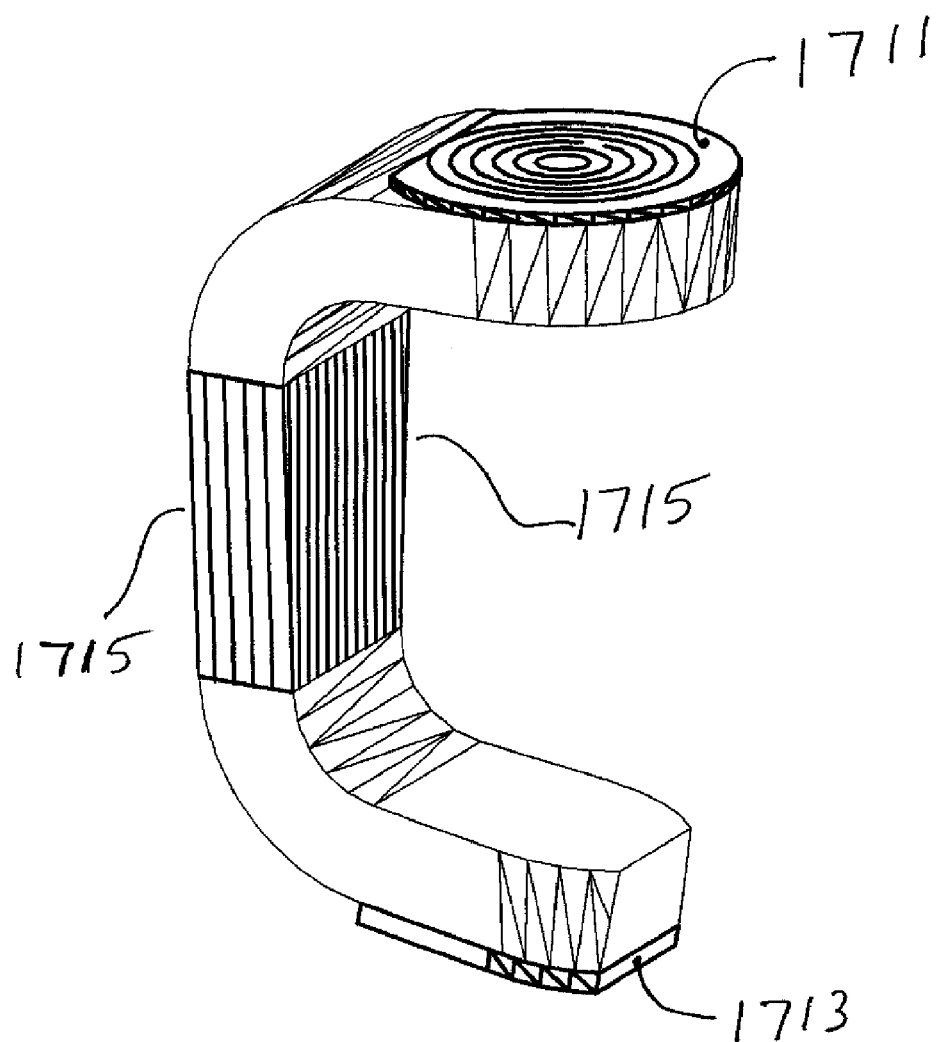
FIGS. 17 and 18 show different possible shapes of the leg.

Please refer to FIG. 17. Note the combination of a BGA type pad on the top, ref # 1711, with a TSOP type compliant lead on the bottom, ref # 1713. The tapering effect merges the two designs into one with the compliancy of flexure occurring in the vertical section, ref # 1715, which will be individually oriented by design and fabrication to enable flexing in the axis of thermal expansion of the individual functional package. Although this will conceptually be oriented perpendicular to the line scribed through the TFC location and the BGA center, in reality some applications may have slightly different thermal expansion signatures and could if desired have a special individual TFC orientated carriers for that application to increase yield.

TFC carriers are designed such that the entire unit can be fabricated from a single Cu foil laminate. The orientation is CAD designed. The electrical separation from the shielding foil is achieved by laser cutting or chemical etching, and the solder masking is selectively applied to dark surfaces shown in the figures, while also bridging the TFC to the shielding foil that is formed into the carrier clip (previously shown). The bridging material should be soft enough to be elastic or flow able at reflow with the ball above and the paste printed pad below. This collapse action will ensure a robust and high yielding process can be achieved with high TFC coplanar tolerances due to thin Cu foil thickness. The collapse action will be minor and more of a diaphragm flexure so that the risk of the TFC shifting in X or Y and shoring out the BGA does not occur.

TFCC Fabrication Proposal

FIGS. 7 through 11 show the proposed five major steps needed to manufacture the combined BGA pad and TSOP-Gull-wing contacts, called TFCC, in a single package carrier.

FIGS. 7-B*ottom*-A, 7-Bottom-B, 7-Top-A and 7-Top-B show cross-sectional views and top and bottom views of the first major step. LPIM is applied to entire bottom area, ref # 721, of TFC carrier, which comprises mainly of the copper sheet, ref # 711 and the masks laminated to it or applied on it. LPIM is also applied on all but moat and bend lines of top area, ref # 723, Then TFC shape is chemically etched out, while being held in location by bottom mask, ref # 721.

In FIGS. 7-B*ottom*-A, 7-Bottom-B, 7-Top-A and 7-Top-B, Next in FIGS. 8 and 9, the solderable areas are to have mask stripped off and HASL or OSP finish applied.

FIGS. 8-B*ottom*-A, 8-Bottom-B, 8-Top-A and 8-Top-B show the areas where the mask will be removed to allow these areas to be solder coated. These areas are area, ref # 823, to become the contact pad under the BGA solder ball or pad, and area, ref # 825, which will become the foot pad of the TFC, which would attach to the substrate pad. Area, ref # 827, could optionally also be solder coated, to provide additional joining capability at the substrate pad. Area ref # 821 would be the only area of the TFC that would have a mask at the top.

FIGS. 9-B*ottom*-A, 9-Bottom-B, 9-Top-A and 9-Top-B show the areas where the solder has been applied. Area ref # 921 becomes the BGA pad area. Area ref # 923 becomes the substrate pad area. Area ref # 925 is the optional additional solder area. Areas ref # 927 and 929 are edge areas which could also be coated with solder, depending on the manufacturing process used to apply the solder in general.

In FIG. 10, the TFC initial bend is formed.

In FIG. 11, the final TFC bend is formed with solder mask and contact solder finish applied.

FIG. 12 is cancelled.

Figure 13:
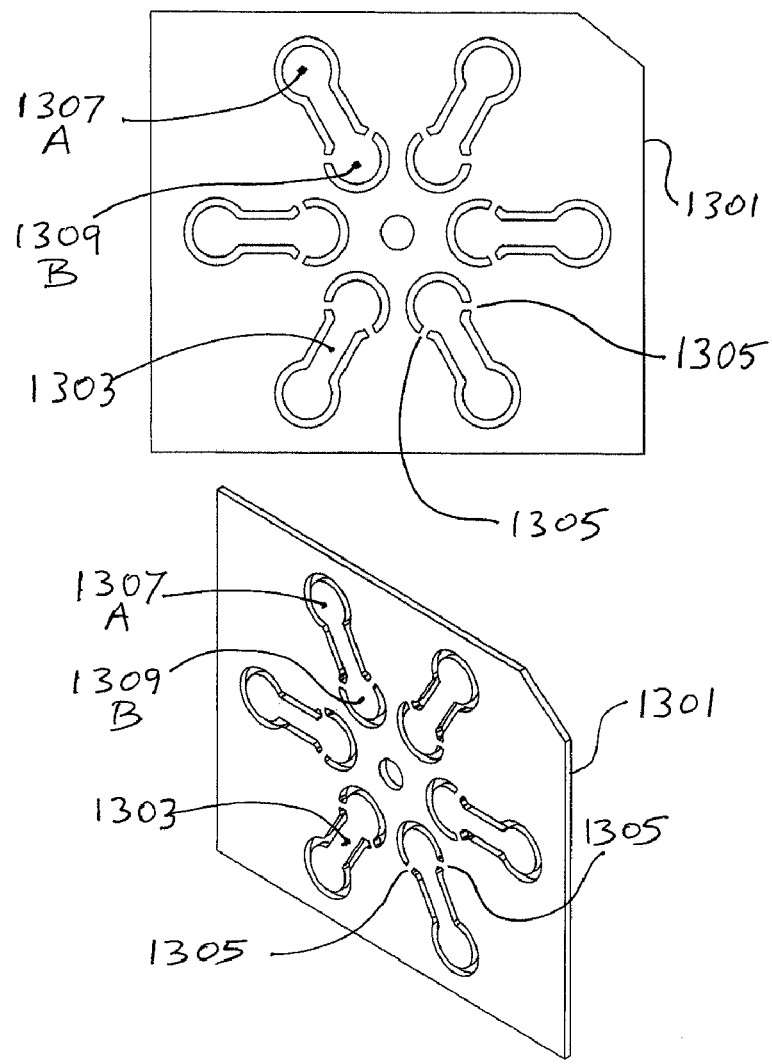
FIGS. 13 through 15 show some 3-D drawings of the concept.
Figure 14:
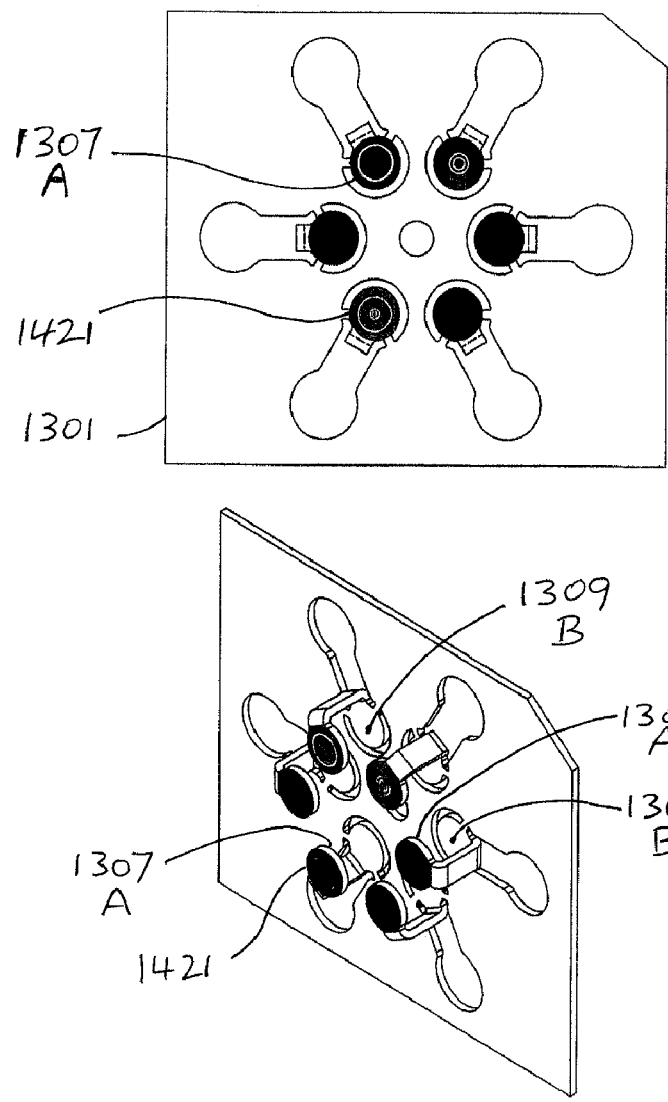
Figure 15:
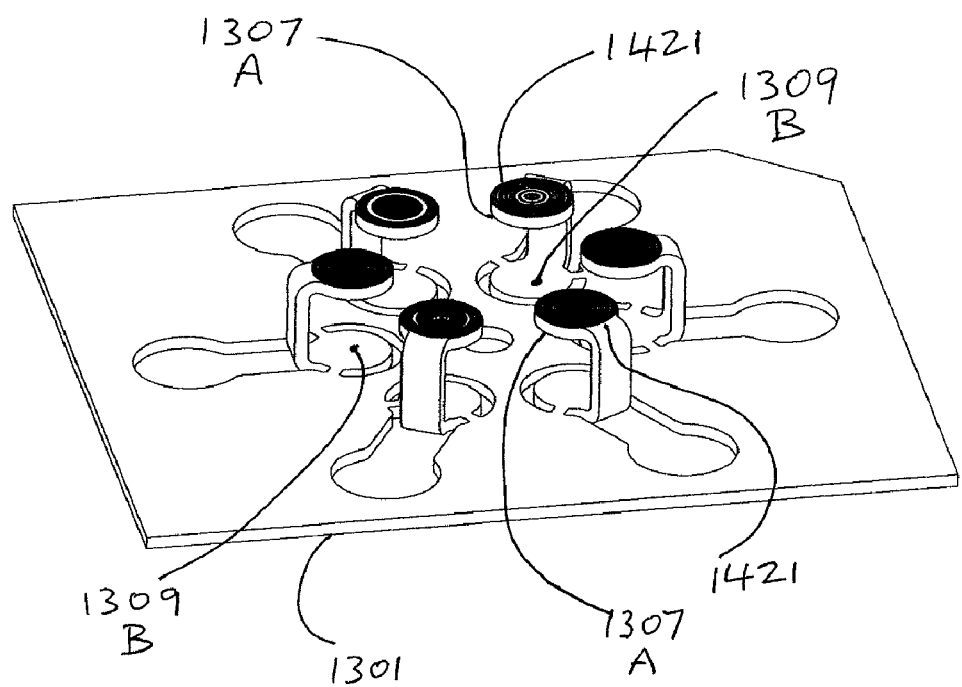

FIGS. 13 through 15 show some 3-D drawings of the concept, where the A-flap has been folded over the B-flap, where the B-flap could be first soldered to one device, say the BGA, and the A-flap would then be soldered to the PCB. It can also be done in the reverse way, i.e. the B-flap could be first soldered to the PCB, and then A-flap would be soldered to the device, say the BGA. We will continue the description here with the TFCC being soldered to the BGA first.

The drawings can be difficult to visualize. To make it easier, the figures are arranged as follows.

FIG. 13-A shows a top view or straight on view of the flat sheet, ref # 1301, with the whole body of the six (6) TFCs, ref # 1303, shown, carved out of the flat sheet, except for the two tabs, ref # 1305, connecting each TFC to the mother flat sheet, ref # 1301. Both flap A, ref # 1307, and flap B, ref # 1309, are still flat in the same plane as the mother sheet, ref # 1301. The connecting tabs, ref # 1305, are attached to flap B, ref # 1309.

FIG. 13-B shows a 3-D view of the same.

Note: The connecting tabs, ref # 1305, in this demo illustration are made out of the same mother sheet, ref # 1301, which is an electrically conductive material. These tabs can be removed at a subsequent operation step. Another way to hold the flaps connected to the mother sheet is to use the masking material, which usually is not an electrically conductive material, as shown in FIGS. 7 through 11.

FIG. 14-A and 14-B show the same sheet of FIG. 13, but after the A-flaps have been folded over as shown. The dark circular areas, ref # 1421, on top of flaps A illustrate the solder coatings on these flaps, but the real reason they are shown here is to make it easier to see these flaps and to differentiate them from the rest of the parts in the picture.

FIG. 15-A and 15-B show a couple of additional 3-D views to help visualize the concept even better.

FIG. 16 is a duplicate of FIG. 14 and it is being cancelled.

Figure 18:
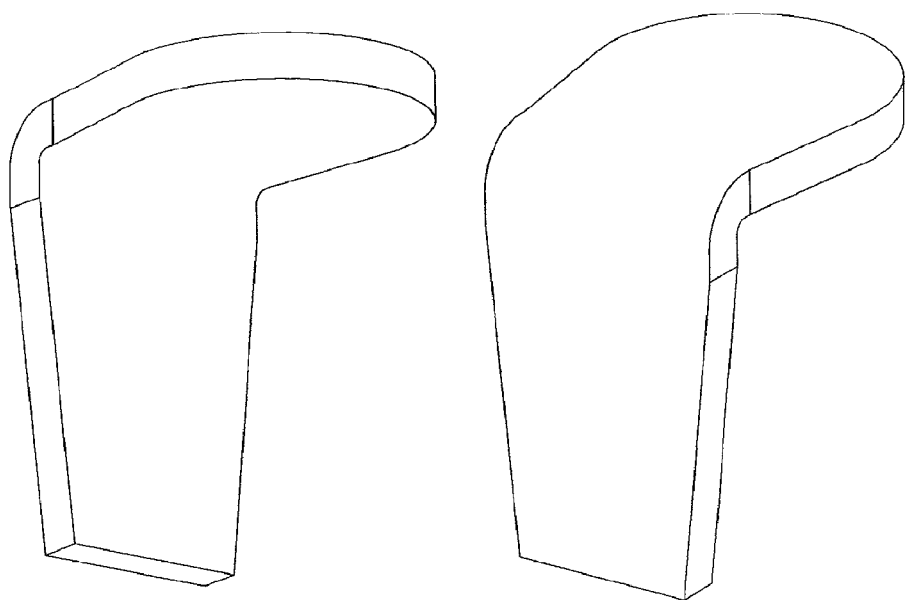

FIGS. 17 and 18 show 3-D views of the leg. FIG. 17 would create a "C"-shape with a flat A-Flap at the bottom, while FIG. 18 ends up without such a flat flap.

Figure 19:
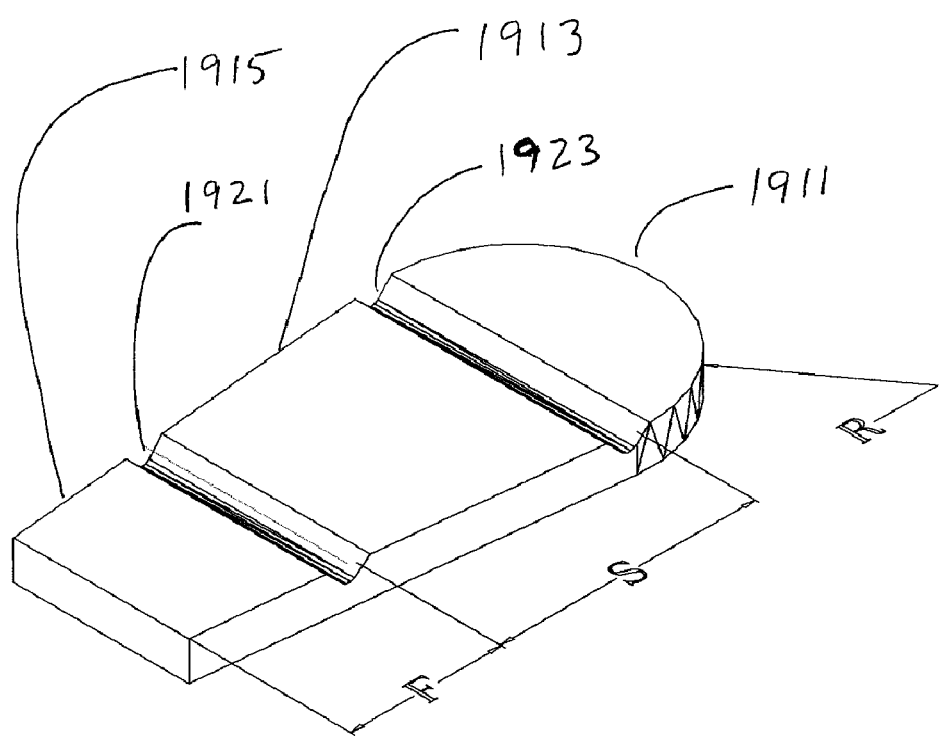
FIG. 19 is a 3-D view of the contact in its flat state.

FIG. 19 is a top view of the contact in its flat state.

The Drawings in FIGS. 20-A and 20-B show a number of views of the TFCC. Notice the anchor, ref # 201, in FIG. 20-B, at about the center of the pattern. In this figure, the anchor is "formed" in the sheet, e.g. by stamping.

Figure 21:
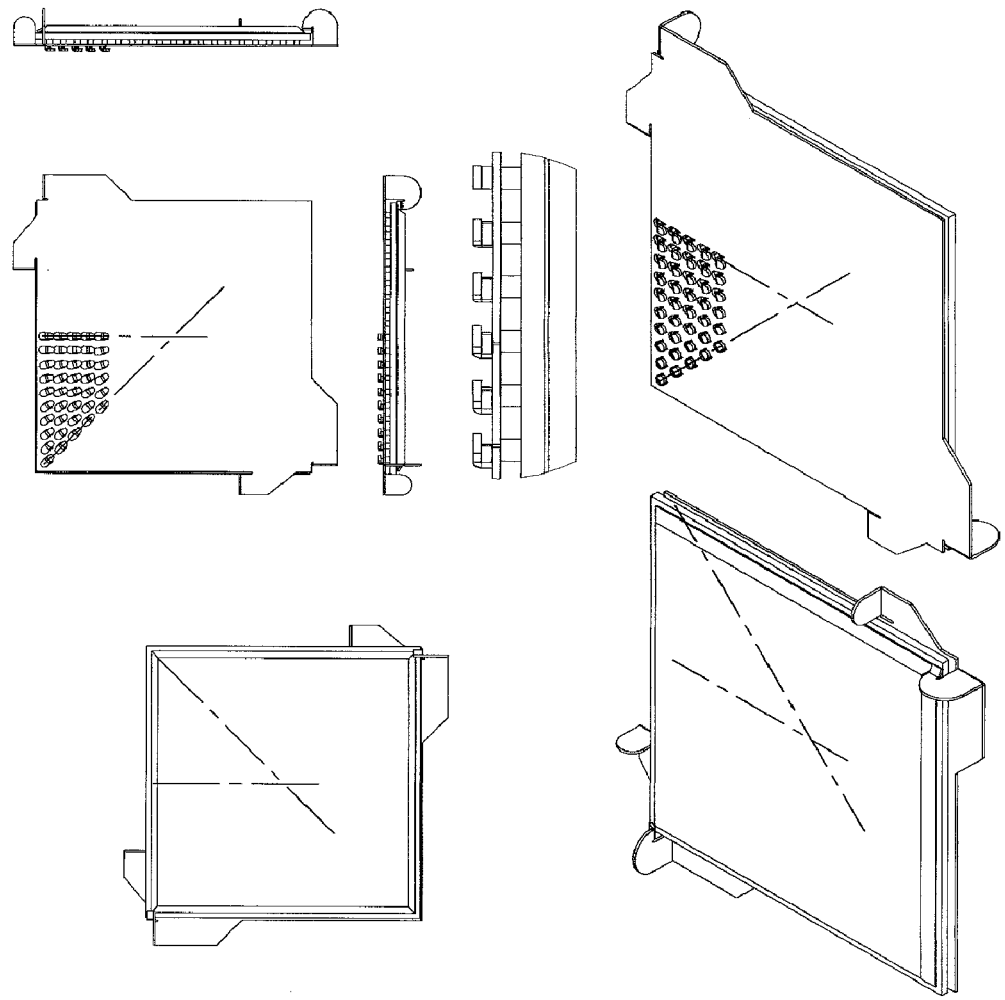
Figure 22:
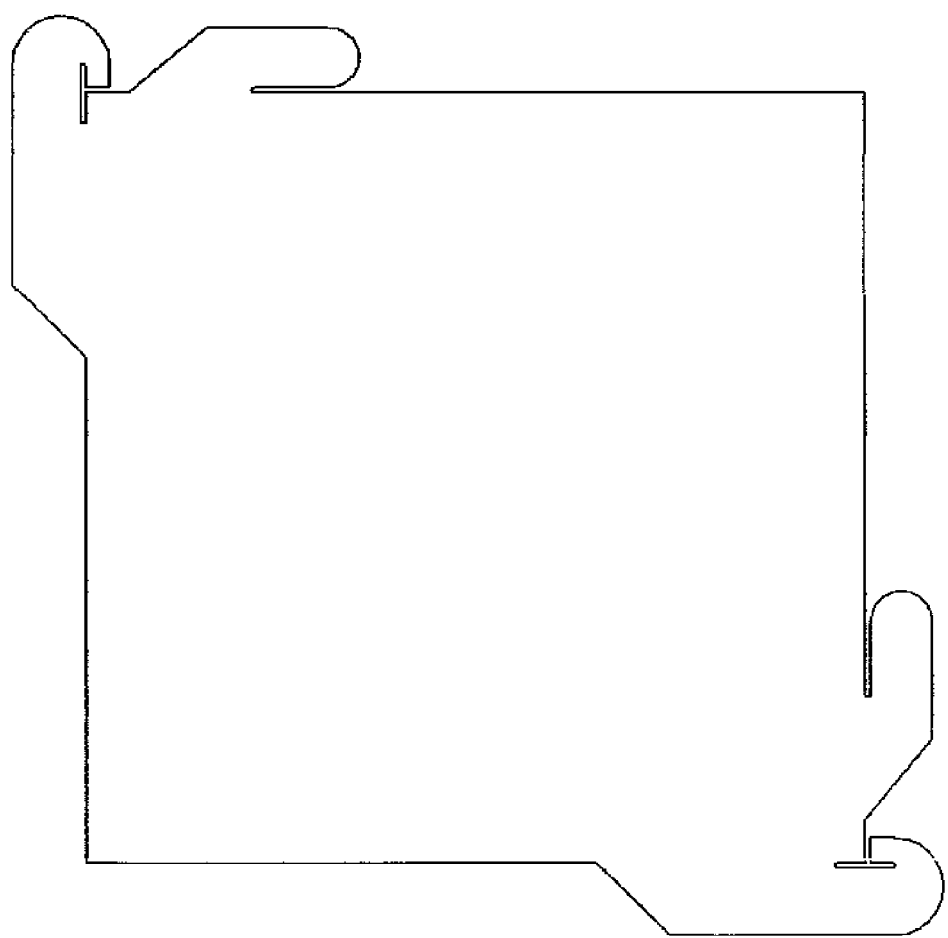
FIGS. 22 through 27 show more details of the TFCC itself.
Figure 23:
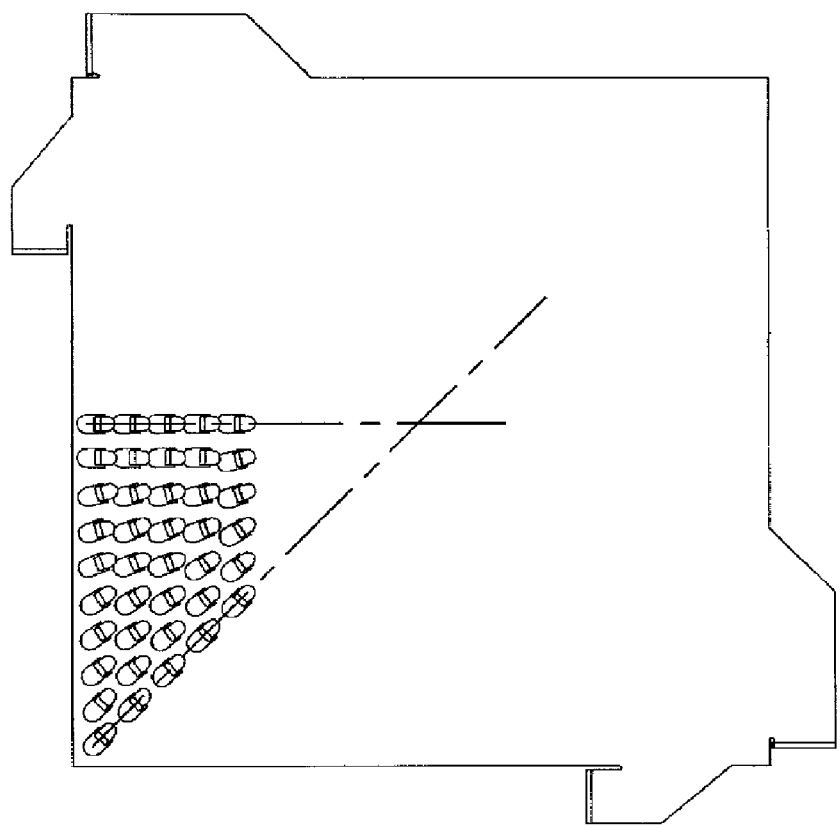
Figure 24:
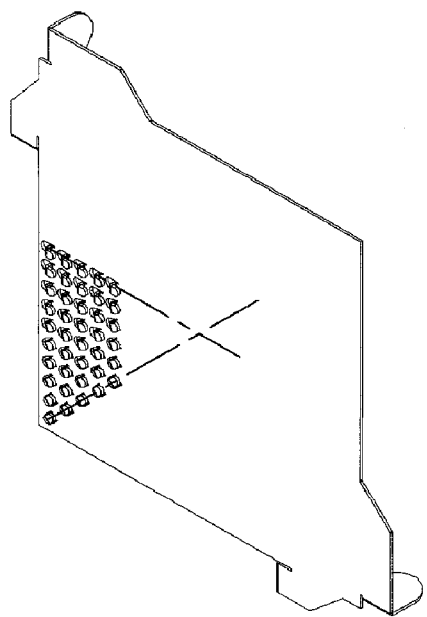
Figure 25:
Figure 26:
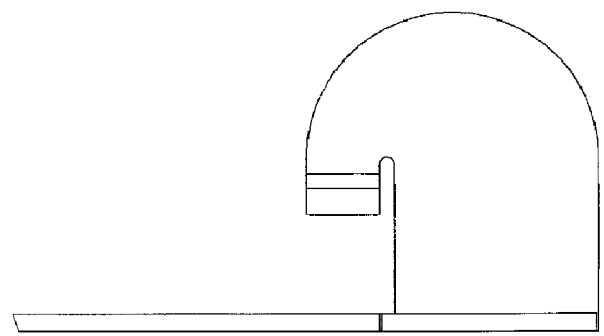
Figure 27:
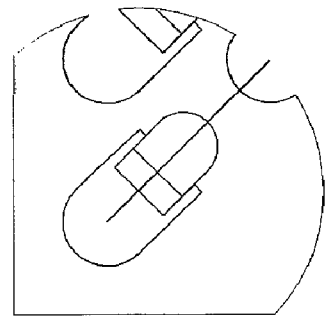
Figure 28:
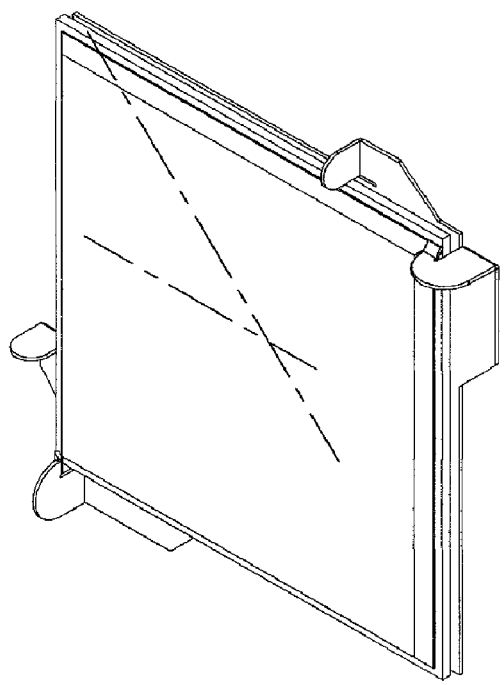
FIGS. 28 through 31 show more details of the TFCC together with a BGA.
Figure 29:
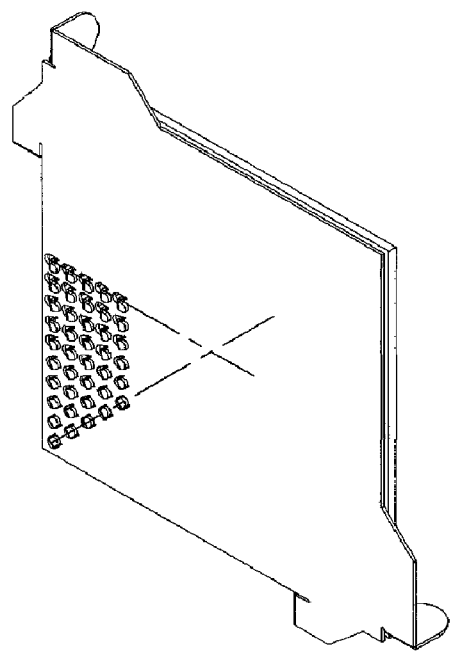
Figure 30:
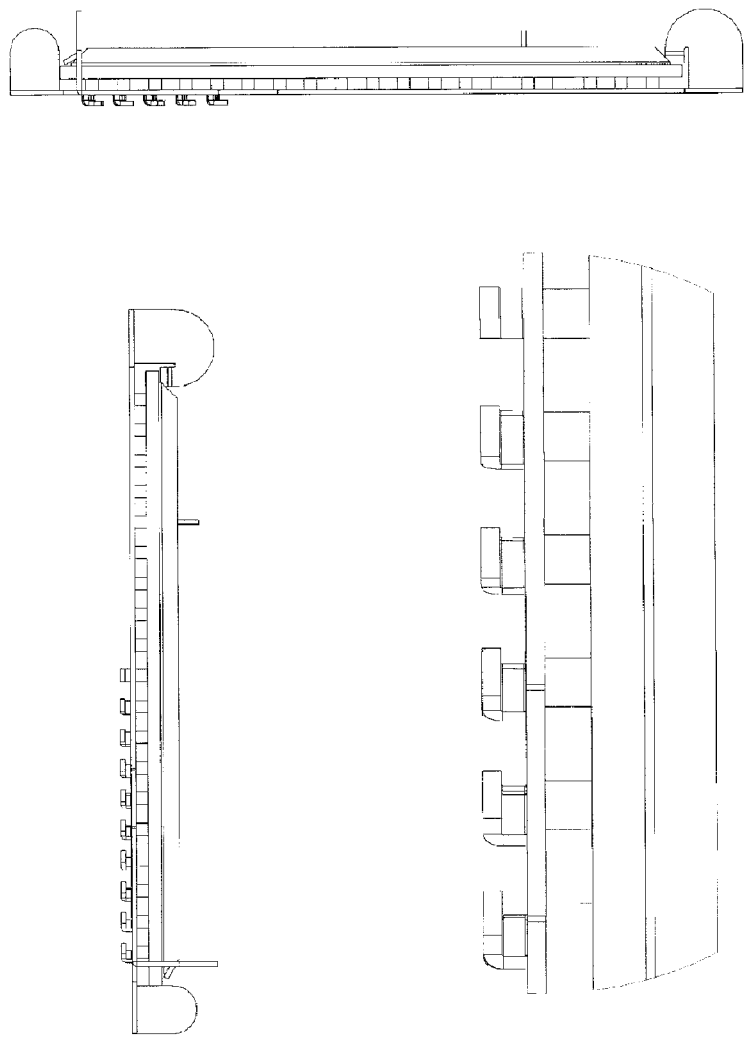
Figure 31:
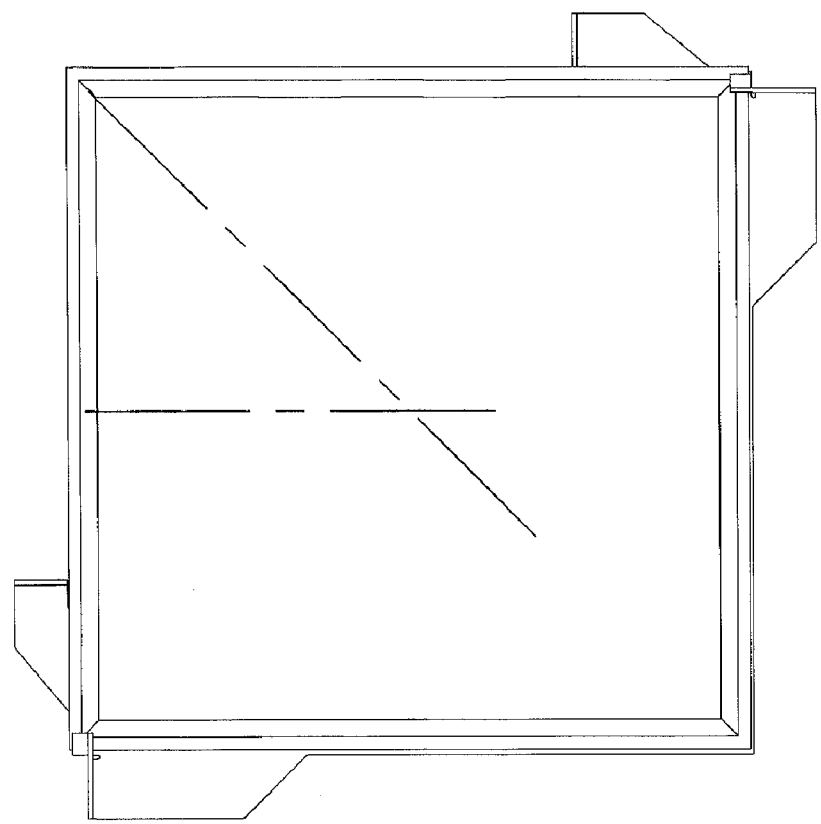

The Drawings in FIG. 21 show a number of views of the TFCC together with a BGA that will be assembled with it. Again, notice the anchor, which could also be an "add-on" afterwards.

FIGS. 22 through 27 show more details of the TFCC itself. See FIGS. 20-A and 20-B.

FIGS. 28 through 31 show more details of the TFCC together with a BGA. See FIG. 21.

FIGS. 32-A and 32-B have been eliminated.

FIGS. 33-36-C1 and 33-36-C2 show more details of the moats and the etching around the "pads". Notice that at some points the moats do touch each other. It is important to make sure that they do not encroach on each other too far; otherwise the contacts themselves may get truncated, as will be explained later.

FIGS. 37-A through 37-D show the different manufacturing steps, described for FIGS. 7-11. They show a fairly dense pattern full of contacts on a tight density. For example, FIG. 37-C shows the moat along the stem and tip of the contact of the TFCC. This is where the material will be removed.

FIGS. 38-41-C1 and 38-41-C2 and FIGS. 42-ABCD-C1 and 42-ABCD-C2 show more details of the etching that need to be done on the flex sheet of the TFCC itself. They progressively zoom in closer to show the details larger and better.

Figure 43:
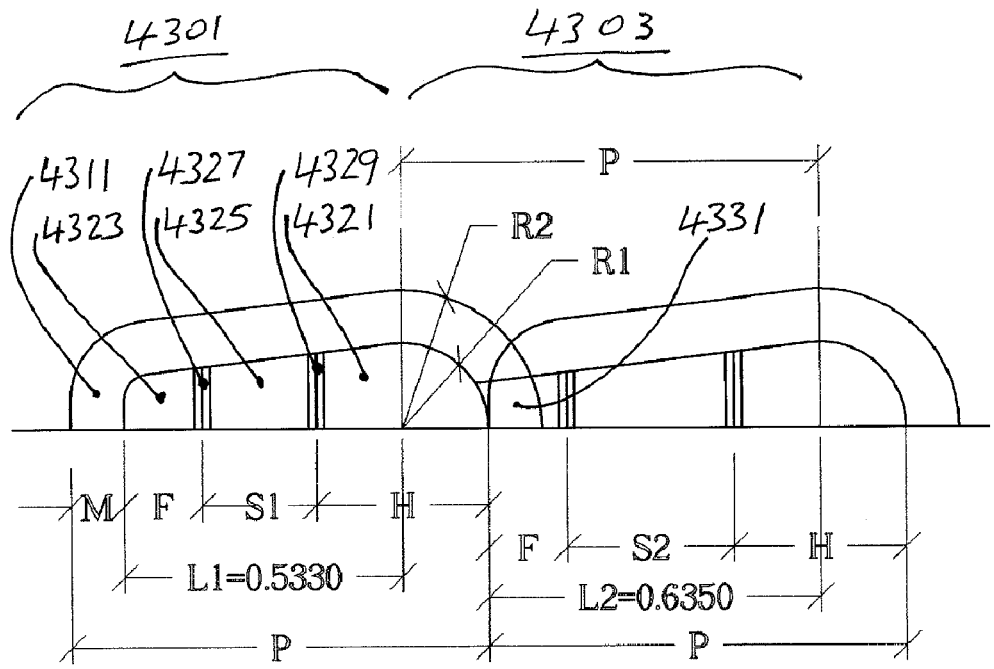
FIG. 43 shows a view of half the profile of two adjacent contacts arranged in a row and in line, one after the other.

FIG. 43 shows a view of half the profile of two adjacent contacts arranged in a row and in line, one after the other. This arrangement would give us the "tightest" or "smallest" room/space to create the contacts. The dimensions were selected to accommodate a BGA with a pitch of 0.8 mm. Since the moat width, M, is governed by the manufacturing process, and assuming that we will remove metal, say by chemically milling the moat or by a laser or stamping operation, then we have to make the moat approximately about 0.1 mm wide.

The contact ref # 4301 on the left hand side of the figure shows a moat 4311 all around it. The remaining material inside the moat can be visualized to make the three major portions of the contact. First is the "Head" 4321 with a length H, which would provide the area to be joined to the BGA pad. Second, the "Foot" 4323, with a length F, provides the area to be joined to the substrate pad. Lastly, the "Stem" 4325, with a length S1, which will be the "column" between the Head and the Foot. The grooves 4327 and 4329 are optional features, to facilitate the bending process. The pitch "P", which is the distance between the centers of the contact pads governs and controls the space available to provide the three major portions of the leg.

As can be seen from left hand side contact in the drawing and from the configuration of the contacts, the length L1 of the "leg" measured from the center of the "pad" turned out to be 0.533 mm, for a pitch of 0.8 mm and using a BGA contact pad diameter of 0.33 mm If we try to make L any longer, then either the moat need to be narrower or the leg would push the moat to encroach on the space of the pad.

If we use a "lancing" operation, where no metal is removed, as illustrated in the right hand side contact 4303 of FIG. 43, then we would not need a moat, which was 0.10 mm wide, at the end 4331 of the contact. This way, we could increase the length "L" of the contact by that same distance, namely by 0.1 mm.

FIG. 44-A and 44-B show a study of the relation between the pitch, ref # 4411, the pad diameter, ref # 4413, the width, ref # 4415, of the moat, ref # 4437, and the left-over length, ref # 4417, of the leg. The total length, ref # 4431, of the leg, ref # 4433, will provide the pad, ref # 4435, the two necks, ref # 4421 and ref # 4423, the stem, ref # 4425, and the flat bottom, ref # 4427.

Ideally, we want the stem, ref # 4425, to be as long as possible.

Also, ideally, we want to have a sizeable flat bottom, ref # 4427.

But, if the dimensions are not cooperating, we can think of at least two alternatives, used either separately or together.

First, we could eliminate the "flat bottom", ref # 4427, of the leg. The leg would then look like the one shown in FIG. 18. Not very desirable, but conceivable/doable. It could work OK, but it could create some problems.

The second alternative is explained below, and it is to force the length "L", or S1 or S2 in FIG. 43, to be larger, but to do some "work-around" to accommodate it.

Figure 45:
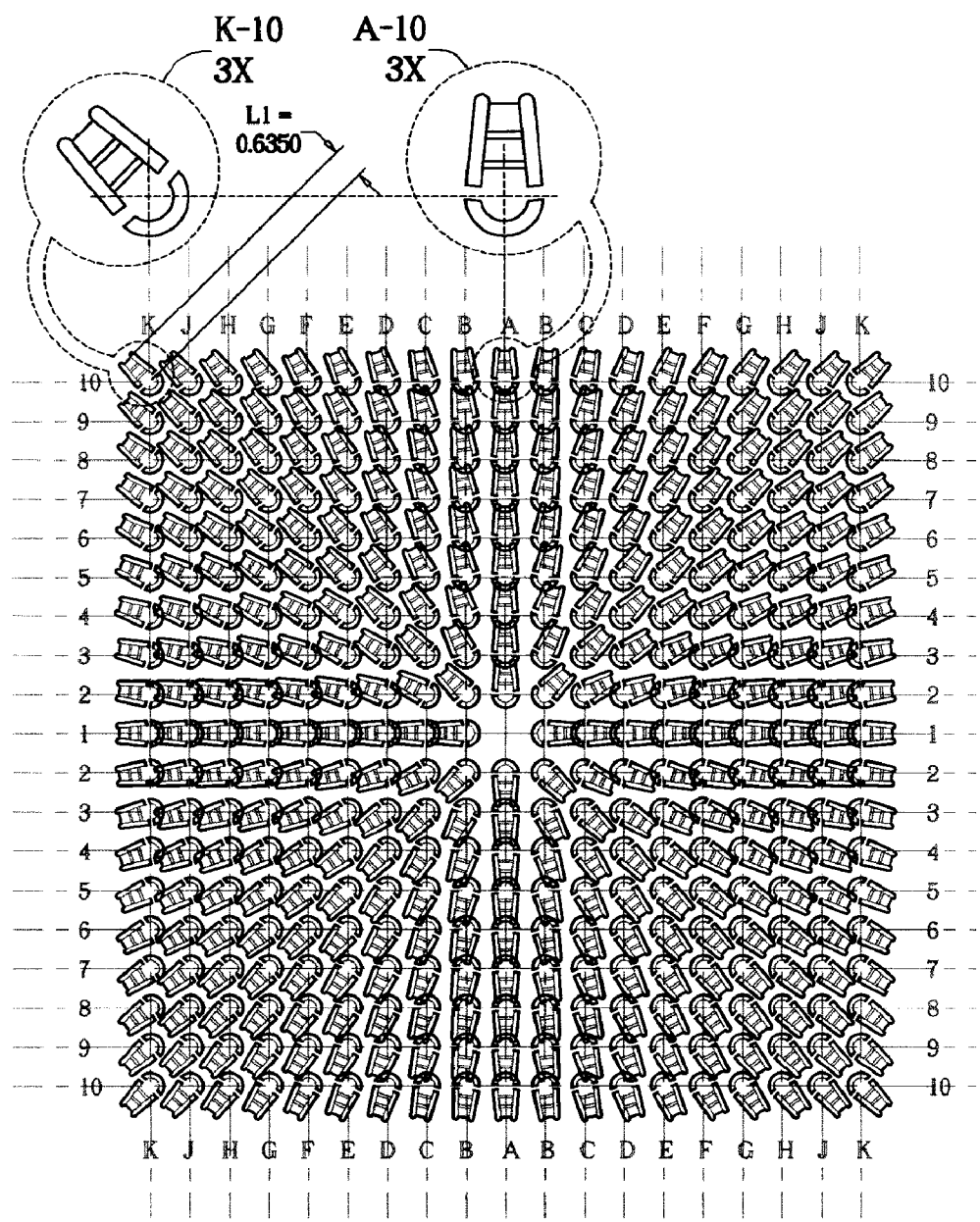
FIG. 45 shows a pattern of contacts, where the legs length "L" has been increase by 0.1 mm, so that L became 0.635 mm.

FIG. 45 shows a pattern of contacts, where the legs length "L" has been increase by 0.1 mm, so that L became 0.635 mm, again for a standard pitch of 0.8 mm and a BGS pad diameter o 0.33 mm, i.e. R1=0.165 mm in FIG. 43.

We see that there is interference between some of the contacts, as explained below.

Figure 46:
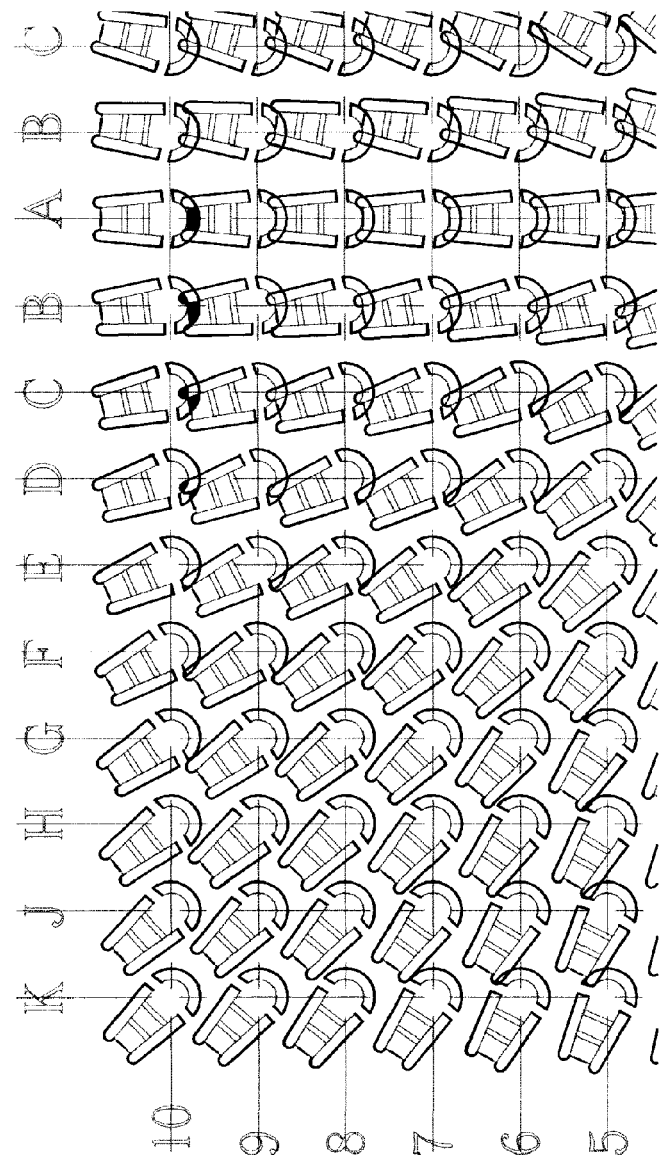
FIG. 46 shows an enlarged view of the top left part of the pattern.

FIG. 46 shows an enlarged view of the top left part of the pattern, showing only rows 10 through 5 of the left hand side, columns K through A and then further through B and C on the right hand side of the centerline.

Figure 47:
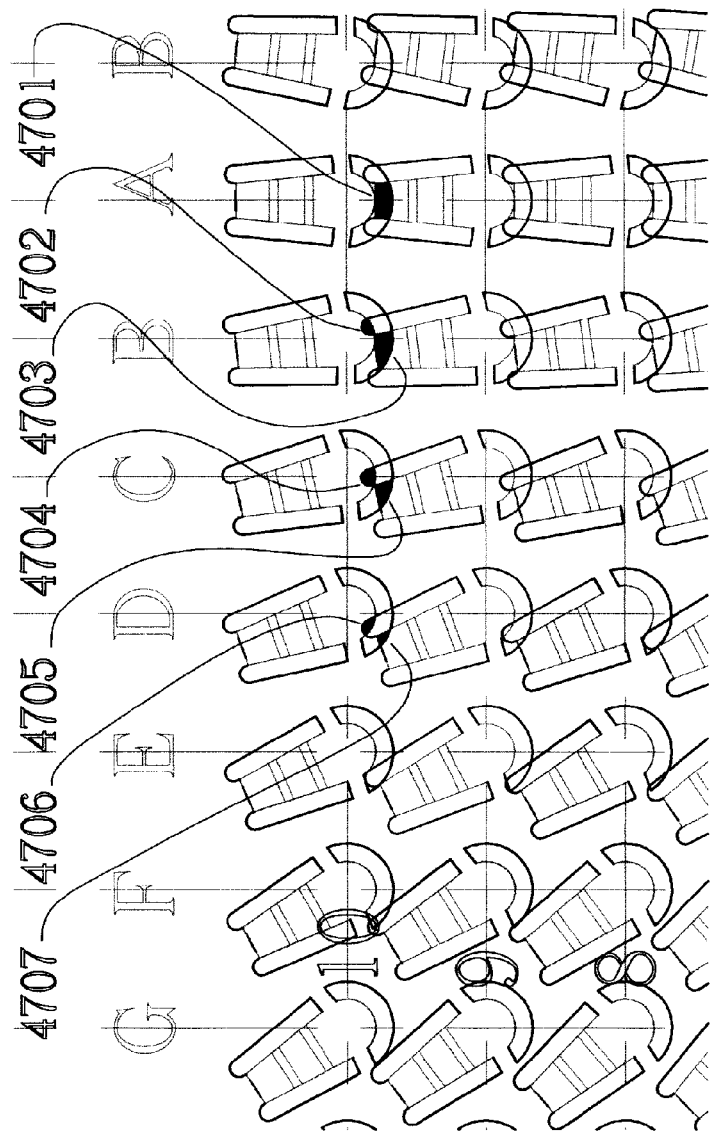
FIG. 47 shows a close up view of the top three rows of contacts.

FIG. 47 shows a close up view of the top three rows of contacts. The top row is Row #10, the two below it is Row #9 and Row #8. The Column A is the center line of the pattern. We can see that there is interference at four pairs of contacts, at A10-A9, B10-B9, C10-C9, and D10-D9. A total of 7 interference spots can be seen darkened. Some of the interference spots fall only in the "moat" area, as at A10-A9, while some others encroach either on the leg areas or on the pad areas, or both. We also notice that as we go farther away from the center, we see less interference. We do not see any interference at all along the rest of this left side of the row, beyond D10-D9.

Figure 48:
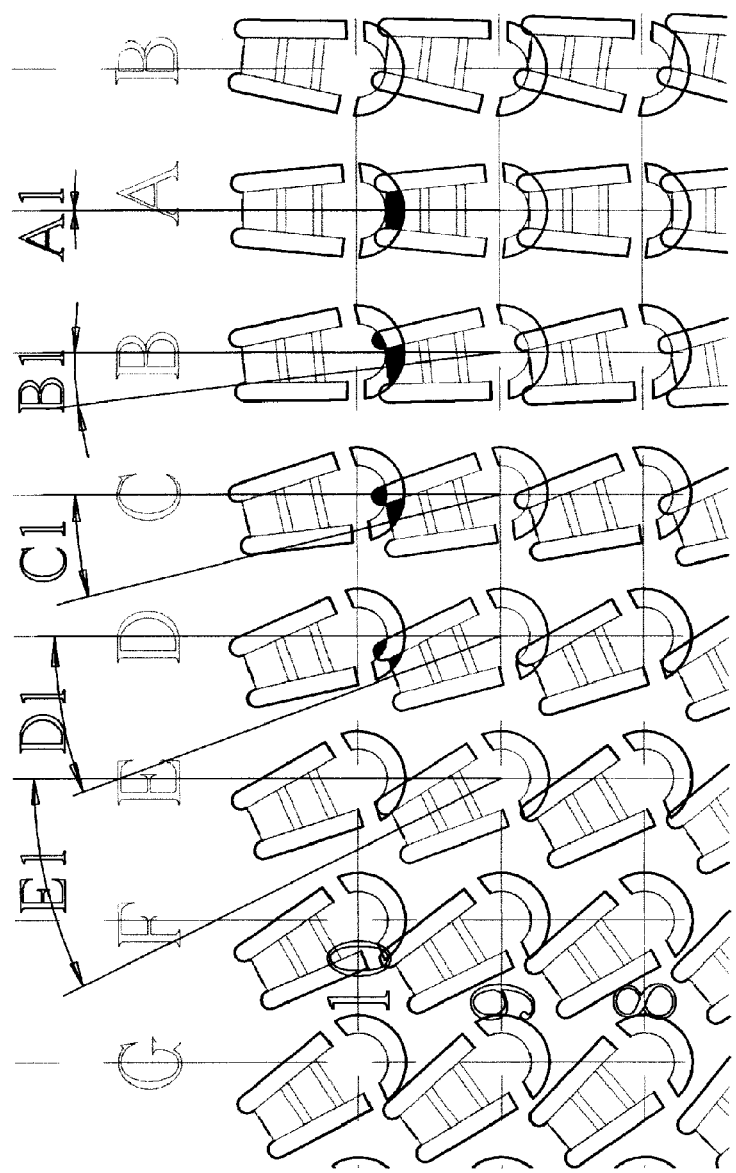
FIG. 48 shows the "angles" of the oriented contacts, A9, B9, C9, D9, E9.

FIG. 48 shows the same view as in FIG. 47, but it also shows the "angles" of the oriented contacts, A9, B9, C9, D9, E9. Obviously, the angle A9 is "zero", because the contact is in line with the center line. We can see that the angle E1 of the E9 contact makes it such that the E9 contact does not interfere with the E10 contact. So, if we could re-orient all the contacts that are interfering, so they would be oriented at a similar angle like that of E9 contact, then we would be home free!

Figure 49:
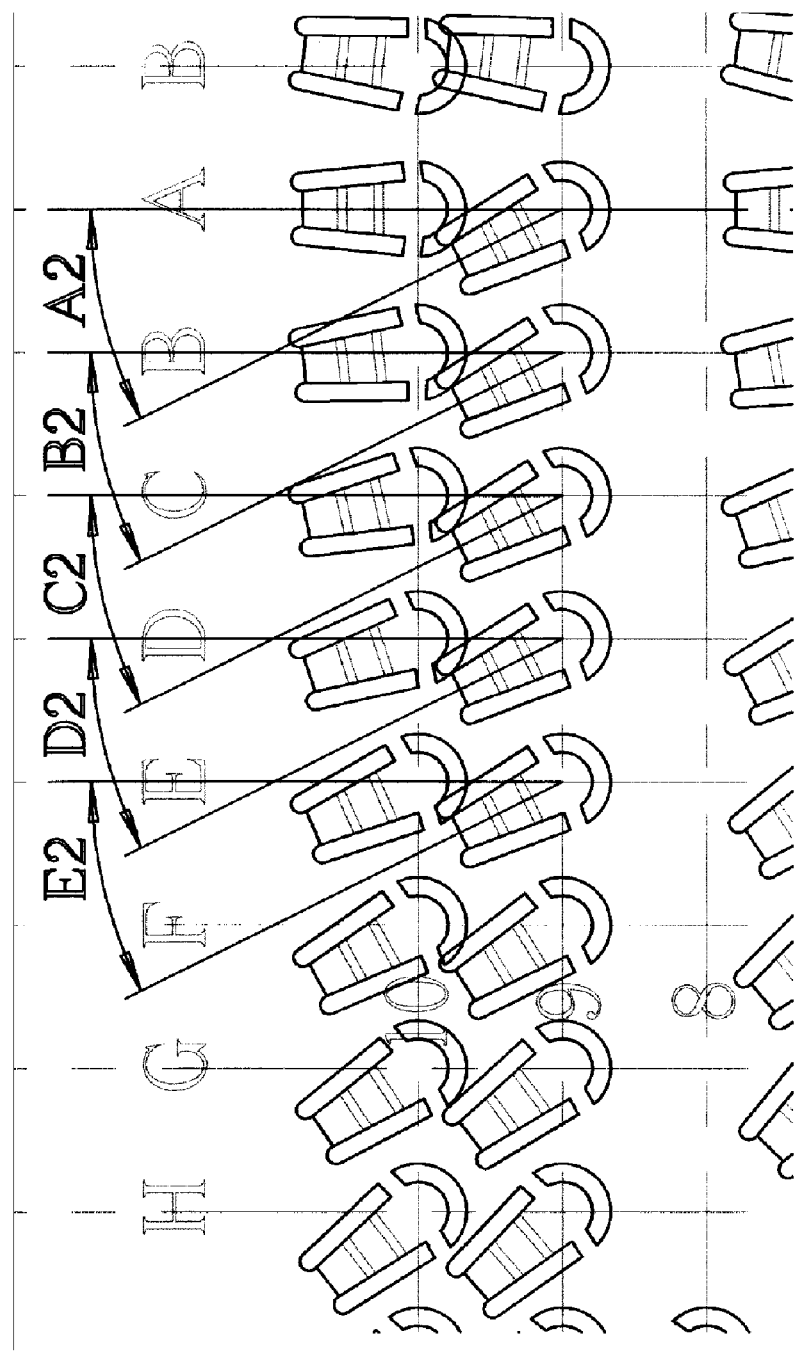
FIG. 49 shows the arrangement with the new angle.

FIG. 49 shows the arrangement with the new angle. All the 4 contacts, which were interfering with the contacts above them, have been re-oriented to have a same angle like E1. Now, we see that there is no interference any more.

This angle applies only to this row of contacts. For the other rows, a more appropriate angle can be found, using a similar approach as we have used for the row just described.

This angle would control the orientation angle of the contact after it has been fully formed.

Of course, ideally we would like to have each and every contact oriented with the ideal/theoretical ray, which start at the thermal center, usually the geometric center of the device and ends at the center of the respective contact pad. This would provide the least resistance to bending from the contact body. However, if we deviate from this ideal orientation by a small amount, we may still be OK. It is a trade-off between the orientation of the leg and the length of the leg. We can actually calculate the stresses on the leg and the solder joints, or even do a Finite Element Analysis (FEA), and determine the effect of the angle or the length of the leg on the stresses in the whole picture, i.e. on the individual elements of the joints. This way, we can evaluate the benefits or the downfall of re-orienting the contacts, or not to re-orient them.

Actually by studying the layout in FIG. 49, we can realize that the length "L" of the leg can still be increased considerably more, until we almost reach the pad of the contact that is above it and to the left side of it. This extra length can compensate for the deviation of the angle from the ideal orientation.

OTHER EMBODIMENTS

Figure 50:
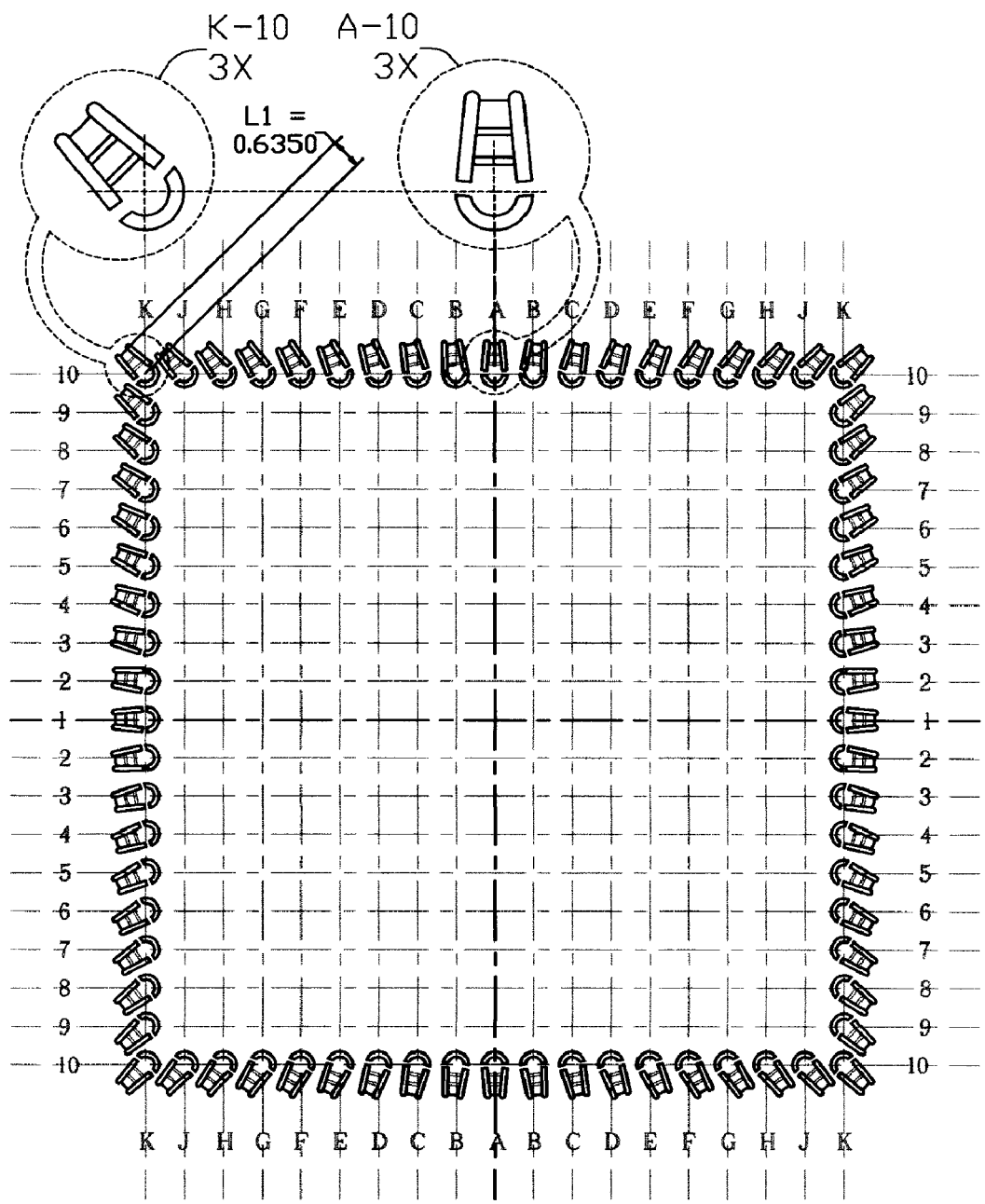
FIG. 50 shows a configuration of contacts for a device, which has only one peripheral row of contact pads.

FIG. 50 shows a configuration of contacts for a device, which has only one peripheral row of contact pads. Here, the contacts are shown to be oriented, as best desired for stress reduction. But they could also be "orthogonal" as well, and they would still improve the reliability of the assemblies where used, as compared with the case where the device would be directly soldered to the PCB say, with the conventional soldering methods, using solder balls or the like. Attaching the TFCC would basically convert a leadless device to a leaded device.

Figure 51:
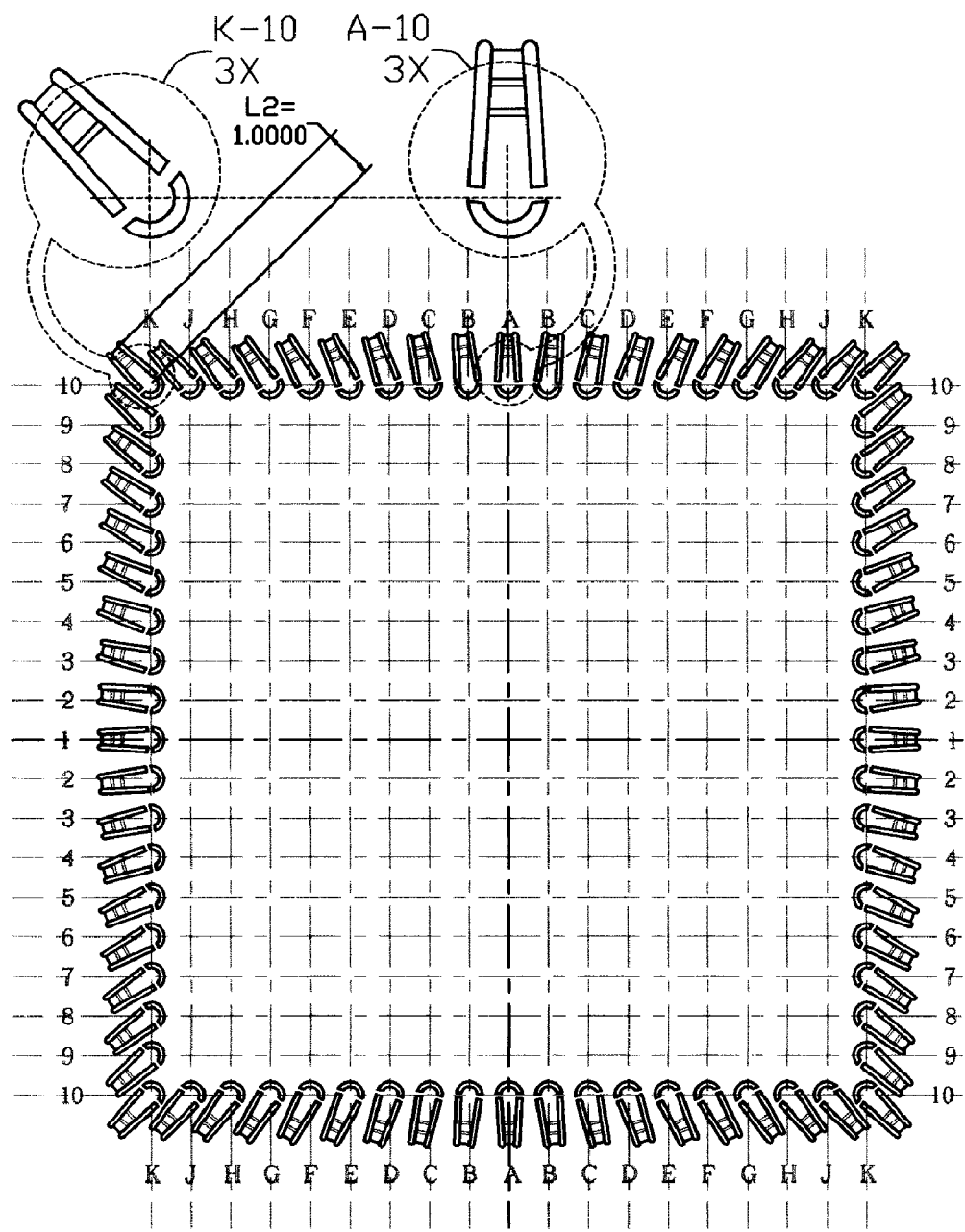
FIG. 51 shows an example, where the leg length was increased from 0.635 mm to 1.00 mm, just for illustration purposes.

Obviously in this case, the length of the contact legs can be increased without any restrictions, other than the question of space or the height of the device on top of the PCB, for example. FIG. 51 shows such an example, where the leg length was increased from 0.635 mm to 1.00 mm, just for illustration purposes.

Figure 52:
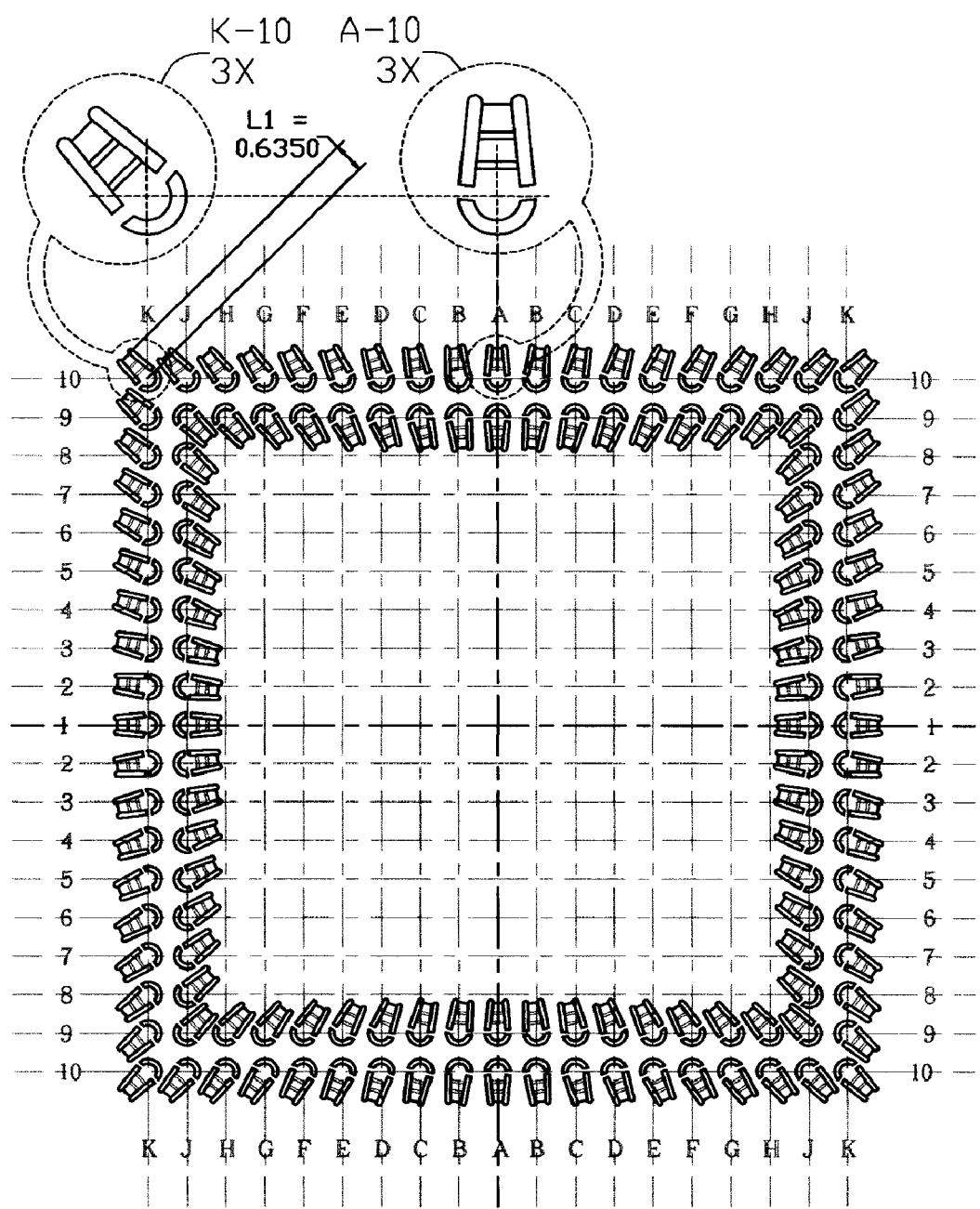
FIG. 52 shows the case where the device has two peripheral rows of contact pads.

FIG. 52 shows the case where the device has two peripheral rows of contact pads. Here, the contacts were arranged so that the outer row of contacts would start pointing outwards, while the contacts of the inside row would start pointing inwards. Of course, after they get bent to have their legs perpendicular to the body of the TFCC, the legs would align properly and their ends, which will be soldered to the PCB, will be located properly at their correct respective positions.

Figure 53:
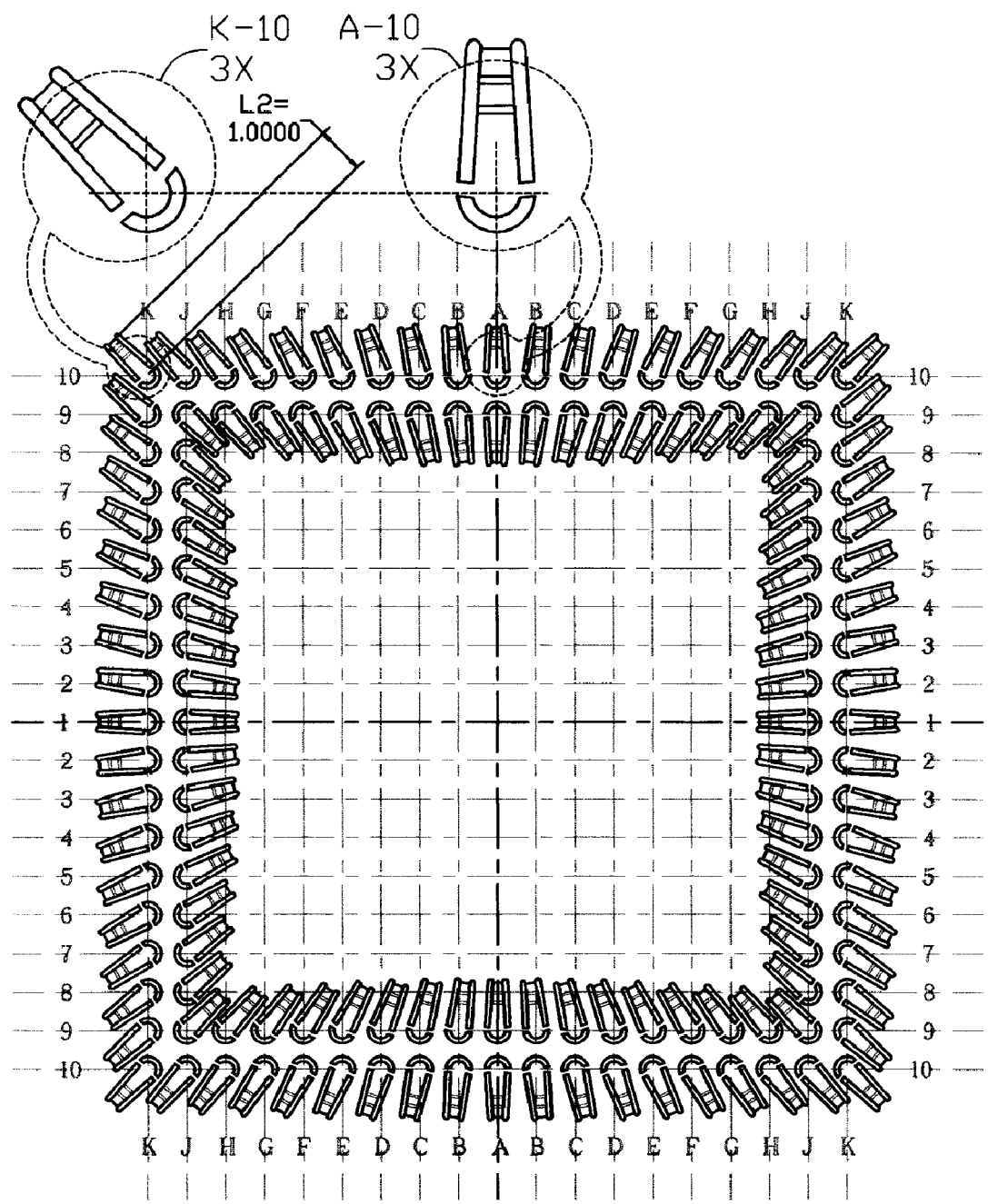
FIG. 53 shows an almost similar arrangement of two peripheral rows, as FIG. 52. The only difference is that the length of the contacts was increased, to gain more flexibility.

FIG. 53 shows an almost similar arrangement of two peripheral rows, as FIG. 52. The only difference is that the length of the contacts was increased, to gain more flexibility. Again, in such a case, there is hardly any limit as to how much you can increase the length of the leg, as explained above.

Figure 54:
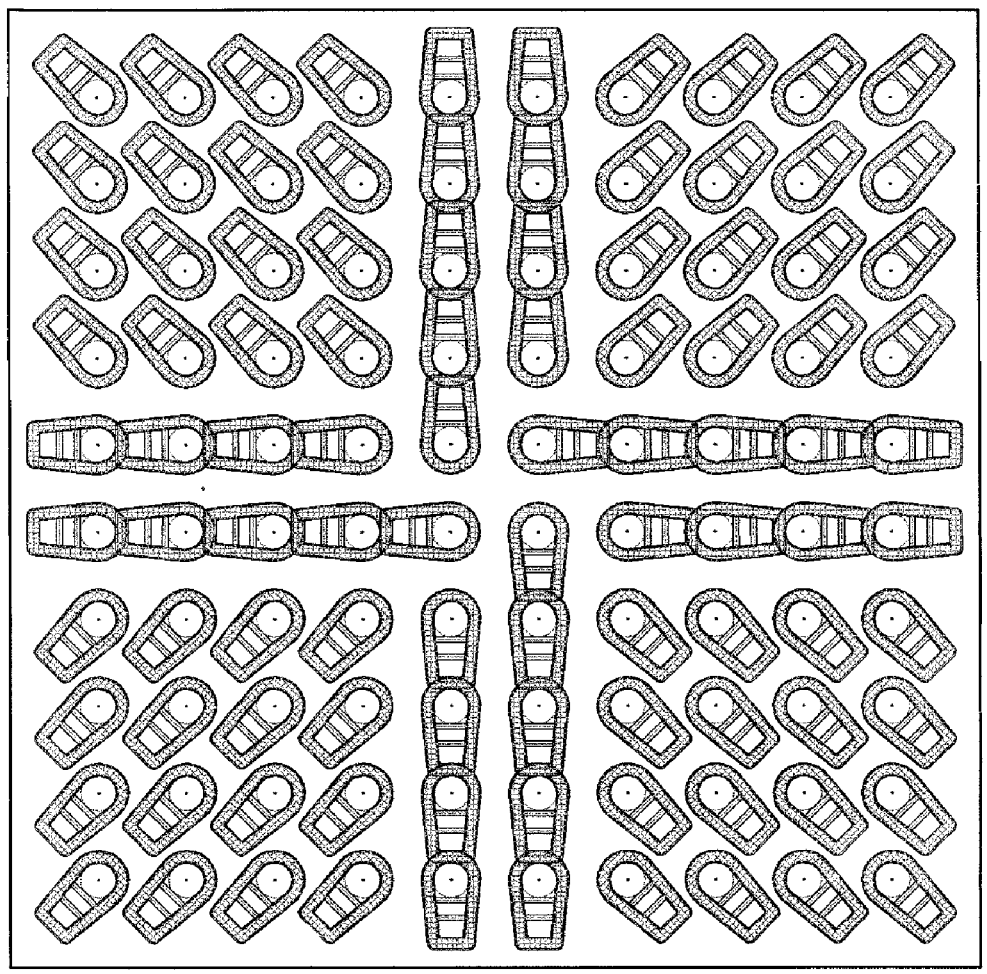
FIG. 54 shows another way to arrange the contacts in the desired pattern.

FIGS. 54 shows another way to arrange the contacts in the desired pattern. The orientation angle of the individual contacts in each of the four quadrants is the same for all the contacts in their respective quadrant. We may find that this is still acceptable, especially if the contact/stem length is large enough to compensate for the slight deviation from the pure/ideal orientation, as explained above. Keeping the angle the same for each quadrant may make it easier and more economical for the manufacturing of the TFCC.

FIG. 55 has been cancelled.

FIG. 56 has been eliminated. It used to show the same item as in FIG. 19, which will be described here below.

FIG. 19 shows a feature in the contact body. The two groves, ref # 1921 and ref # 1923, help in localizing the bend and make the manufacturing process more controllable. This would help in keeping the leg stem, ref # 1913, fairly straight.

We may opt not to create such groves and simply bend the contacts. This would result in that the leg stem would have some curvature in it. This could be desirable, if we want to create some flexibility in the Z-direction of the assembly as well.

FIG. 57 has been cancelled.

Figure 58:
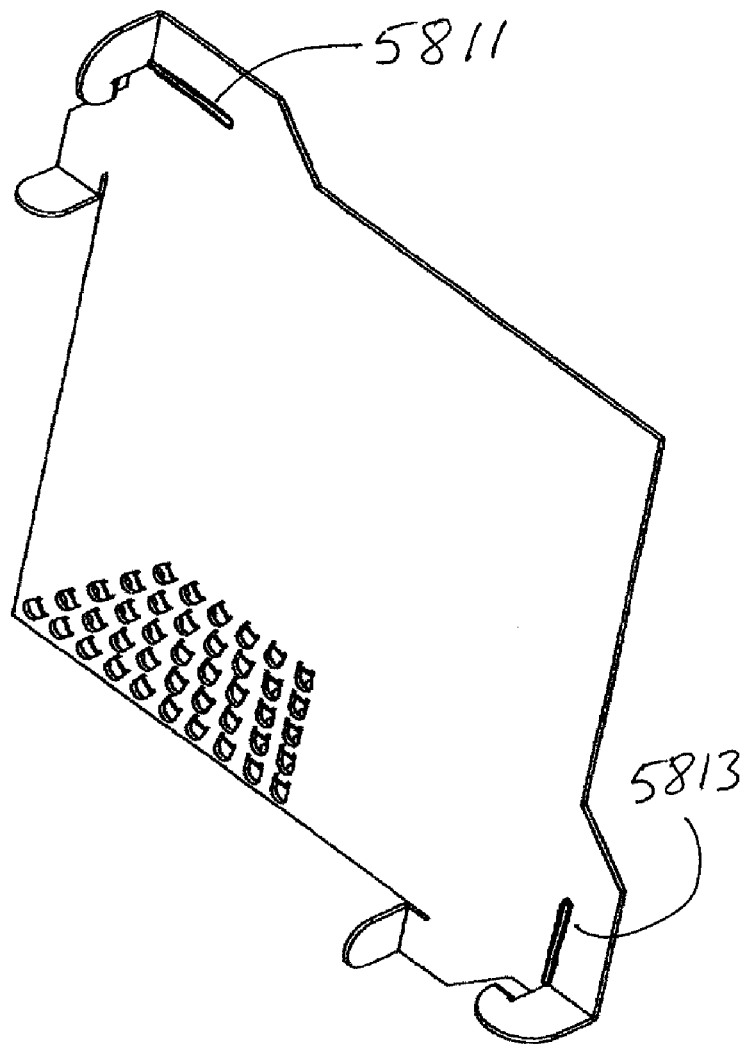
FIG. 58 shows a longer slit at the retaining ear of the TFCC, to impart more flexibility to the retaining ears, so as to more easily accommodate the dimensional tolerances of the BGAs and similar devices.

FIG. 58 shows a longer slit, ref # 5811 and 5813, at the retaining ear of the TFCC, to impart more flexibility to the retaining ears, so as to more easily accommodate the dimensional tolerances of the BGAs and similar devices.

ANCHOR

In certain cases, where the assembly is expected to be exposed to high shock and vibration conditions, it may behoove us to provide some additional means to reinforce the connection between the BGA and the PCB, by using what is referred to as the "anchor".

Please go back to FIG. 20-B.

The 3-D views of the TFCC show an anchor, ref # 2011, at the center of the flat bottom surface, ref # 2013, This would be a protrusion created in the TFCC sheet/body, which would have approximately the same "height" as the height of the contacts/legs, ref # 2015. The PCB will have a solder pad located at the center of the contact pad matrix or pattern, to match with and to correspond with the location of the anchor and to accept the anchor during the soldering process. The size of the PCB anchor pad could be slightly larger than that of the anchor, so as to create the appropriate/desirable solder filet. The size/diameter of the anchor can be as large as approximately ⅛ inch or maybe even larger, without creating any appreciable over-stresses at the anchor joint due to temperature fluctuations.

This anchor is similar to, and has the same function as, the anchor shown and described in the referenced mother patent applications.

GROUP 2—THE SWCC & SWOCC

TWO NEW CARRYING WAFERS. "SWCC (TM)" & "SWOCC (TM)"

The referenced patent applications, Ref6 and Ref7, had stated the following:

WITH A CARRYING WAFER

See sketches in pages MC-S-34 and FIG. 57 in Ref xx.

Gang Joining can be also accomplished with the use of a "WAFER". I will define the Carrying Wafer, as being a device, that holds the individual pins/columns in a way, so that each pin would match its corresponding pads on both the substrate or PCB/Printed Circuit Board at one end of the pins, and on the chip or package on the other end.

The carrying wafer can be made of a material that would be dissolved or easily removed after the reflow operation. Such materials have been patented and are already public knowledge. See for example U.S. Pat. No. 4,655,382, Wong et al, "DISSOLVABLE . . . HOLDER", which covers a carrying wafer, but which has problems with TCE Mismatch.

A NEW WAFER

However, I propose a new wafer material, in addition to those that are already in the prior art domain.

My wafer material will have, in addition to the "standard" elements, a set of "threads" which are embedded in the wafer material.

The purpose of the threads would be to impart to the wafer a "Controlled TCE". Controlled Thermal Coefficient of Expansion.

You see, with the Wong wafer material, the wafer has a larger TCE that the ceramic packages. I believe its TCE is even larger than that of FR4 boards. During the reflow process, the wafer expands more than the package, and consequently the solder and the pins follow the wafer. The solder and the pins attach to the substrate at the expanded position. When the total assembly cools down and the solder starts to freeze, the wafer shrinks more and the end result is some distortion in the shape and position of the solder and the pins.

In order to minimize this undesirable effect, we need to find a material for the wafer, which either has an inherent TCE that matches the TCE of the package or the chip; or We need to "doctor" the "Effective/Apparent" TCE of the wafer, so that it does closely match that TCE of the package or chip.

One way to achieve this goal is to "implant" in the wafer something to force it to behave as if is has the desirable TCE.

What I propose to achieve that is basically to create a "composite" wafer material, made of a) the materials mentioned in the prior art, and b) some fibers, that would be criss-crossed inside the a-materials; so that the effective TCE of the resulting material would have a new TCE, which has a value close to the desired one.

Such fibers could be made of fiberglass, or any other materials that have a small TCE or even a negative TCE.

Furthermore, it may be desirable to place these fibers, in the form of "threads", as opposed to loose, bulk fibers.

A further improvement would be to place these threads in a criss-crossing pattern, pretty close to the way threads are woven together to make a cloth", with the thread interwoven over and under the intersecting threads. I believe they call this the Warp and the ??? See Pattern A, in fig. in Ref3, page MC-S-37.

A yet further improvement would be to lay the threads as shown in the fig B in Ref3, page MC-S-37, whereby all the treads going in one direction would lay in one level, while the threads perpendicular to the first group would be laying in another layer, not over and under, i.e. non-woven, but simply oriented and laying in one plane separate from the other plane. See pattern B.

The purpose of the Non-Woven, but Oriented thread arrangement, Pattern B, is to be able to easily pull the threads out, after the reflow operation. We would soak the assembly in an appropriate liquid to loosen up the thread, and then pull these threads out.

If the threads are woven as in Pattern A, it would be more difficult to pull them out, even after soaking them and loosening them.

I have been working with Don Saunders on making some prototypes of Carrying Wafers, such as those mentioned above. Two things developed as a result.

1. SOLUBLE SOLDER MASK WAFER.

Together with Don Saunders, we have tried to make a carrying wafer made out of soluble solder mask. On Dec. 13, 2006, I made the drawing shown in FIG. 68, to make such a prototype. On Jan. 11, 2007, we made a few different attempts, ended up with a few prototypes and took some pictures, which were attached in the Provisional Patent Application (PPA) as Drawing/Picture Sheets D-59 through D-61.

Please note that FIGS. 59 through 61 have been cancelled from this present patent application. It looked pretty promising.

Basically, we have tried and succeeded in making a slab, made out of this solder mask material, embedded some short length pieces of copper wire into the slab, heated to slab to cure it somewhat, and then dipped the wires into a bath of hot molten solder. The solder wetted the exposed portions of the wire and attached to it, i.e. the exposed portions of the wires got solder coated. The portions of wires that were embedded into the masking material did not get solder coated. That was very exciting.

We figured that the next steps would be to embed some fibers or threads into the masking material, to control its TCE. Also, for those next experiments, we figured that we will use copper wires that have a color, which is different than the color of solder, so that it would be easier to recognize the area of the wire that will be solder-coated.

2. WOVEN CARRYING WAFER

2.A TRIAXIAL STRUCTURES, INC.

In the meantime, Don came across a Company that could help us.

The Company is "Triaxial Structures, Inc.". Their website address is http://triaxial.us/index.html. Their physical address is: 1520 Campus Drive, Suite A, Warminster, Pa. 18974, Phone: 215-675-1455, Fax: 215-675-2281.

Don talked with Triaxial people as a result of his visit to the APEX 2007 tradeshow, and then connected me with them on Apr. 9, 2007. I visited Triaxial website, and found that they have some good ideas, which could complement some of my inventions.

On April 11, I called Triaxial and talked with Steve Kryven, Dick Dow, a Mr. Tim, their Material Scientist and a Mr. Larry, in Marketing. We explored the questions of collaborating on my inventions, and the possibility of Triaxial trying to find licensees for one or more of my inventions.

On April 12, I emailed to Triaxial my NDAA form together with a list of my 6 issued patents and the 4 other patents pending, which were already published by the USPTO.

On April 15 and 16, Don Saunders and Steve Kryven exchanged emails re some technical questions.

On April 20, I called and left a message to Dick Dow and Steve Kryven, of Triaxial, asking about their response. They called back and said that their Material Scientist is still studying my paper work.

I am still waiting to hear from them.

In the meantime, I have formulated a few ideas, which are based on Triaxial technology, but would improve on them, with the purpose of using these ideas for my inventions.

Triaxial Intellectual Property:

Triaxial and related parties either are co-inventors or are party, in one way or another, to the following patents.

1. U.S. Pat. No. 3,965,939 Kulczycki et al, Heddle w Guide Means in a Weaving Machine 1976
2. U.S. Pat. No. 4,015,637 Halton et al, Triaxial Fabric Forming Machine 1977
3. U.S. Pat. No. 4,066,104 Halton et al, Triaxial Fabric Forming Machine 1978
4. U.S. Pat. No. 4,837,065 Dow, Enhanced Composite Laminate 1989
5. U.S. Pat. No. 6,599,561 Dow et al, Printed Circuit Board Substrate 2003

It seems that they have used the concepts in the two last patents and expanded on them, and came up with the business model that is the basis of one of the products of Triaxial. In their website, http://www.triaxial.us/, they show these and other products.

The products that are of interest to me are those that they call "Interposer Technology, webpage http://www.triaxial.us/TSI Interposer.html", "Core Via Technology, webpage http://www.triaxial.us/TSI Core Via Technology.html" and "Core Via Applications, webpage http://www.triaxial.us/TSI Core Via Applications.html".

They are shown in their website, which is obviously in the public domain, but some of them are marked as being "TSI Proprietary and Confidential".

I have reproduced in my FIG. 65, 65-A, 65-B and 65-C, in this specification three of their images that are part of their "Core Via Technology", and then I have shown in my FIGS. 67-A-1, 67-A-2, 67-B-1 and 67-B-2 certain "improvements" on their technology, to provide new and novel usages of their technology, to provide certain technology benefits. See FIG. 66 described further below.

So, I will show here below, these improvements on some of their published devices, and I will claim the rights to these improvements. Eventually, I will talk with them and offer some cross-licensing of the inventions/patents, if they so desire.

2.B SOLUBLE WOVEN CONTACT CARRIER "SWCC (TM)"

FIG. 65 shows 3 individual drawings representing the Triaxial Core Via Technology. See below. The top two drawings, FIGS. 65-A and 65-B show the woven cloth ref # 6513 and, ref # 6523, with the copper wire, ref # 6519 ref # 6529 going up and down, through the cloth, ref # 6523, and then at the surface of the cloth, ref # 6525 and, ref # 6527, ref # xxx, ref # xxx,. The bottom drawing shows the same cloth, after it has been worked on, so that the portions of the copper wire at both top, ref # 6536, and bottom, ref # 6538, surfaces of the cloth has been removed. This leaves the vertical portions, ref # 6539, of the copper wire as stand alone columns, reaching from the top surface, ref # 6536, of the cloth all the way through to the bottom surface, ref # 6538, of the cloth. These can act as separate, independent vias. I will call this, the "via cloth", ref # 6531.

Triaxial takes advantage of the "via cloth" and use it in creating electronic assemblies as shown in their webpage http://www.triaxial.us/TSI Core Via Applications.html and "Stacked Die/Packages. See my reproduction of one such application in my FIG. 66. Very clever. I like that. Notice also that the vias have been metalized at their top and bottom ends, to make them more receptive to soldering.

Now, let us study the items in FIG. 66, which is a reproduction of the "Stacked Die/Package" picture shown in the top left hand side figure in Triaxial's "Core Via Applications, webpage http://www.triaxial.us/TSI Core Via Applications.html". The stack consists of an upper chip, ref # 6601, which I will refer to Chip-1, on top of a substrate, Sub-1, ref # 6603, which is on top of a lower substrate, Sub-2, ref # 6607, with a second chip, Chip-2, ref # 6605, between the two substrates.

Chip-1 has been wire bonded to the tops of the vias in Sub-1, which is one of those via cloths. Same with chip-2 being wire bonded to the tops of the vias of Sub-2. Then sub-1 is mounted/soldered to sub-2 using solder balls. Then sub-2 is ready to be soldered to a PCB or substrate of some sort, in a subsequent operation.

The problem with this picture is the following.

The material, ref # 6611, ref # 6613, of the subs, sub-1 and sub-2, which is the via cloth material, is surrounding the vias, ref # 6615, ref # 6617, and is holding them rigid in place. If the cloth material expands or contracts due to temperature fluctuations, then it will exert a force on the vias and will try to displace them from their balanced position into an unbalanced or stressed position. Furthermore, the vias are restrained from bending along their length by the cloth material.

Now, let us study the items in the "Thermal Management" picture shown below the "Stacked Die/Package picture in Triaxial website (Not Shown here).

The same description applies to the parts in that picture as well. The Sub is holding the vias rigid within the cloth material. If the TCE of the chip is different than the TCE of the cloth, then when the temperature changes, either goes higher or lower than the so-called stable condition, then there will be a difference in the linear dimensions of the chip and the sub. This will create a "shear stress" at the joints at the interface between the chip and the sub. This shear stress can possibly reach a level where the joints would be overstressed and eventually break/fail. The same would occur at the interface between the sub and the heat sink.

Now, I would like to propose the following "improvement".

In any of these and similar cases, I would like to make the material of the "via cloth" ref #6711, 6713 in FIG. 67A1, and ref # 6721 and 6723 in FIG. 67B1, so that it can be removed from the sensitive areas, which could create such an overstress.

This can be accomplished by making the via cloth out of a dissolvable material, such as the material developed for the CCMD. See referenced patents.

It can also be made out of say the same soluble solder mask that we have used in the "1. SOLUBLE SOLDER MASK WAFER" above. It can be soluble in water or in any appropriate acceptable solvent. An example of such a device is shown in FIG. 68.

FIG. 68 shows the body of the carrier 6811 is made of a soluble material, which is totally out of a solder masking material, or out a material which is impregnated with a solder masking material. The pins 6813 can be simple straight bare wires, copper or the like. The pins are inserted in the carrier and get solder coated, say by dipping in a molten solder bath, or can be coated with solder by any other appropriate method. The solder would adhere to the two exposed tips, 6815 and 6819 of each pin, but would not penetrate inside the carrier and thus would leave the "stem" of the column free of solder during the assembly process. The device can then be used as a substitute for the old CCMD, Chip Carrier Mounting Device.

Then, by doing so, we can use this "sub"/via cloth" as our new contact carrier. THE NEW "SOLUBLE WOVEN CONTACT CARRIER" OR THE "SWCC (TM)".

This SWCC (TM) can be provided with a "frame", ref # 6715 in FIG. 67A1 and ref # 6725 in FIG. 67B1, to surround it and to protect it during handling etc. This so-called frame can be a kind of substrate or PCB, which could also have other features on it, such as traces and vias, which would be like any of the "conventional" traces and vias.

FIGS. 67-A and 67-B show an example of the "SWCC IN PCB", as I have just described it above. But it does not need to be enclosed or encased into a PCB. The SWCC can be a stand alone device, as ref # 6705 in FIG. 67B1, very similar to the old CCMD, which was using the water soluble wafer carrier, whose material was invented by Geoff Wong et al.

After the assembly/reflow operations are completed and the soluble materials have been removed, the assemblies would then look as ref # 6701 in FIG. 67A2 and ref # 6703 and 6705 in FIG. 67B2. Some additional wire bonding or similar operations may follow, as in ref 6705 in FIG. 67B2.

In addition, the material surrounding the wires can be made of something like a solder mask, to help ensure that the metallization process of the ends of the copper vias, does not wick inside and cover the stems of the copper vias. Hence, the "No-Wick (TM)" feature.

2.0 SOLUBLE WOVEN ORIENTED CONTACT CARRIER "SWOCC (TM)"

In all the above, i.e. the SWCC, the copper wire was assumed to be "round". Now, I am switching to a different wire.

I want to use a wire with a rectangular cross-section. I will call it, a tape. Or a copper tape.

We have used such a copper tape for the CCMD.

If you recall, or if you like to look at some old pictures of the CCMD Columns, you will notice that the column was made out of a solder wire, with a very thin copper tape wound around it like a helix. This was the reason, why the solder column stayed as a column during the reflow process. Without that copper tape helix, the column would have collapsed and created a solder ball.

So, now, I want to use a similar copper tape and use it as the wire for the via cloth. This would create column vias that are rectangular in cross section, not circular.

The next improvement step is to "orient" these copper tape columns, so that they would present the smallest resistance to flexing or bending during any thermal fluctuations. This is as explained earlier and in the referenced patents and patent applications.

Now, the way to accomplish this is by using something like an embroidery machine. Kulicke and Soffa has specialized in building the wire bonding machines. Either they can do that, or any other machine manufacturer can do it. If not, then I can build such a machine.

One way to accomplish that is, either the stitching head can rotate and orient the wire/columns as required, or the cloth platform would rotate to get the proper orientation of the columns.

By doing that, we can create the new SOLUBLE WOVEN ORIENTED CONTACT CARRIER "SWOCC (TM)".

We claim:

1. A set of at least two contacts, for connecting a first electronic device having a generally flat surface, a BGA or a chip, to a second electronic device having a generally flat surface and being generally parallel to said first device, a PCB or a substrate, both devices having corresponding contact pads, each contact being made out of a resilient electrically conductive material, such as copper, and comprising a tall, slim and slender column-like body, and a first end and a second end, said first end being capable of being attached to a BGA contact pad, and being referred to as the Contact BGA End, and said second end being capable of being attached to the PCB contact pad, and being referred to as the Contact PCB End, the column portions of the contacts being arranged to be generally perpendicular to the generally flat surface of the BGA and to the generally flat surface of the PCB, wherein the column portions of the contacts have a generally elongated cross-section, having a relatively small thickness compared to the width of the cross-section, and wherein the column portions of each one of said contacts is arranged to be oriented so that the contact would present the least resistance to bending in the general direction of the expected thermal deformation of the assembly of BGA and PCB, at the location of the respective contact.

2. A set of at least two contacts, as in claim 1, wherein the contacts are prepared, so that when said contacts are soldered to their respective BGA and PCB, the solder would not wick too far along the length of the contact column, leaving enough length of column without solder.

3. A set of at least two contacts, as in claim 1, wherein the column portions of the contacts are arcuate and such that they can be parallel nested.

4. A set of at least two contacts, as in claim 1, wherein the set comprises an anchor capable of attaching the BGA to the PCB.

5. A set of at least two contacts, as in claim 1, wherein the first end of each one of the contacts, the Contact BGA End, is shaped generally as a round circular pad to match its corresponding contact pad on the BGA and to accept a BGA solder ball, while the second end of each one of the contacts, the Contact PCB End, is shaped generally to match the shape of its corresponding contact pad on the PCB.

6. A set of at least two contacts, as in claim 1, wherein the first end of each one of the contacts, the Contact BGA End, is shaped generally as a round circular pad to match its corresponding contact pad on the BGA, while the second end of each one of the contacts is a continuation or extension of the body itself, so that the contact will look like an inverted L-Shape, looking at it from a side view.

7. A set of at least two contacts, as in claim 1, wherein the first end of each one of the contacts, the Contact BGA End, is attached to the BGA, while the second end of each one of said contacts is not attached to anything, in preparation for the time when these second ends will be attached to an appropriate device at a later time.

8. An interconnection device, for connecting a first electronic device having a generally flat surface, a BGA or a chip, to a second electronic device having a generally flat surface and being generally parallel to said first device, a PCB or a substrate, both devices having corresponding contact pads, said interconnection device being referred to as the Soluble Woven Contact Carrier or SWCC for short, comprising a SWCC main flat body, and at least two contact elements, referred to simply as contacts, said SWCC main flat body being made of woven threads and filaments, each one of said contacts being made out of a resilient electrically conductive material, such as copper, and having a tall slender columnar shape, having a body portion, being referred to as the Contact Column, and a first end, being referred to as the Contact BGA End, which will be capable of being attached to a corresponding BGA contact pad, and a second end, being referred to as the Contact PCB End, which will be capable of being attached to a corresponding PCB contact pad, said contacts being arranged to have their Contact Columns, being generally perpendicular to the SWCC main flat body, and located so that the Contact BGA End of each contact can be attached to its corresponding BGA contact pad and the Contact PCB End of each contact can be attached to its corresponding PCB contact pad, wherein at least some of the threads and filaments of the SWCC main flat body are removable or dissolvable.

9. An interconnection device, as in claim 8, wherein the contacts have an elongated cross-section, having a relatively small thickness compared to the width of the cross-section, and the contact column of each one of said contacts is arranged to be oriented in a way, so that said contact would present the least resistance to bending in the general direction of the expected thermal deformation of the assembly of BGA and PCB, at the location of the respective contact.

10. An interconnection device, as in claim 8, wherein at least some of the threads and filaments of the SWCC main flat body are made of a material that can act as a solder mask, so that when said contacts are soldered to their respective BGA and PCB, the solder would not wick too far along the length of the contact column, leaving enough length of column without solder.

11. An interconnection device, as in claim 8, wherein said interconnection device is embedded in another device, such as a PCB.

12. An interconnection device, for connecting a first electronic device having a generally flat surface, say a BGA or a chip, to a second electronic device having a generally flat surface and being generally parallel to said first device, say a PCB or a substrate, both devices having corresponding contact pads, said interconnection device being referred to as the Solder Mask Carrier or SMC for short, comprising a SMC main flat body, and at least two contact elements, referred to simply as contacts, each one of said contacts being made out of a resilient electrically conductive material, such as copper, and having a tall slender columnar shape, having a body portion, being referred to as the Contact Column, and a first end, being referred to as the Contact BGA End, and being capable of being attached to a corresponding BGA contact pad, and a second end, being referred to as the Contact PCB End, and being capable of being attached to a corresponding PCB contact pad, said contacts being arranged to have their Contact Column, being generally perpendicular to the SMC main flat body, and located so that the Contact BGA End of each contact can be attached to its corresponding BGA contact pad and the Contact PCB End of each contact can be attached to its corresponding PCB contact pad, wherein said SMC main flat body is made of material that can act as a solder masking material, so that when said contacts are soldered to their respective BGA and PCB contact pads, the solder would not wick too far along the length of the contact column, leaving enough length of column without solder.

13. An interconnection device, as in claim 12, wherein said SMC main flat body is not made of a woven material, but out of a regular slab of material.

14. An interconnection device, as in claim 12, wherein at least some of the material of the SMC main flat body is removable or dissolvable.

15. An interconnection device, as in claim 12, wherein the ends of the contacts are protruding outside and beyond the SMC main flat body, at least on one side of the SMC main flat body.

16. An interconnection device, as in claim 12, wherein the contacts have an elongated cross-section, having a relatively small thickness compared to the width of the cross-section, and the contact column of each one of said contacts is arranged to be oriented in a way, so that said contact would present the least resistance to bending in the general direction of the expected thermal deformation of the assembly of BGA and PCB, at the location of the respective contact.

17. An interconnection device, as in claim 12, wherein said interconnection device is embedded in another device, such as a PCB.

18. An interconnection device, as in claim 12, wherein said interconnection device comprises also an anchor capable of attaching the BGA to the PCB.

19. An interconnection device, for connecting a first electronic device having a generally flat surface, a BGA or a chip, to a second electronic device having a generally flat surface and being generally parallel to said first device, a PCB or a substrate, both devices having corresponding contact pads, said interconnection device being referred to as the Thermal Flex Contact Carrier or TFCC for short, comprising a main flat body, said TFCC main flat body comprising at least two contact elements, referred to as Thermal Flex Contacts or simply contacts, said TFCC main flat body being made of a generally flat composite laminate, comprising at least a resilient electrically conductive layer, such as copper, joined to a dielectric layer, both layers being processed so as to create individual contact blanks for the said at least two contacts out of the electrically conductive layer of the TFCC main flat body, with said contact blanks being still attached and held in position to the TFCC body with portions of the dielectric layer, acting as attachment tabs, each one of said contact blanks being shaped to have a body portion blank, to create what will be referred to as the Contact Column, and a head portion blank, to create what will be referred to as the Contact BGA End, which will be capable of being attached to a corresponding BGA contact pad, and a foot portion blank, to create what will be referred to as the Contact PCB End, which will be capable of being attached to a corresponding PCB contact pad, all said contact portions having a relatively small thickness compared to the width of the individual portions, and each one of said contact blanks having a main longitudinal axis passing through the middle of the three above portions, each one of said contact blanks then being formed to have the head portion of the contacts, the Contact BGA End, remaining in the same general flat space as that of the electrically conductive layer, while the body portion of the contacts, the Contact Column, being formed to be generally perpendicular to the TFCC main flat body and acting as a tall, slim and slender column, and the foot portion of the contacts, the Contact PCB End, being formed to be generally parallel to the TFCC main flat body, each one of said contacts being arranged and located so that the Contact BGA End of each contact will be capable to being attached to its corresponding BGA contact pad and the Contact PCB End of each contact would be capable to being attached to its corresponding PCB contact pad, wherein the contact blanks, created from the electrically conductive layer, are laid out in such a pattern and with the main longitudinal axis of each contact blank pointing in such a direction, so that when the contacts are formed out of these contact blanks, to create the column and the foot portions of the contacts, they end up such that the Contact Column of each one of said contacts would be arranged to be oriented in a way, so that said contact would present the least resistance to bending in the general direction of the expected thermal deformation of the assembly of BGA and PCB, at the location of the respective contact.

20. An interconnection device, as in claim 19, wherein the contact pads of the devices are arranged in a pattern, wherein there are contact pads only in one row along and near the outside edge or perimeter of the devices, and wherein the contact blanks corresponding to the devices contact pads are fanned in a generally radial arrangement, so that when the contacts are formed to create the column and the foot portions, they end up so that the Contact Column of each one of said contacts would be arranged to be oriented in a way, so that said contact would present the least resistance to bending in the general direction of the expected thermal deformation of the assembly of BGA and PCB, at the location of the respective contact.

21. An interconnection device, as in claim 19, wherein the contact pads of the devices are arranged in a pattern, wherein there are two rows of contact pads along and near the outside edge or perimeter of the devices, and wherein the contact blanks corresponding to the devices contact pads are laid out so that the contact blanks relating to the outside row of contact pads are fanned outwards in a generally radial arrangement, while the contact blanks relating to the inside row of contact pads are fanned inwards in a generally radial arrangement, so that when the contacts are formed to create the column and the foot portions, they end up so that the Contact Column of each one of said contacts would be arranged to be oriented in a way, so that said contact would present the least resistance to bending in the general direction of the expected thermal deformation of the assembly of BGA and PCB, at the location of the respective contact.

22. An interconnection device, as in claim 19, wherein the contact pads of the devices are arranged in a pattern or matrix of a number of rows and columns, and wherein the contact blanks corresponding to the devices contact pads are laid out in a generally radial arrangement, so that when the contacts are formed to create the column and the foot portions, they end up so that the Contact Column of each one of said contacts would be arranged to be oriented in a way, so that said contact would present the least resistance to bending in the general direction of the expected thermal deformation of the assembly of BGA and PCB, at the location of the respective contact.

23. An interconnection device, as in claim 22, wherein the contact pads of the devices are arranged in a tight pattern or matrix formation, having a relatively small pitch between the centers of the devices contact pads, thus limiting the space available to create complete contact blanks with appropriate length, in certain area of the contact pads pattern, and wherein certain contact blanks get laid out with a slight deviation in their individual directions, thus deviating from the theoretical or ideal direction of the expected thermal deformation of the assembly of BGA and PCB, at the location of the respective contacts, so that the contact blanks do not interfere or encroach on each other and in order to obtain complete contact blanks that have the desired length and that are not truncated or chopped off at one point.

24. An interconnection device, as in claim 22, wherein certain contact blanks are selected together to create individual groups, say all the contact blanks in one quadrant, wherein all the contact blanks in any one such group would be oriented in one and the same direction, approximately along, but slightly deviating from, the theoretical or ideal direction of the expected thermal deformation of the assembly of BGA and PCB, a best compromise direction for all the contact blanks in the group, at the location of the respective contacts, in order to facilitate the manufacturing of said contact blanks.

25. An interconnection device, as in claim 24, wherein at least one such individual group has all the contact blanks in that group, oriented in an orthogonal direction, generally perpendicular to the edges of the devices, i.e. the BGA or the PCB, or in the same direction as the general axes of the devices.

26. An interconnection device, as in claim 19, wherein the columns are arcuate and such that they can be parallel nested.

27. An interconnection device, as in claim 19, wherein the interconnection device comprises also an anchor capable of attaching the BGA to the PCB, and wherein the anchor could be simply stamped formed out of the TFCC body itself.

28. An interconnection device, as in claim 19, wherein the first end of each one of the contacts, the Contact BGA End, is shaped generally as a round circular pad to match its corresponding contact pad on the BGA and to accept a BGA solder ball, and could be formed to have a concave shape to enable a better detent alignment of the contacts to ball centers, while the second end of each one of the contacts, the Contact PCB End, is shaped generally to match the shape of its corresponding contact pad on the PCB, in which case, the contact column could end up being tapered in its width, being wider near its contact BGA end and narrower near its contact PCB end.

29. An interconnection device, as in claim 19, wherein the first end of each one of the contacts, the Contact BGA End, is shaped generally as a round circular pad to match its corresponding contact pad on the BGA, while the second end of each one of the contacts is non-existent, so that the columnar body of the contact body ends up as a continuation or extension of the body itself, so that, the contact will look like an inverted L-Shape, looking at it from a side view.

30. An interconnection device, as in claim 19, wherein the first end of each one of the contacts, the Contact BGA End, is attached to the BGA, while the second end of each one of said contacts is not attached to anything, in preparation for the time when these second ends will be attached to an appropriate device at a later time, in other words, it would practically convert the leadless BGA into a leaded device, almost similar to a Pin Grid Array Package (PGAP).

31. An interconnection device, as in claim 19, wherein at least two corner retaining ears are provided, to align the BGA with the TFCC body and to the contacts, and wherein these retaining ears are generally flexible and resilient to more easily accommodate the dimensional tolerances of the BGAs and similar devices, thus creating what could be referred to as the TFCC Clip or the TFCC Clip-on BGA Carrier.

32. An interconnection device, as in claim 19, wherein the interconnection device comprises an anchor capable of attaching the BGA to the PCB.

33. An interconnection device, as in claim 32, wherein the anchor could be simply stamped formed out of the TFCC body itself.

34. An interconnection device, as in claim 19, wherein the dielectric layer of the TFCC main flat body, which is made of a generally flat composite laminate, can act as a solder mask.

35. An interconnection device, as in claim 19, wherein the dielectric layer of the TFCC main flat body, which is made of a generally flat composite laminate, is removable or dissolvable.

* * * * *